(12) United States Patent
Ito et al.

(10) Patent No.: US 10,510,781 B2
(45) Date of Patent: Dec. 17, 2019

(54) SEMICONDUCTOR DEVICE AND METHOD FOR MANUFACTURING SEMICONDUCTOR DEVICE

(71) Applicant: Sharp Kabushiki Kaisha, Sakai, Osaka (JP)

(72) Inventors: Kazuatsu Ito, Sakai (JP); Seiji Kaneko, Sakai (JP); Yohsuke Kanzaki, Sakai (JP); Takao Saitoh, Sakai (JP); Makoto Nakazawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/078,249

(22) PCT Filed: Feb. 21, 2017

(86) PCT No.: PCT/JP2017/006403
§ 371 (c)(1),
(2) Date: Aug. 21, 2018

(87) PCT Pub. No.: WO2017/146058
PCT Pub. Date: Aug. 31, 2017

(65) Prior Publication Data
US 2019/0081075 A1 Mar. 14, 2019

(30) Foreign Application Priority Data
Feb. 22, 2016 (JP) .................... 2016-030924

(51) Int. Cl.
*H01L 27/12* (2006.01)
*H01L 29/417* (2006.01)
(Continued)

(52) U.S. Cl.
CPC .......... *H01L 27/124* (2013.01); *G02F 1/1368* (2013.01); *H01L 27/1225* (2013.01);
(Continued)

(58) Field of Classification Search
CPC ............... H01L 27/124; H01L 27/1288; H01L 27/1225; H01L 27/1274; H01L 51/50;
(Continued)

(56) References Cited

U.S. PATENT DOCUMENTS

2012/0061665 A1* 3/2012 Miyake ............... H01L 27/1225
257/43
2012/0138922 A1 6/2012 Yamazaki et al.
(Continued)

FOREIGN PATENT DOCUMENTS

JP          11-024101 A       1/1999
JP        2012-134475 A       7/2012
(Continued)

*Primary Examiner* — Natalia A Gondarenko
(74) *Attorney, Agent, or Firm* — Keating & Bennett, LLP

(57) ABSTRACT

A method of producing a semiconductor device according to an embodiment of the present invention includes: step (C) of forming an oxide semiconductor layer of a plurality of thin film transistors on a gate dielectric layer; step (F) of forming an aperture in an interlevel dielectric layer, the aperture being located between an active region and a plurality of terminal portions and extending through the interlevel dielectric layer; and step (G) of, after step (F), forming an upper conductive portion on the interlevel dielectric layer. In step (C), a protection layer made of the same oxide semiconductor film as the oxide semiconductor layer is formed above a region of the gate dielectric layer that is located between the active region and the plurality of terminal portions. In step (F), the aperture is formed so as to overlap the protection layer.

13 Claims, 38 Drawing Sheets

(51) Int. Cl.
  *H01L 29/423* (2006.01)
  *H01L 29/51* (2006.01)
  *H01L 29/786* (2006.01)
  *G02F 1/1368* (2006.01)

(52) U.S. Cl.
  CPC ...... *H01L 27/1274* (2013.01); *H01L 27/1288* (2013.01); *H01L 29/41733* (2013.01); *H01L 29/42384* (2013.01); *H01L 29/51* (2013.01); *H01L 29/78651* (2013.01); *H01L 29/78684* (2013.01)

(58) Field of Classification Search
  CPC ............. H01L 29/786; H01L 29/78684; H01L 29/42384; H01L 29/51; H01L 29/78651; H01L 29/41733; H01L 29/12; H01L 29/7869; H01L 29/78693; H01L 29/78675; H01L 29/78606; H01L 29/0847; H01L 29/4908; H01L 29/518; H01L 29/517; H01L 27/092; H01L 27/1214; H01L 27/1248; H01L 27/1251; H01L 27/3262; H01L 27/3258; H01L 21/02164; H01L 21/02362; H01L 21/02488; H01L 21/02554; H01L 21/76846; H01L 21/8238; H01L 21/336; H01L 21/471; H01L 23/53295; H01L 33/08; G02F 1/1368

USPC .......... 257/43, 59, 57, 72, E27.062, E33.053, 257/E21.632; 438/154, 22, 34, 104
  See application file for complete search history.

(56) References Cited

U.S. PATENT DOCUMENTS

| | | | |
|---|---|---|---|
| 2013/0168666 A1* | 7/2013 | Yan | H01L 27/1225 257/43 |
| 2013/0201420 A1* | 8/2013 | Misaki | H01L 27/1225 349/46 |
| 2013/0292682 A1* | 11/2013 | Katoh | H01L 29/45 257/60 |
| 2013/0320334 A1 | 12/2013 | Yamazaki et al. | |
| 2014/0131703 A1* | 5/2014 | Miyamoto | H01L 27/1225 257/43 |
| 2014/0286076 A1 | 9/2014 | Aoki et al. | |
| 2014/0347590 A1* | 11/2014 | Fujita | G02F 1/1368 349/43 |

FOREIGN PATENT DOCUMENTS

| | | |
|---|---|---|
| JP | 2014-007399 A | 1/2014 |
| JP | 2014-209727 A | 11/2014 |

* cited by examiner

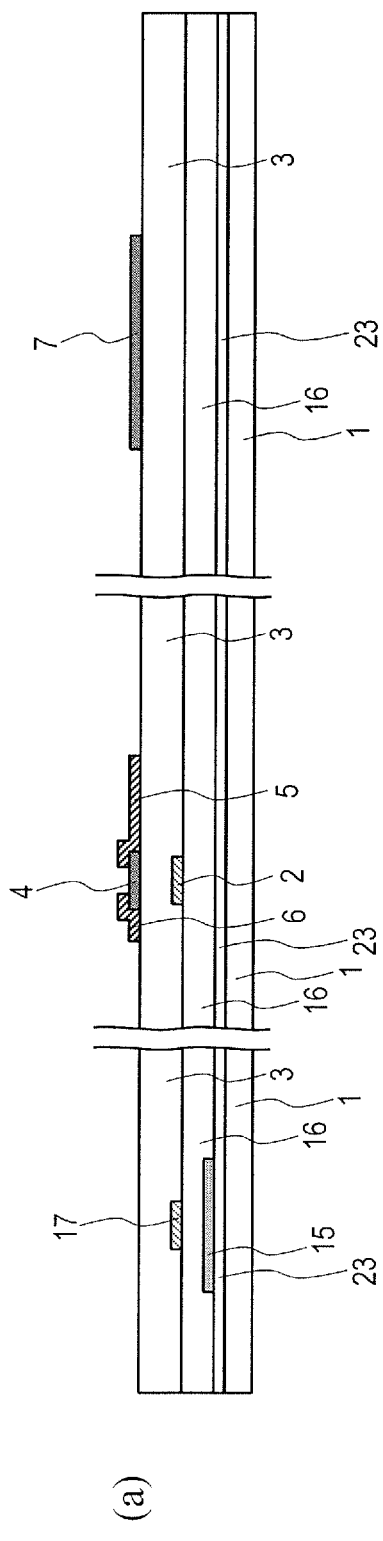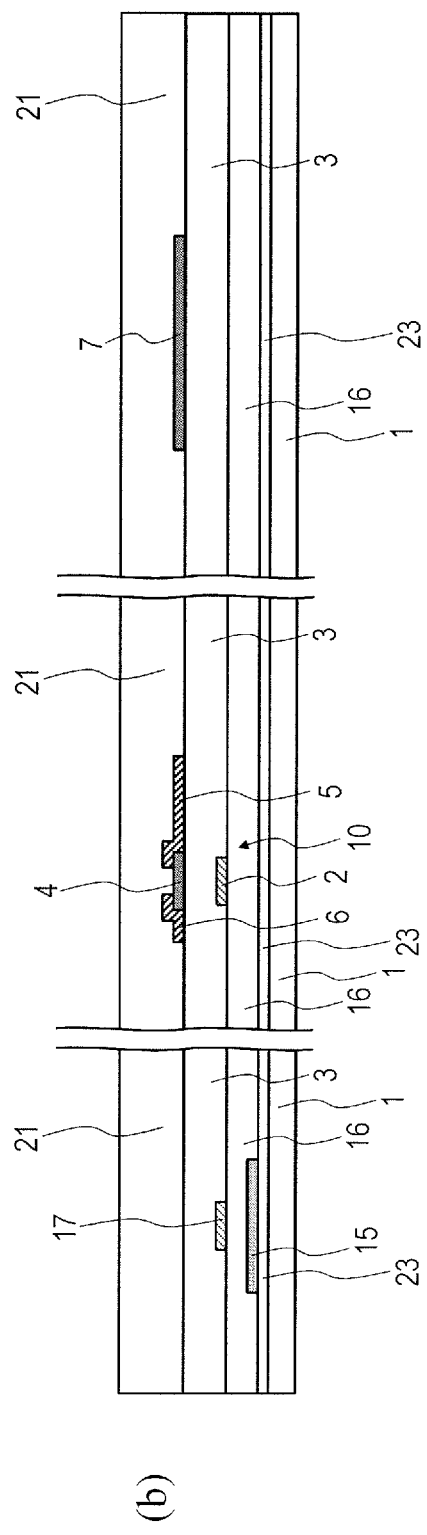
FIG.5

FIG.6
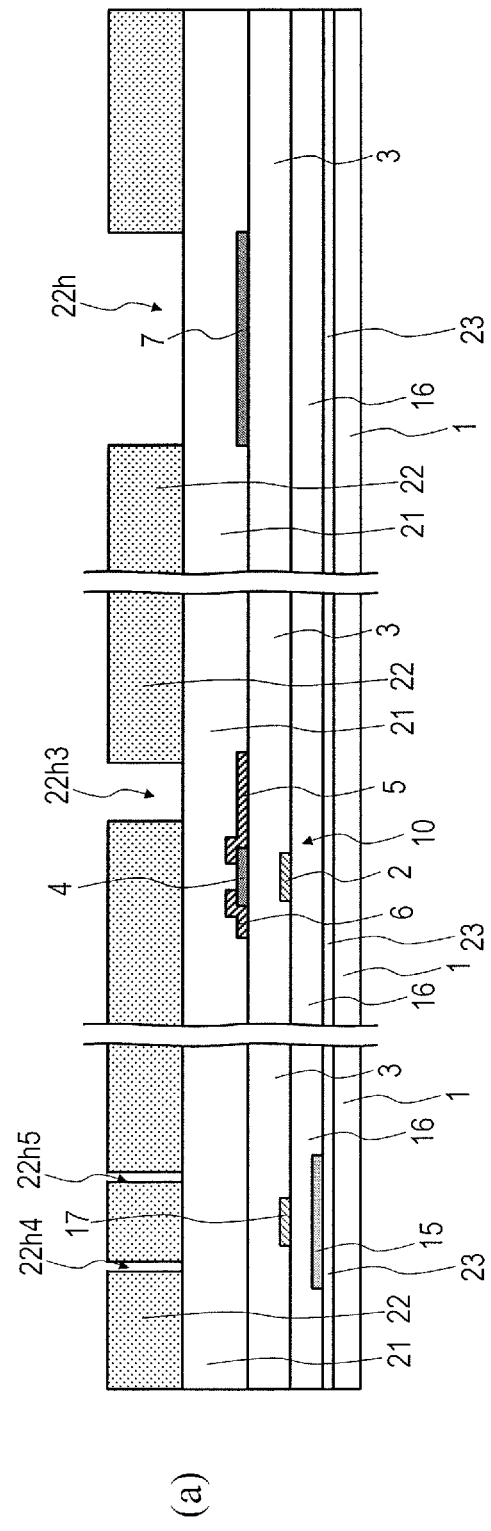
(a)
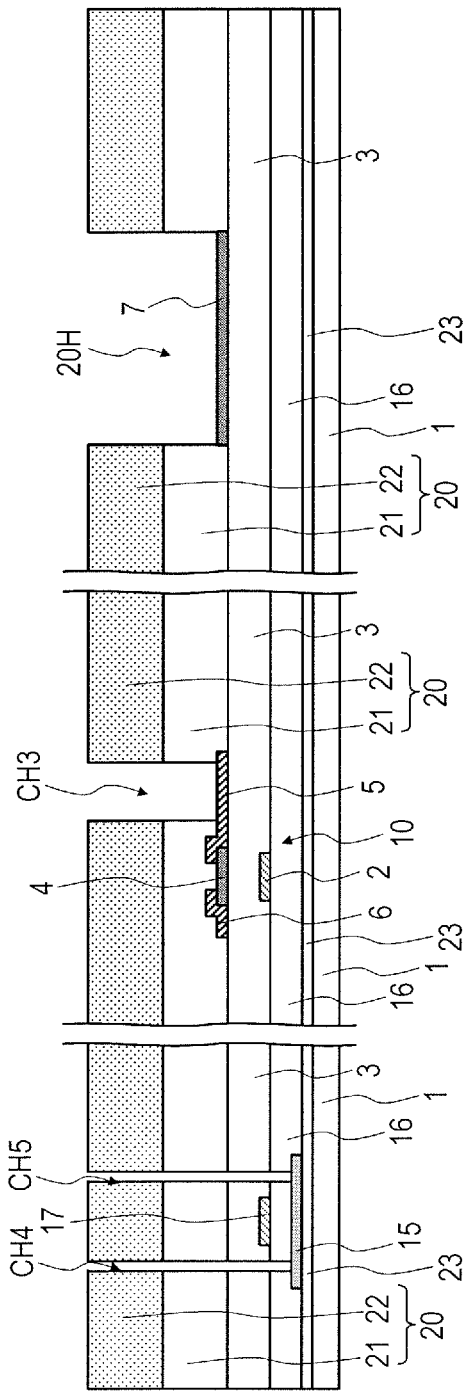
(b)

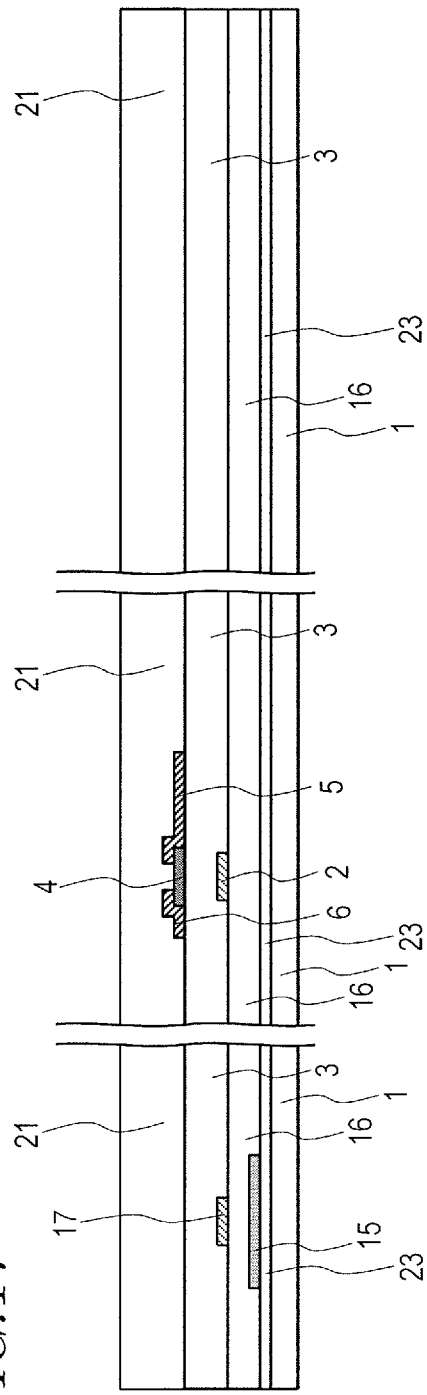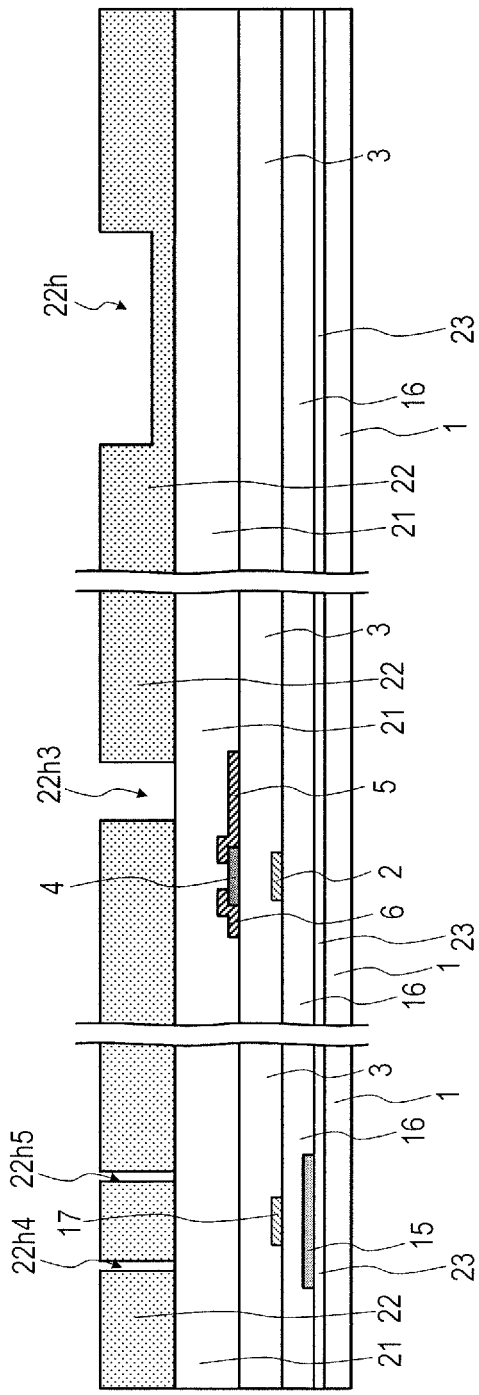
FIG.17

FIG.24
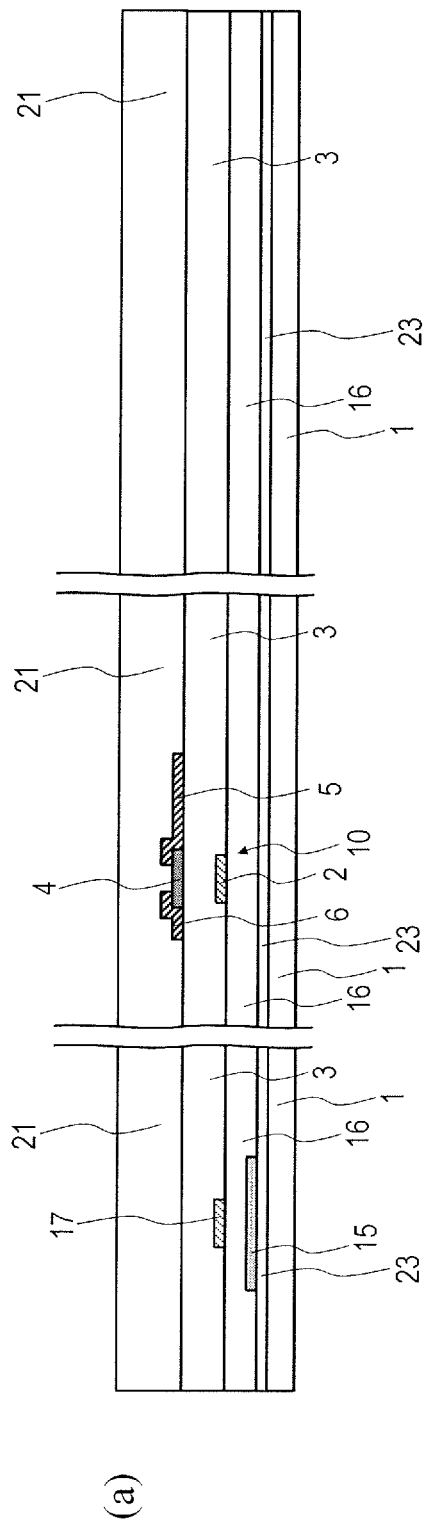
(a)
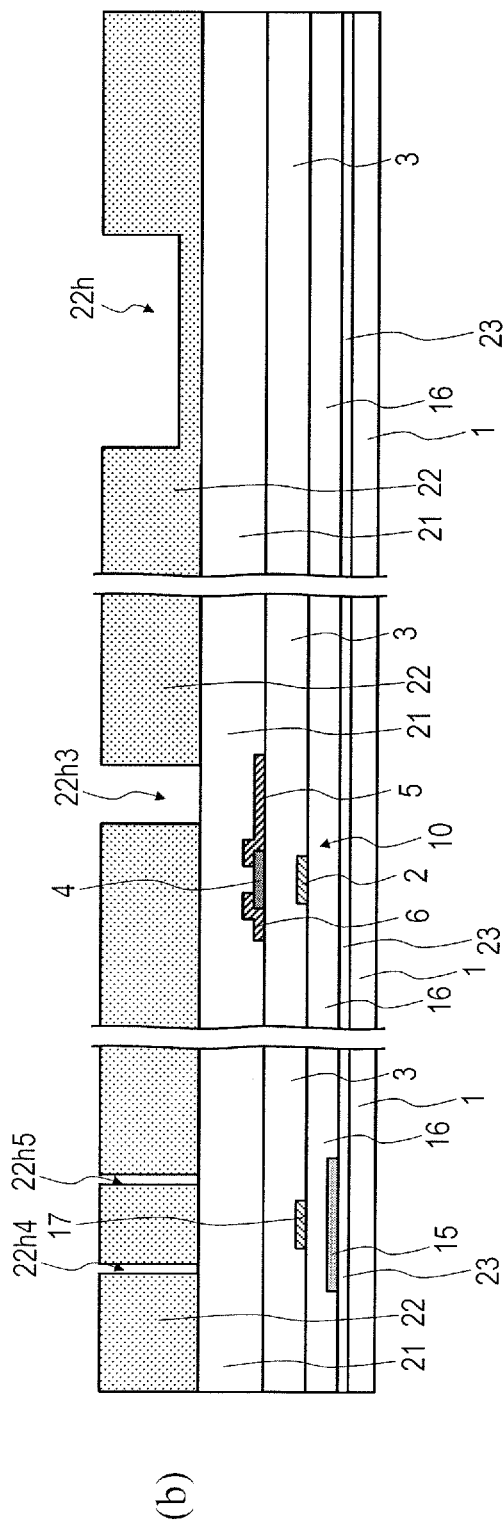
(b)

FIG.25
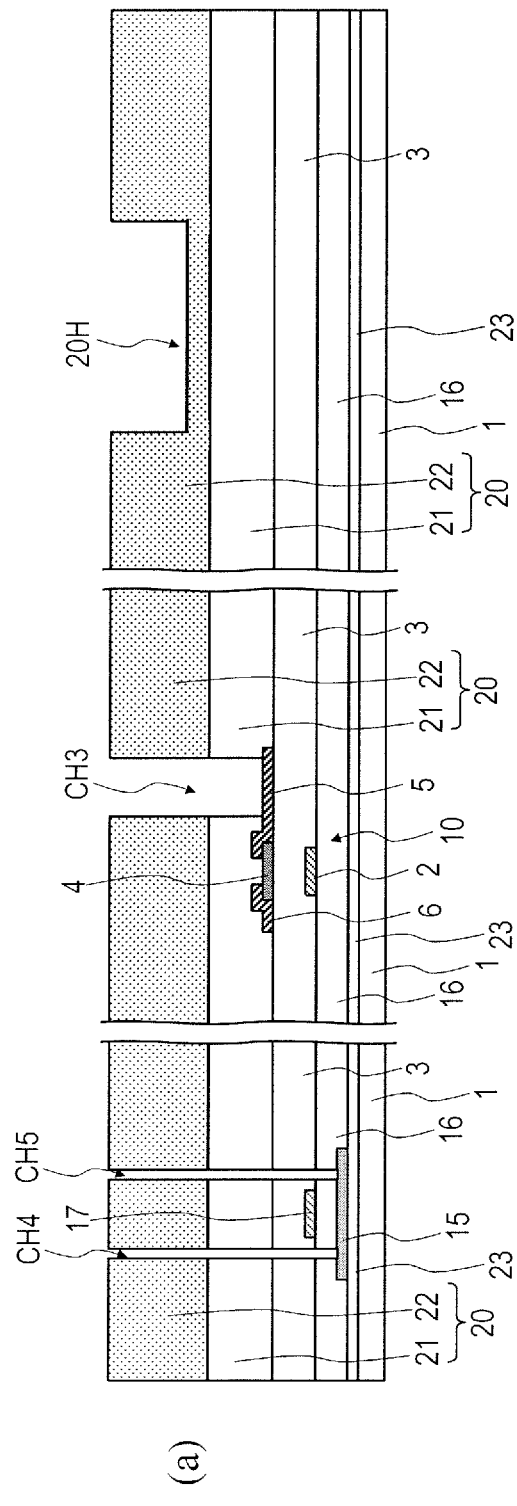
(a)
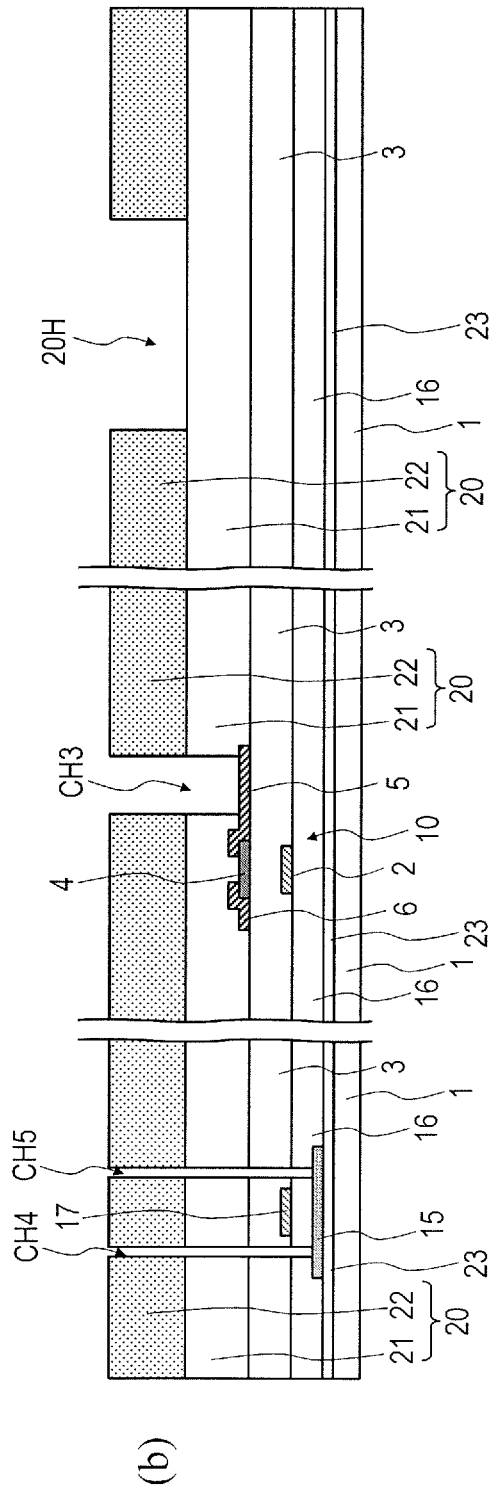
(b)

FIG.28
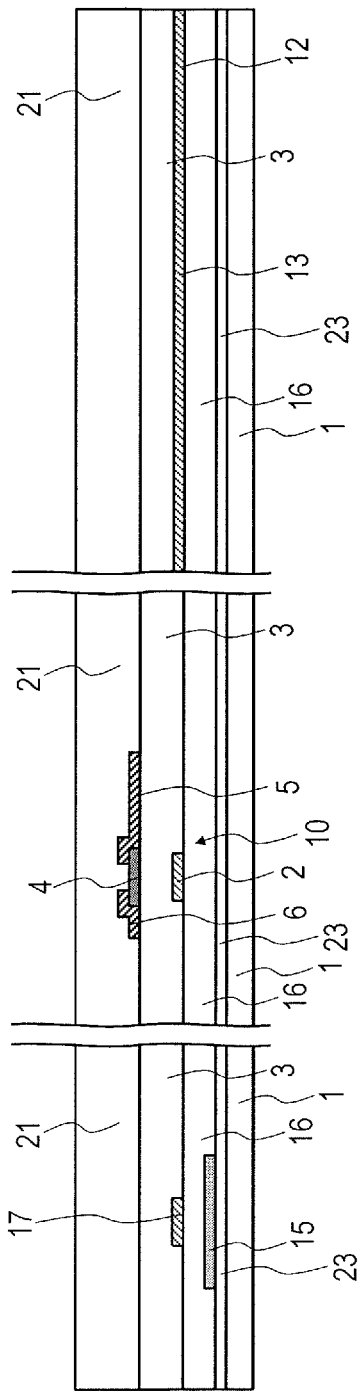
(a)
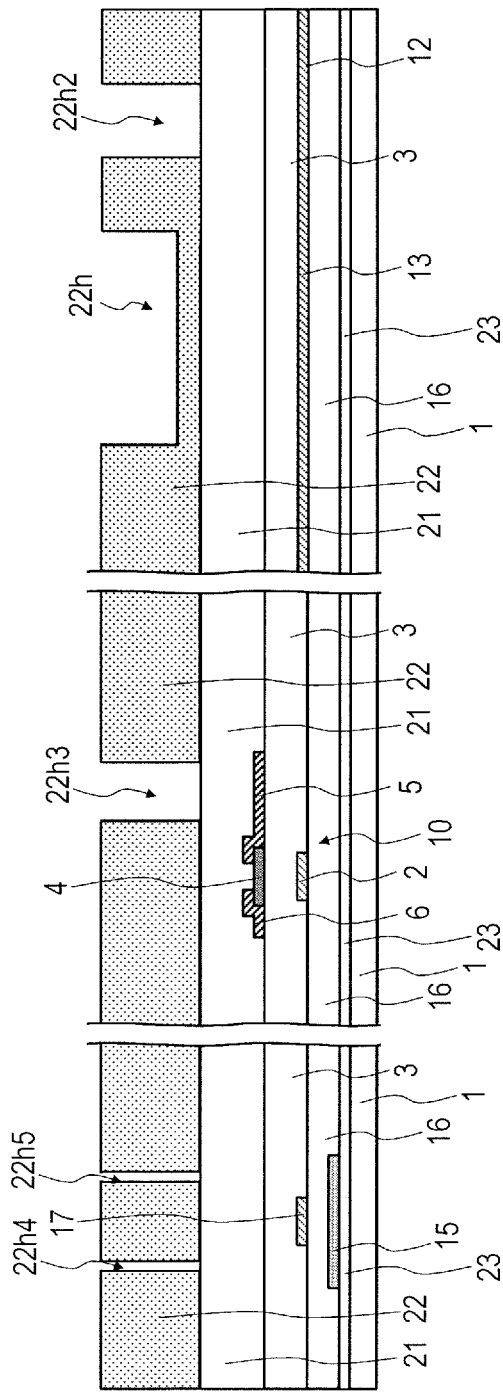
(b)

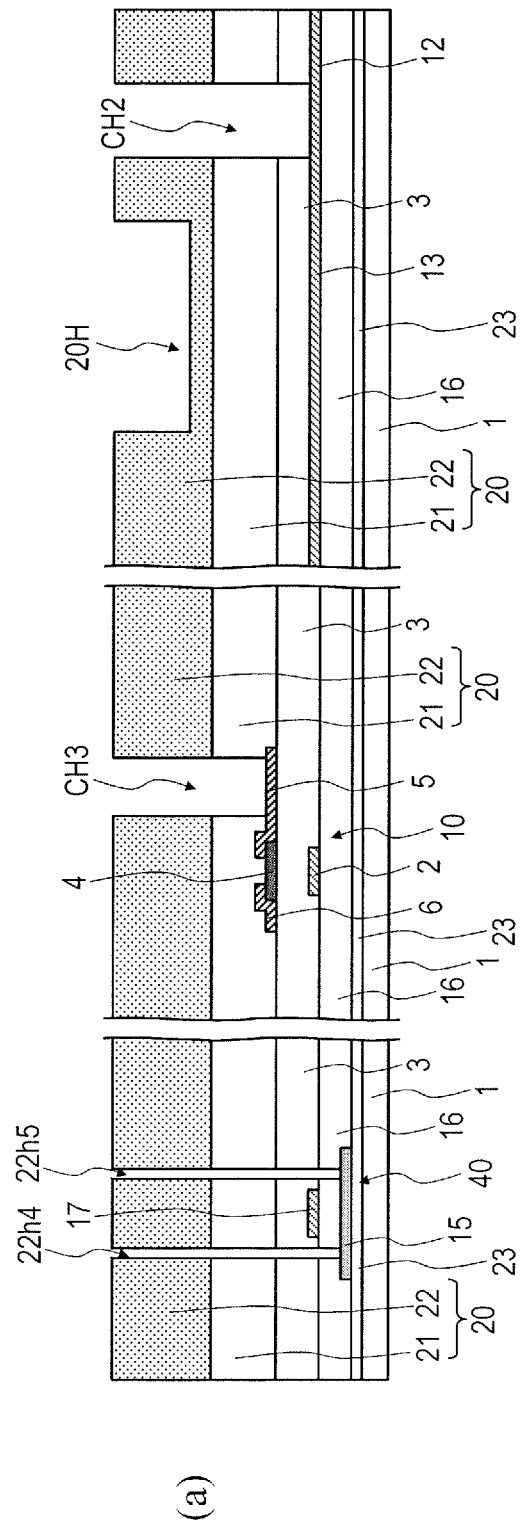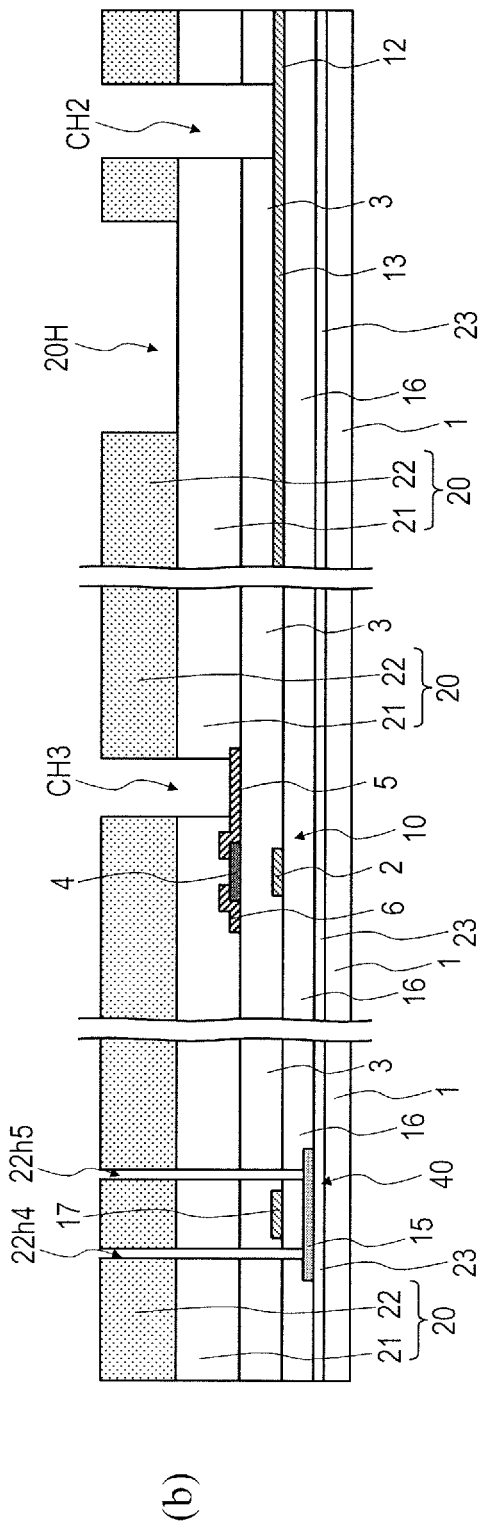
FIG.29

SEMICONDUCTOR DEVICE AND METHOD FOR MANUFACTURING SEMICONDUCTOR DEVICE

TECHNICAL FIELD

The present invention relates to a semiconductor device and a method of producing a semiconductor device.

BACKGROUND ART

An active matrix substrate for use in a liquid crystal display device or the like includes a switching element for each pixel, e.g., a thin film transistor (hereinafter, "TFT"). As such switching elements, TFTs whose active layer is an amorphous silicon film (hereinafter, "amorphous silicon TFT", and TFTs whose active layer is a polycrystalline silicon film (hereinafter "polycrystalline silicon TFT"), have been widely used.

In recent years, it has been proposed to use an oxide semiconductor as the material of an active layer of a TFT, instead of an amorphous silicon or a polycrystalline silicon. A TFT having an oxide semiconductor film as an active layer is referred to as an "oxide semiconductor TFT". Patent Document 1 discloses an active matrix substrate in which an In—Ga—Zn—O based semiconductor film is used as active layers of TFTs.

An oxide semiconductor provides a higher mobility than does an amorphous silicon. Therefore, oxide semiconductor TFTs can operate more rapidly than amorphous silicon TFTs. Moreover, an oxide semiconductor film is formed through a simple process as compared to a polycrystalline silicon film, and therefore is applicable to devices which require a large geometric area.

Generally speaking, an active matrix substrate includes an active region and a peripheral region. The active region includes a plurality of pixels, and is also called a display region. The peripheral region, which is located around the active region, is also called a frame region.

Provided in the active region are: TFTs which are formed correspondingly for the respective pixels; and gate lines, source lines, and pixel electrodes which are electrically connected respectively to the gate electrodes, source electrodes, and drain electrodes of the TFTs. The TFTs are covered by an interlevel dielectric layer, with the pixel electrodes being formed on the interlevel dielectric layer. A construction for the interlevel dielectric layer is known in which an inorganic dielectric layer (passivation film) that is made of an inorganic insulative material and an organic dielectric layer (planarization film) that is made of an organic insulative material are stacked.

In the peripheral region, a plurality of terminal portions are provided for allowing the gate lines and source lines to be electrically connected to external wiring lines. For example, a gate line may extend from the active region to the peripheral region, where it may be connected to a gate driver via a terminal portion (gate terminal portion). On the other hand, a source line may be electrically connected to a gate connection line that is made of the same conductive film as the gate lines, for example. A gate connection line may be connected to a source driver via a terminal portion (source terminal portion) in the peripheral region.

CITATION LIST

Patent Literature

[Patent Document 1] Japanese Laid-Open Patent Publication No. 2012-134475

[Patent Document 2] Japanese Laid-Open Patent Publication No. 11-24101

SUMMARY OF INVENTION

Technical Problem

In order to prevent moisture from intruding into the active region, an aperture (groove) may be provided in the interlevel dielectric layer at the peripheral region, or more specifically, between the plurality of terminal portions and the active region.

However, in the case where lines (i.e., lines extending from the active region toward the terminal portion) are disposed on the bottom face of the aperture, short-circuiting may occur between adjacent lines. This short-circuiting is ascribable to the fact that, in a step of forming a conductive layer upon the interlevel dielectric layer, i.e., a step of depositing a conductive film and thereafter patterning it, portions of the conductive film that should have been removed may remain near the edge of the aperture (such remaining portions may hereinafter be referred to as "conductive film residues").

Patent Document 2 proposes shaping the aperture edge so that bumps exist between adjacent lines, in order to prevent such short-circuiting that is ascribable to conductive film residues. However, in the construction disclosed in Patent Document 2, the effect of preventing short-circuiting may not be adequate when the depth of the aperture is large (i.e., creating a large level difference) or when the taper angle of the bumps (interlevel dielectric layer) has a certain magnitude.

The present invention has been made in view of the above problems, and an objective thereof is to provide a semiconductor device which prevents short-circuiting due to conductive film residues from occurring at an aperture in an interlevel dielectric layer, and a method of producing the same.

Solution to Problem

A method of producing a semiconductor device according to an embodiment of the present invention is a method of producing a semiconductor device which includes a substrate, a plurality of first thin film transistors supported on the substrate, an interlevel dielectric layer covering the plurality of first thin film transistors, and a plurality of terminal portions electrically connecting the plurality of first thin film transistors to corresponding external wiring lines, each of the plurality of terminal portions including an upper conductive portion provided on the interlevel dielectric layer, the semiconductor device having an active region in which the plurality of first thin film transistors are provided, and a peripheral region being located around the active region and having the plurality of terminal portions provided therein, the method comprising: step (A) of forming gate electrodes of the plurality of first thin film transistors on the substrate; step (B) of forming a gate dielectric layer covering the gate electrodes; step (C) of forming an oxide semiconductor layer of the plurality of thin film transistors on the gate dielectric layer; step (D) of forming source electrodes and drain electrodes of the plurality of thin film transistors; step (E) of forming the interlevel dielectric layer so as to cover the plurality of thin film transistors; step (F) of forming an aperture in the interlevel dielectric layer, the aperture being located between the active region and the plurality of terminal portions and extending through the interlevel dielectric layer; and step (G) of, after step (F), forming the upper conductive portion on the interlevel dielectric layer, wherein, in step (C), above a region of the gate dielectric layer that is located between the active region and the plurality of terminal portions, a protection layer is formed from a same oxide semiconductor film as the oxide semiconductor layer; and in step (F), the aperture is formed so as to overlap the protection layer.

In one embodiment, in step (G), lines extending from the upper conductive portion are formed, the lines extending via the aperture toward the active region.

In one embodiment, in step (F), the aperture is formed so as to have a region in which the protection layer overlaps the aperture and a region in which the protection layer does not overlap the aperture.

In one embodiment, each of the plurality of terminal portions includes a lower conductive portion made of a same conductive film as the gate electrodes, the lower conductive portion being electrically connected to the upper conductive portion in a contact hole made in the gate dielectric layer and in the interlevel dielectric layer; and in step (A), together with the gate electrodes, the lower conductive portions and lines extending from the lower conductive portions are formed, the lines extending under the aperture toward the active region.

In one embodiment, the method of producing a semiconductor device further comprises step (H) of removing the protection layer.

In one embodiment, the method of producing a semiconductor device does not comprise a step of removing the protection layer.

In one embodiment, the method of producing a semiconductor device further comprises step (H) of partly removing the protection layer, wherein, in step (H), a plurality of islets of oxide semiconductor are formed by partly removing the protection layer; and each of the plurality of islets of oxide semiconductor is disposed so as not to be in contact with two or more said lines.

In one embodiment, the interlevel dielectric layer includes: a first dielectric layer provided so as to cover the source electrodes and drain electrodes; and a second dielectric layer provided on the first dielectric layer.

A method of producing a semiconductor device according to an embodiment of the present invention is a method of producing a semiconductor device which includes a substrate, a plurality of first thin film transistors supported on the substrate, an interlevel dielectric layer covering the plurality of first thin film transistors, and a plurality of terminal portions electrically connecting the plurality of first thin film transistors to corresponding external wiring lines, each of the plurality of terminal portions including an upper conductive portion provided on the interlevel dielectric layer, the semiconductor device having an active region in which the plurality of first thin film transistors are provided, and a peripheral region being located around the active region and having the plurality of terminal portions provided therein, the method comprising: step (A) of forming gate electrodes of the plurality of first thin film transistors on the substrate; step (B) of forming a gate dielectric layer covering the gate electrodes; step (C) of forming an oxide semiconductor layer of the plurality of thin film transistors on the gate dielectric layer; step (D) of forming source electrodes and drain electrodes of the plurality of thin film transistors; step (E) of forming the interlevel dielectric layer so as to cover the plurality of thin film transistors; step (F) of forming an aperture in the interlevel dielectric layer, the aperture being located between the active region and the plurality of terminal portions; and, step (G) of, after step (F), forming the upper conductive portion on the interlevel dielectric layer, wherein, in step (F), the aperture is formed so as to extend part of the way through the thickness of the interlevel dielectric layer.

In one embodiment, the interlevel dielectric layer includes a first dielectric layer provided so as to cover the source electrodes and drain electrodes and a second dielectric layer provided on the first dielectric layer; and, in step (F), the aperture is formed so as to extend through the second dielectric layer, and extend part of the way through the thickness of the first dielectric layer.

In one embodiment, in step (G), lines extending from the upper conductive portion are formed, the lines extending via the aperture toward the active region.

In one embodiment, each of the plurality of terminal portions includes a lower conductive portion made of a same conductive film as the gate electrodes, the lower conductive portion being electrically connected to the upper conductive portion in a contact hole made in the gate dielectric layer and in the interlevel dielectric layer; and, in step (A), together with the gate electrodes, the lower conductive portions and lines extending from the lower conductive portions are formed, the lines extending under the aperture toward the active region.

In one embodiment, the interlevel dielectric layer includes a first dielectric layer provided so as to cover the source electrodes and drain electrodes and a second dielectric layer provided on the first dielectric layer; and, in step (F), the aperture is formed so as to extend part of the way through the thickness of the second dielectric layer.

In one embodiment, the method of producing a semiconductor device further comprises, after step (F) and before step (G), step (F') of removing any remaining second dielectric layer under the aperture.

In one embodiment, in step (G), lines extending from the upper conductive portion are formed, the lines extending via the aperture toward the active region.

In one embodiment, each of the plurality of terminal portions includes a lower conductive portion made of a same conductive film as the gate electrodes, the lower conductive portion being electrically connected to the upper conductive portion in a contact hole made in the gate dielectric layer and in the interlevel dielectric layer; and in step (A), together with the gate electrodes, the lower conductive portions and lines extending from the lower conductive portions are formed, the lines extending under the aperture toward the active region.

In one embodiment, the first dielectric layer is made of an inorganic insulative material; and the second dielectric layer is made of an organic insulative material.

In one embodiment, the semiconductor device further includes a plurality of second thin film transistors supported on the substrate, each including a crystalline silicon semiconductor layer.

In one embodiment, the method of producing a semiconductor device comprises, before step (A): step (I) of forming the crystalline silicon semiconductor layer of the plurality of second thin film transistors on the substrate; and step (J) of forming a further gate dielectric layer covering the crystalline silicon semiconductor layer, wherein, in step (A), on the further gate dielectric layer, the gate electrodes of the plurality of second thin film transistors are formed from a same conductive film as the gate electrodes of the plurality of first thin film transistors.

In one embodiment, each of the plurality of first thin film transistors has a channel-etch structure.

In one embodiment, the oxide semiconductor layer comprises an In—Ga—Zn—O based semiconductor.

In one embodiment, the oxide semiconductor layer includes a crystalline portion.

A semiconductor device according to an embodiment of the present invention comprises: a substrate; a plurality of first thin film transistors supported on the substrate; an interlevel dielectric layer covering the plurality of first thin film transistors; and a plurality of terminal portions electrically connecting the plurality of first thin film transistors to corresponding external wiring lines, the semiconductor device having an active region in which the plurality of first thin film transistors are provided, and a peripheral region being located around the active region and having the plurality of terminal portions provided therein, wherein, each of the plurality of first thin film transistors includes a gate electrode provided on the substrate, a gate dielectric layer covering the gate electrodes, an oxide semiconductor layer provided on the gate dielectric layer, and a source electrode and a drain electrode electrically connected to the oxide semiconductor layer; the interlevel dielectric layer has an aperture formed between the active region and the plurality of terminal portions, the aperture extending through the interlevel dielectric layer; the semiconductor device further comprises a protection layer above a region of the gate dielectric layer that is located between the active region and the plurality of terminal portions, the protection layer being made of a same oxide semiconductor film as the oxide semiconductor layer; and the aperture is formed so as to at least partly overlap the protection layer.

In one embodiment, the interlevel dielectric layer includes: a first dielectric layer provided so as to cover the source electrodes and drain electrodes; and a second dielectric layer provided on the first dielectric layer.

A semiconductor device according to an embodiment of the present invention comprises: a substrate; a plurality of first thin film transistors supported on the substrate; an interlevel dielectric layer covering the plurality of first thin film transistors; and a plurality of terminal portions electrically connecting the plurality of first thin film transistors to corresponding external wiring lines, the semiconductor device having an active region in which the plurality of first thin film transistors are provided, and a peripheral region being located around the active region and having the plurality of terminal portions provided therein, wherein, each of the plurality of first thin film transistors includes a gate electrode provided on the substrate, a gate dielectric layer covering the gate electrodes, an oxide semiconductor layer provided on the gate dielectric layer, and a source electrode and a drain electrode electrically connected to the oxide semiconductor layer; and the interlevel dielectric layer has an aperture formed between the active region and the plurality of terminal portions, the aperture extending part of the way through the thickness of the interlevel dielectric layer.

In one embodiment, the interlevel dielectric layer includes a first dielectric layer provided so as to cover the source electrodes and drain electrodes and a second dielectric layer provided on the first dielectric layer; and the aperture is formed so as to extend through the second dielectric layer, and extend part of the way through the thickness of the first dielectric layer.

In one embodiment, the first dielectric layer is made of an inorganic insulative material; and the second dielectric layer is made of an organic insulative material.

In one embodiment, each of the plurality of terminal portions includes an upper conductive portion provided on the interlevel dielectric layer; and the semiconductor device further comprises lines extending from the upper conductive portion, the lines extending via the aperture toward the active region.

In one embodiment, each of the plurality of terminal portions includes an upper conductive portion provided on the interlevel dielectric layer and a lower conductive portion made of a same conductive film as the gate electrodes, the lower conductive portion being electrically connected to the upper conductive portion in a contact hole made in the gate dielectric layer and in the interlevel dielectric layer; and, the semiconductor device further comprises lines extending from the lower conductive portions, the lines extending under the aperture toward the active region.

In one embodiment, the semiconductor device further comprises a plurality of second thin film transistors supported on the substrate, each including a crystalline silicon semiconductor layer.

In one embodiment, each of the plurality of first thin film transistors has a channel-etch structure.

In one embodiment, the oxide semiconductor layer comprises an In—Ga—Zn—O based semiconductor.

In one embodiment, the oxide semiconductor layer includes a crystalline portion.

Advantageous Effects of Invention

According to an embodiment of the present invention, there is provided a semiconductor device which prevents short-circuiting due to conductive film residues from occurring at an aperture in an interlevel dielectric layer, and a method of producing the same.

BRIEF DESCRIPTION OF DRAWINGS

FIGS. 5 (a) and (b) are step-by-step cross-sectional views showing a method of producing the semiconductor device 100A.

FIGS. 6 (a) and (b) are step-by-step cross-sectional views showing a method of producing the semiconductor device 100A.

FIGS. 17 (a) and (b) are step-by-step cross-sectional views showing a method of producing the semiconductor device 100C.

FIGS. 24 (a) and (b) are step-by-step cross-sectional views showing a method of producing the semiconductor device 100E.

FIGS. 25 (a) and (b) are step-by-step cross-sectional views showing a method of producing the semiconductor device 100E.

FIGS. 28 (a) and (b) are step-by-step cross-sectional views showing a method of producing the semiconductor device 100F.

FIGS. 29 (a) and (b) are step-by-step cross-sectional views showing a method of producing the semiconductor device 100F.

DESCRIPTION OF EMBODIMENTS

Hereinafter, with reference to the drawings, embodiments of the present invention will be described. Although an active matrix substrate (TFT substrate) for a liquid crystal display device will be exemplified in the following as a semiconductor device according to an embodiment of the present invention, a semiconductor device according to an embodiment of the present invention may be an active matrix substrate for use in any other display device, e.g., an electrophoresis display device, a MEMS (Micro Electro Mechanical System) display device, or an organic EL (Electroluminescence) display device.

Prior to describing embodiments of the present invention, the reason why the aforementioned conductive film residues may occur near the edge of an aperture will be described.

Figure 36:
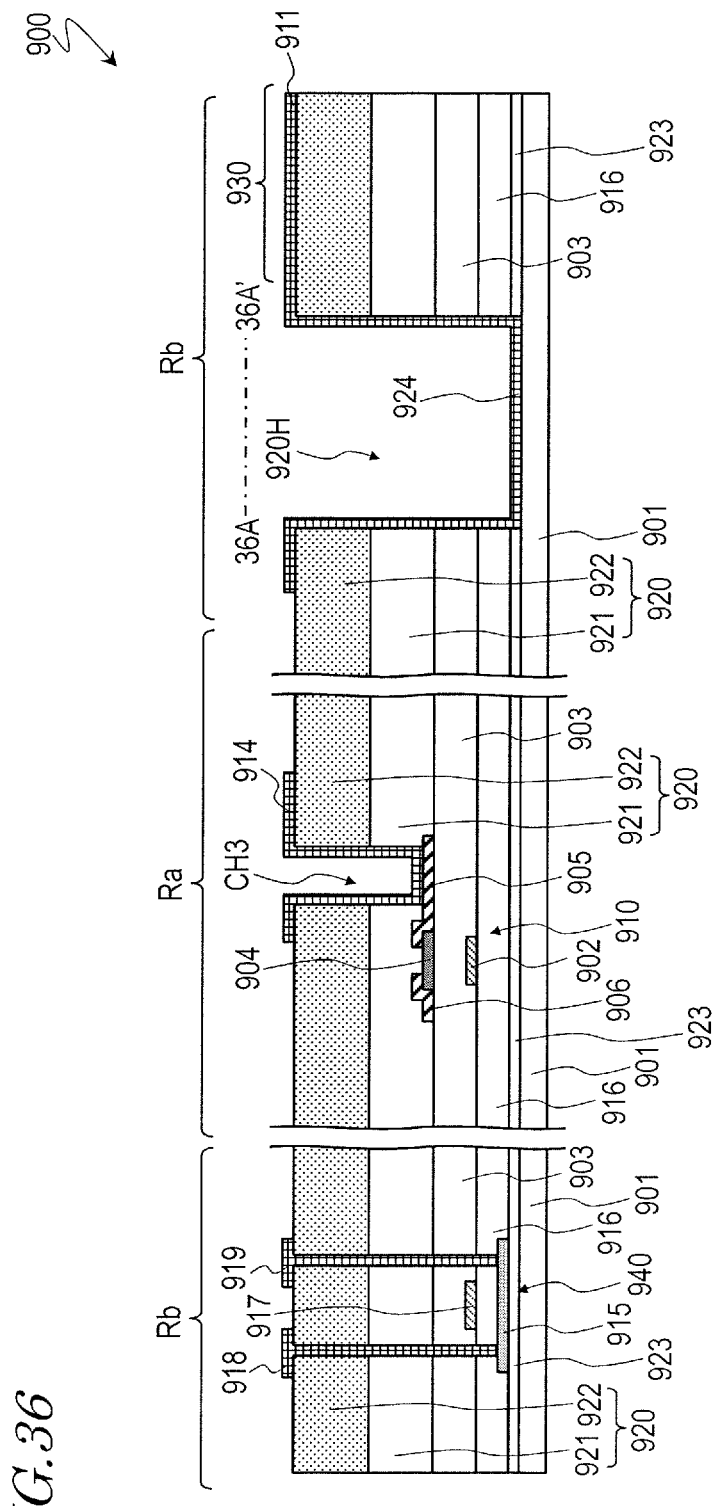
FIG. 36 A cross-sectional view schematically showing a semiconductor device 900 according to Comparative Example, including a cross section taken along line 36A-36A' shown in FIG. 37.
Figure 37:
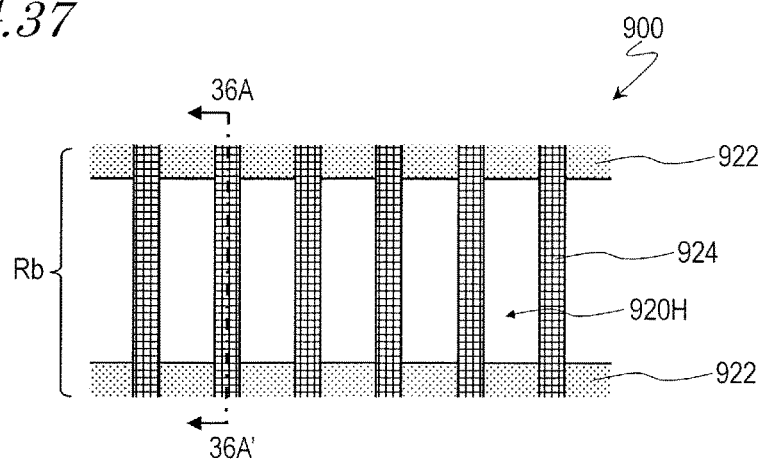
FIG. 37 A plan view schematically showing a portion (near an aperture 920H in an interlevel dielectric layer 920) of the semiconductor device 900.

FIG. 36 and FIG. 37 show the structure of a semiconductor device (TFT substrate) 900 according to Comparative Example. FIG. 36 is a cross-sectional view schematically showing the semiconductor device 900, and FIG. 37 is a plan view schematically showing a portion (near an aperture 920H in an interlevel dielectric layer 920) of the semiconductor device 900.

As shown in FIG. 36 and FIG. 37, the semiconductor device 900 includes a substrate 901, a plurality of pixel TFTs 910 supported on the substrate 901, an interlevel dielectric layer 920 covering the plurality of pixel TFTs 910, and a plurality of terminal portions 930 electrically connecting the plurality of pixel TFTs 910 to corresponding external wiring lines. Moreover, the semiconductor device 900 has an active region (display region) Ra and a peripheral region (frame region) Rb located around the active region Ra. In the active region Ra, pixel TFTs 910 are provided correspondingly for the respective pixels. In the peripheral region Rb, the terminal portions 930 are provided. The semiconductor device 900 further includes a plurality of driving TFTs 940 provided in the peripheral region Rb.

Each pixel TFT 910 includes a gate electrode 902, a first gate dielectric layer 903 covering the gate electrode 902, an oxide semiconductor layer 904 provided on the first gate dielectric layer 903, and a source electrode 905 and a drain electrode 906 electrically connected to the oxide semiconductor layer 904. The gate electrode 902 is electrically connected to a gate line, so as to receive a gate signal supplied from the gate line. The source electrode 905 is electrically connected to a source line 914, so as to receive a source signal supplied from the source line 914. The source line 914 is disposed on the interlevel dielectric layer 920, and the source electrode 905 is connected to the source line 914 within a source contact hole CH3 which is made in the interlevel dielectric layer 920. The drain electrode 906 is electrically connected to a pixel electrode (not shown) which is provided on the interlevel dielectric layer 920.

Each circuit TFT 940 includes a crystalline silicon semiconductor layer 915 provided on the substrate 901, a second gate dielectric layer 916 covering the crystalline silicon semiconductor layer 915, a gate electrode 917 being provided on the second gate dielectric layer 916 and overlapping the crystalline silicon semiconductor layer 915, and a source electrode 918 and a drain electrode 919 electrically connected to the crystalline silicon semiconductor layer 915. A basecoat layer 923 is formed on the substrate 901, such that the crystalline silicon semiconductor layer 915 is formed on the basecoat layer 923. The gate electrode 917 of the circuit TFT 940 is made of the same conductive film as the gate electrode 902 of the pixel TFT 910. That is, the gate electrode 902 of the pixel TFT 910 is also provided on the second gate dielectric layer 916. The source electrode 918 and the drain electrode 919 of the circuit TFT 940, which are made of the same conductive film as the source line 914, are provided on the interlevel dielectric layer 920. The pixel TFT 910 has a bottom gate structure, while the circuit TFT 940 has a top gate structure.

The interlevel dielectric layer 920 includes an inorganic dielectric layer (passivation film) 921 which is made of an inorganic insulative material, and an organic dielectric layer (planarization film) 922 which is made of an organic insulative material and provided on the inorganic dielectric layer 921. An aperture (groove) 920H is made in the interlevel dielectric layer 920. The aperture 20H is located between the active region Ra and the plurality of terminal portions 30. More specifically, the aperture 20H extends not only through the interlevel dielectric layer 920, but also through the first gate dielectric layer 903, the second gate dielectric layer 916, and the basecoat layer 923.

Each terminal portion 930 includes an upper conductive portion 911 provided on the interlevel dielectric layer 920. The upper conductive portion 911 is made of the same conductive film as the source line 914. A line 924 extends from the upper conductive portion 911. The line 924 extends via the aperture 920H toward the active region Ra. The line 924 may be the source line 914, for example. Alternatively, the line 924 may be a line (source connection line) that is electrically connected to the gate line.

In the semiconductor device 900 shown in FIG. 36 and FIG. 37, conductive film residues may occur near the edge of the aperture 920H.

Figure 38:
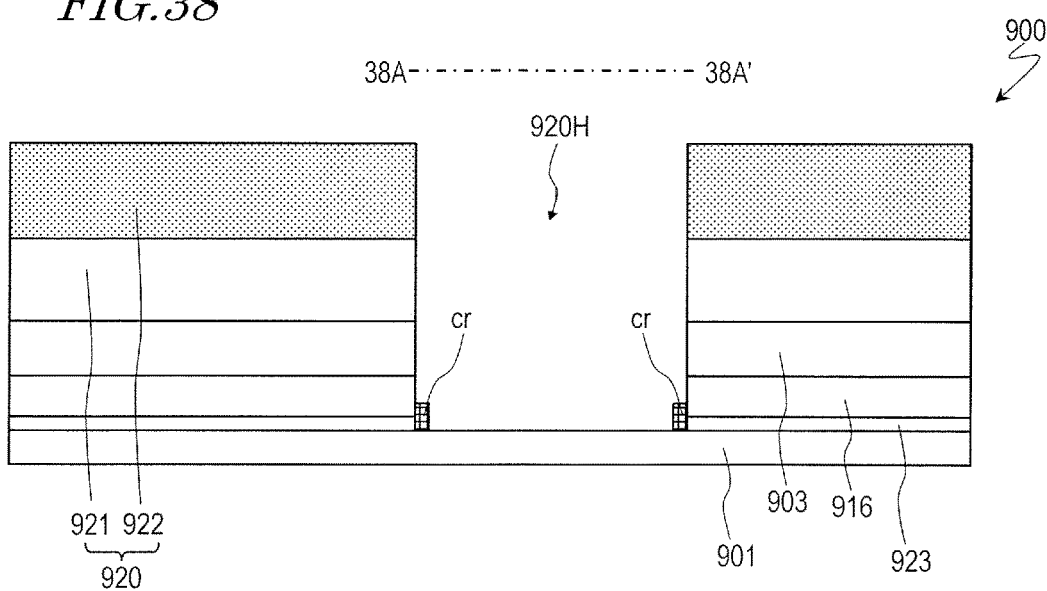
FIG. 38 A cross-sectional view showing how conductive film residues cr may occur in the aperture 20H of the interlevel dielectric layer 920 of the semiconductor device 900, including a cross section taken along line 38A-38A' shown in FIG. 39.
Figure 39:
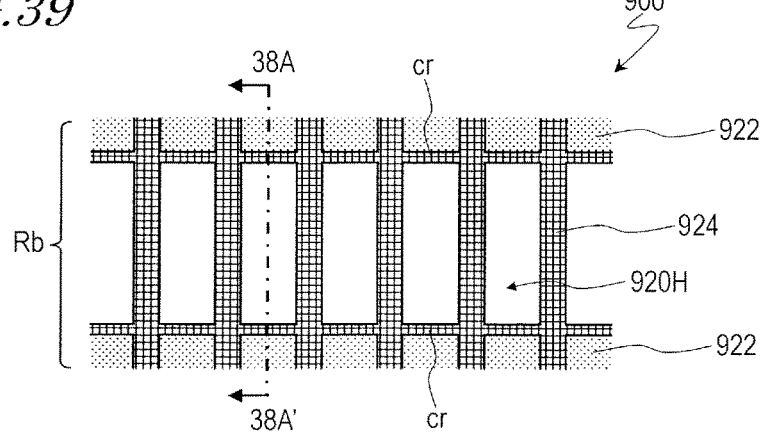
FIG. 39 A plan view showing how conductive film residues cr may occur in the aperture 20H of the interlevel dielectric layer 920 of the semiconductor device 900

FIG. 38 and FIG. 39 show conductive film residues cr occurring in the semiconductor device 900. As shown in FIG. 38 and FIG. 39, when conductive film residues cr occur so as to be in contact with two or more lines 924, the lines 924 will become connected to each other by the conductive film residues cr, thus causing short-circuiting.

FIGS. 40(a) through (c) and FIGS. 41(a) through (c) show some of the steps in the method of producing the semiconductor device 900.

Figure 40:
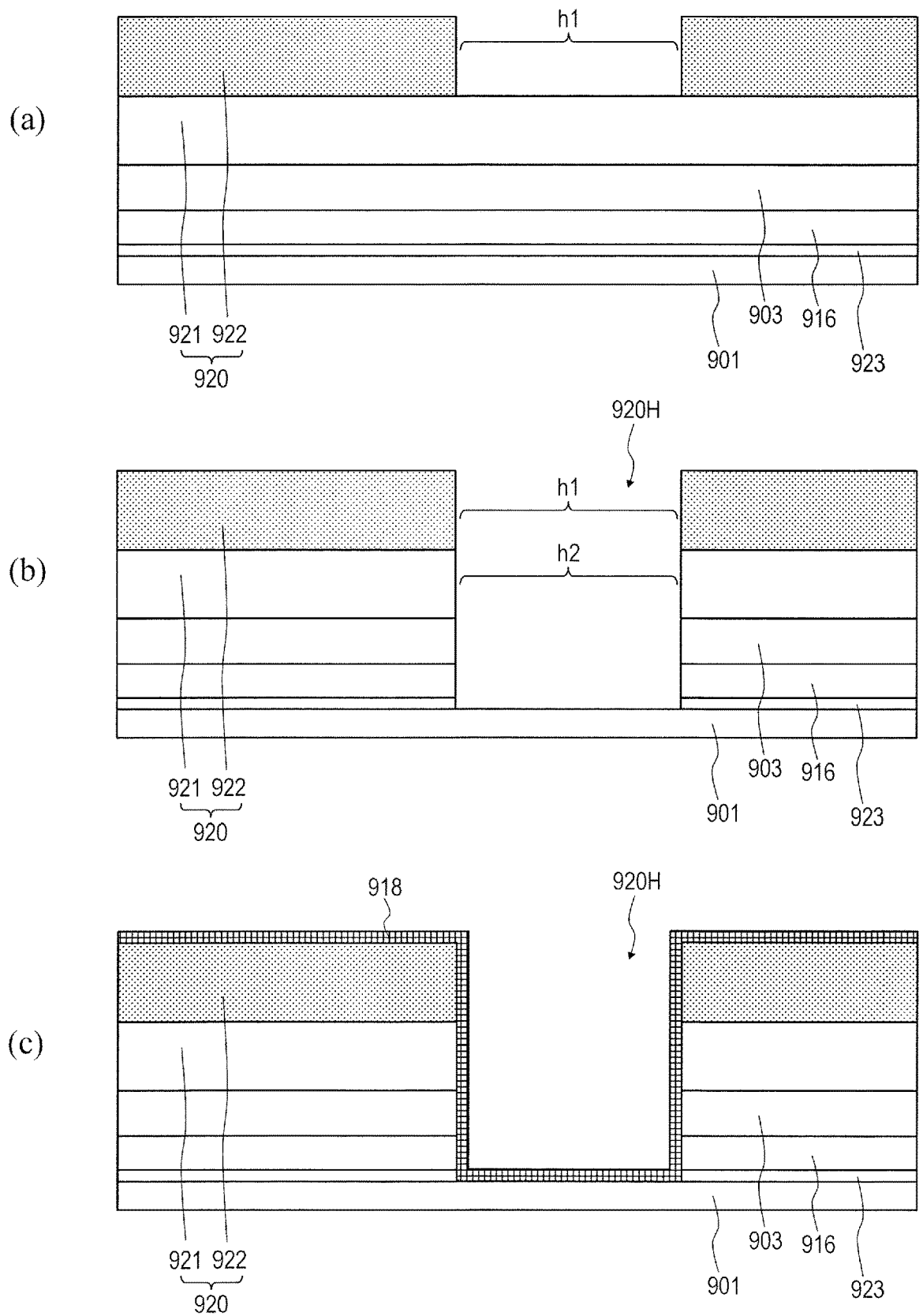
FIG. 40 (a) through (c) are step-by-step cross-sectional views showing a method of producing the semiconductor device 900.

FIG. 40(a) shows a state immediately after the organic dielectric layer 922 has been formed on the inorganic dielectric layer 921. Formation of the organic dielectric layer 922 is achieved by applying a photosensitive resin material on the inorganic dielectric layer 921 and thereafter performing exposure and development. After the development, the organic dielectric layer 922 has an aperture h1 formed therein.

After the formation of the organic dielectric layer 922, as shown in FIG. 40(b), the organic dielectric layer 922 is used as a mask to perform an etching, thereby making an aperture h2 in the inorganic dielectric layer 921, the first gate dielectric layer 903, the second gate dielectric layer 916, and the basecoat layer 923. The aperture h1 in the organic dielectric layer 922 and the continuing aperture h2 in the inorganic dielectric layer 921, the first gate dielectric layer 903, the second gate dielectric layer 916, and the basecoat layer 923 constitute the aperture 920H.

Then, as shown in FIG. 40(c), a conductive film 918 is formed on the interlevel dielectric layer 920. At this time, the conductive film 918 is also formed in the aperture 920H.

Figure 41:
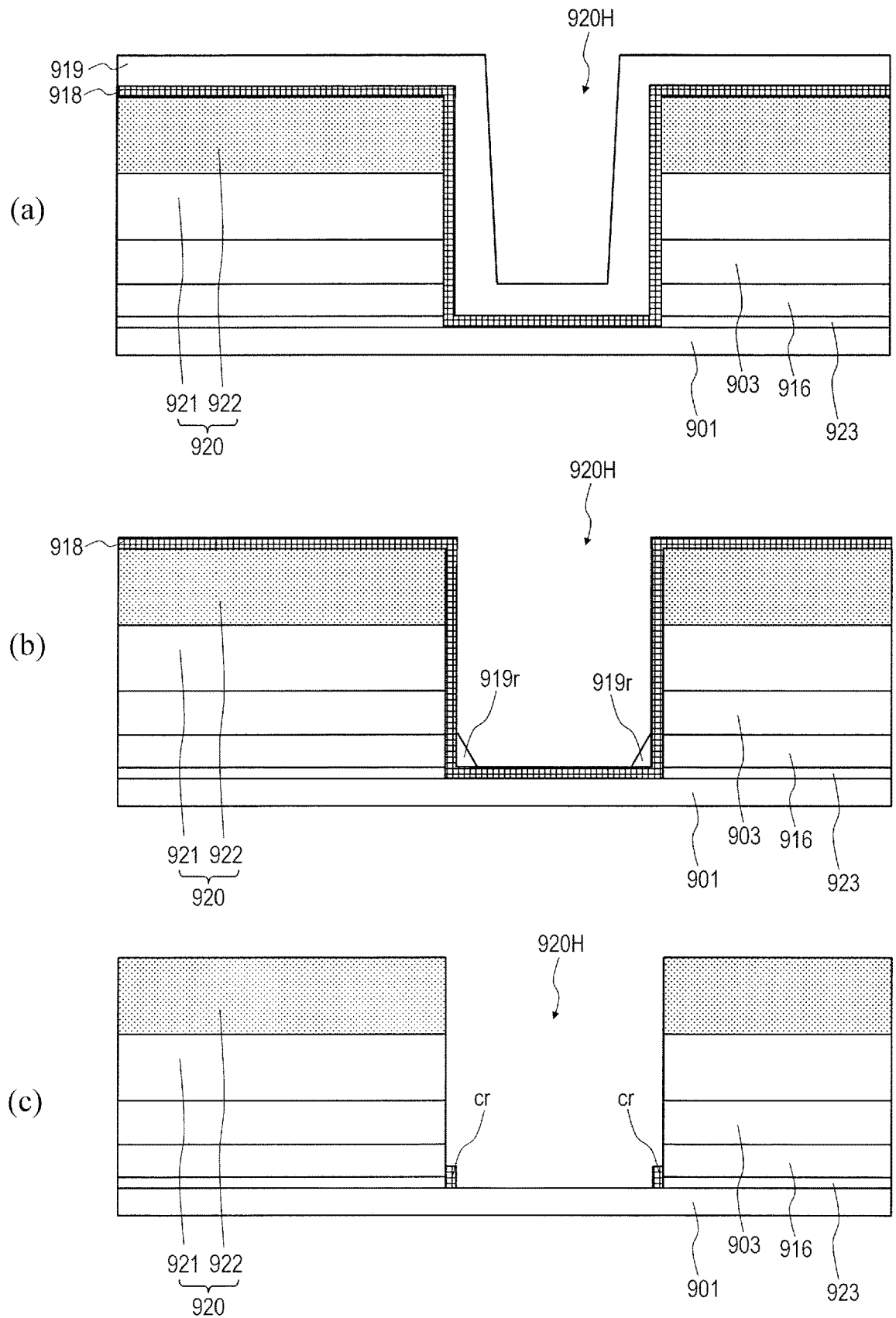
FIG. 41 (a) through (c) are step-by-step cross-sectional views showing a method of producing the semiconductor device 900.

Next, as shown in FIG. 41(a), a photoresist 919 is applied on the conductive film 918. At this point, the thickness of the photoresist 919 near the edge of the aperture 920H is larger than the thickness of the photoresist 919 in any other region.

Then, the photoresist 919 is subject to exposure and development. At this point, the photoresist 919 on any portion of the conductive film 918 to be removed is removed through development. However, since the thickness of the photoresist 919 near the edge of the aperture 920H is greater than the thickness of the photoresist 919 in any other region, the photoresist 919 does not receive sufficient exposure near the edge of the aperture 920H. Consequently, as shown in FIG. 41(b), resist residues 919r may occur near the edge of the aperture 920H.

Thereafter, the conductive film 918 is etched. However, as shown in FIG. 41(c), the portions of the conductive film 918 that are covered by the resist residues 919r cannot be entirely removed, thus remaining as conductive film residues cr.

As described above, in the semiconductor device 900 of Comparative Example, conductive film residues cr will cause short-circuiting between those lines 924 which are located in the aperture 920H. Even if the photoresist 919 is removed so well that no resist residues 919r will occur, the portions of the conductive film 918 that are located near the edge of the aperture 920H (i.e., level difference) are difficult to be removed by dry etching. This might induce conductive film residues cr, in which case short-circuiting will also occur.

Although a construction might be conceivable where any line that extends from the terminal portion 930 toward the active region Ra via the aperture 920H is made of the same conductive film as the gate electrodes 902 and 917 of the pixel TFT 910 and the circuit TFT 940, such a construction cannot be adopted for the following reasons. When producing the semiconductor device 900, before the step of forming the source electrodes 918 and 919 of the circuit TFT 940, a process of cleaning the surface of the crystalline silicon semiconductor layer 915 with hydrofluoric acid (HF) needs to be performed in order to lower the contact resistance. Since lines which are made of the same conductive film as the gate electrodes 902 and 917 become bare within the aperture 920H, they will be damaged during the process using hydrofluoric acid.

On the other hand, a semiconductor device according to an embodiment of the present invention has a construction as described below (or is produced by a production method as described below), and therefore prevents short-circuiting due to conductive film residues from occurring at an aperture in the interlevel dielectric layer. Moreover, as lines extending from a terminal portion toward the active region, lines which are made of the same conductive film as the gate electrodes of TFTs can be used.

Embodiment 1

Figure 1:
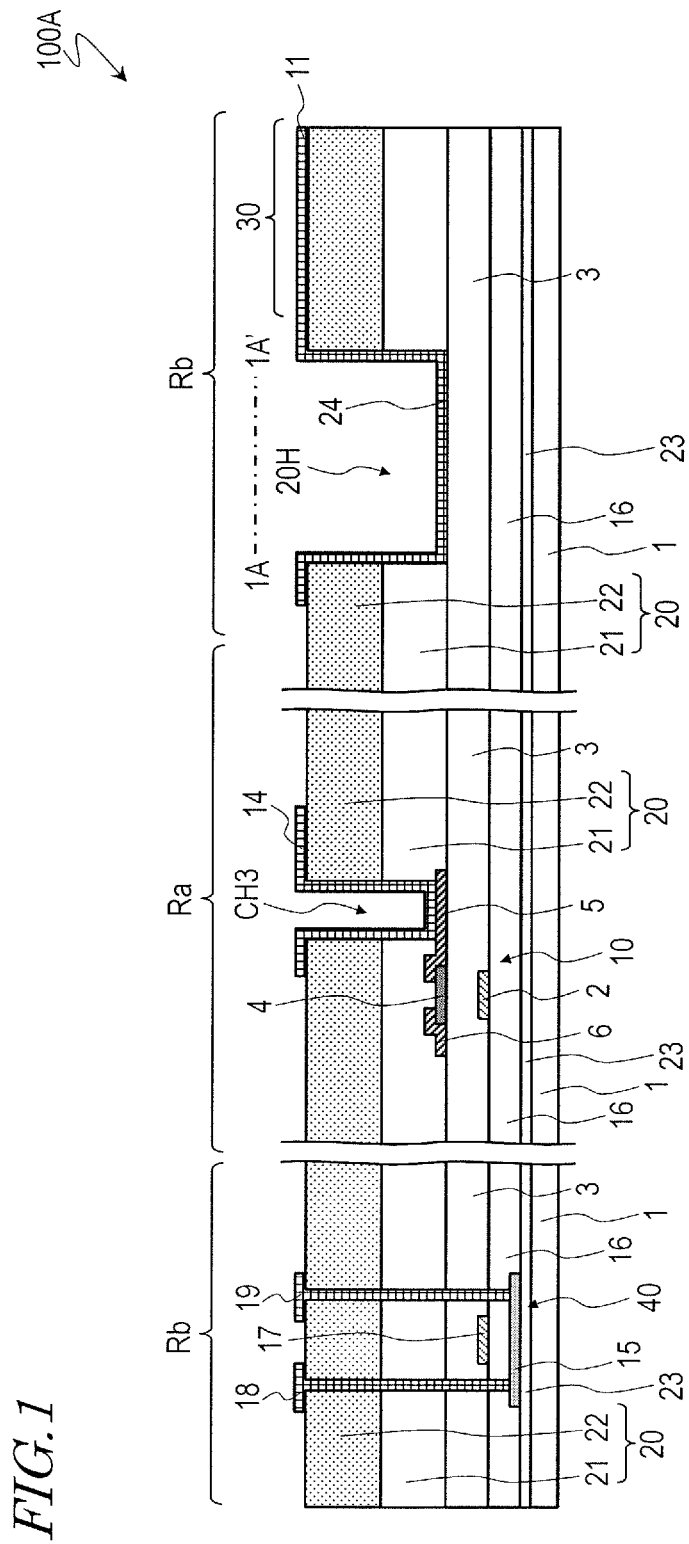
FIG. 1 A cross-sectional view schematically showing a semiconductor device 100A according to an embodiment of the present invention, including a cross section taken along line 1A-1A' shown in FIG. 2.
Figure 2:
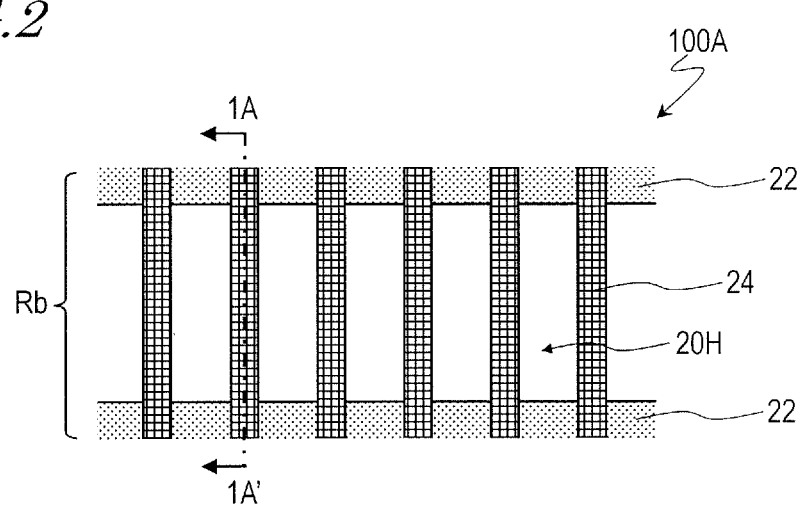
FIG. 2 A plan view schematically showing a portion (near an aperture 20H in an interlevel dielectric layer 20) of the semiconductor device 100A.

With reference to FIG. 1 and FIG. 2, a semiconductor device (TFT substrate) 100A according to the present embodiment will be described. FIG. 1 is a cross-sectional view schematically showing the semiconductor device 100A. FIG. 2 is a plan view schematically showing a portion (near an aperture 20H in an interlevel dielectric layer 20) of the semiconductor device 100A.

As shown in FIG. 1 and FIG. 2, the semiconductor device 100A includes a substrate 1, a plurality of thin film transistors (TFT) 10 supported on the substrate 1, an interlevel dielectric layer 20 covering the plurality of TFTs 10, and a plurality of terminal portions 30 electrically connecting the plurality of TFTs 10 to corresponding external wiring lines. The semiconductor device 100A has an active region (also called a "display region") Ra and a peripheral region (also called a "frame region") Rb located around the active region Ra. In the active region Ra, TFTs 10 are provided correspondingly for the respective pixels. The terminal portions 30 are provided in the peripheral region Rb. The semiconductor device 100A also includes a plurality of further TFTs 40 which are provided in the peripheral region Rb. The further TFTs 40 constitute driving circuitry. Hereinafter, the TFTs 40 will be referred to as "circuit TFTs". Hereinafter, the TFTs 10 which are provided in the respective pixels will be referred to as "pixel TFTs".

Each pixel TFT 10 includes a gate electrode 2, a gate dielectric layer (first gate dielectric layer) 3 covering the gate electrode 2, an oxide semiconductor layer 4 provided on the first gate dielectric layer 3, and a source electrode 5 and a drain electrode 6 electrically connected to the oxide semiconductor layer 4. The gate electrode 2 is electrically connected to a gate line (scanning line), so as to receive a gate signal (scanning signal) supplied from the gate line. The source electrode 5 is electrically connected to a source line (signal line) 14, so as to receive a source signal (display signal) supplied from the source line 14. The source line 14 is disposed on the interlevel dielectric layer 20, and the source electrode 5 is connected to the source line 14 within a source contact hole CH3 which is made in the interlevel dielectric layer 20. The drain electrode 6 is electrically connected to a pixel electrode (not shown) which is provided on the interlevel dielectric layer 20.

Each circuit TFT 40 includes a crystalline silicon semiconductor layer 15 provided on the substrate 1, a further gate dielectric layer (second gate dielectric layer) 16 covering the crystalline silicon semiconductor layer 15, a gate electrode 17 being provided on the second gate dielectric layer 16 and overlapping the crystalline silicon semiconductor layer 15, and a source electrode 18 and a drain electrode 19 electrically connected to the crystalline silicon semiconductor layer 15. Herein, the crystalline silicon semiconductor layer 15 may be an LTPS (Low-temperature Poly-Silicon) layer (or may be any crystalline silicon layer other than LTPS, as will be appreciated). A basecoat layer 23 is formed on the substrate 1, such that the LIPS layer 15 is formed on the basecoat layer 23. The gate electrode 17 of the circuit TFT 40 is made of the same conductive film as the gate electrode 2 of the pixel TFT 10. That is, the gate electrode 2 of the pixel TFT 10 is also provided on the second gate dielectric layer 16. The source electrode 18 and the drain electrode 19 of the circuit TFT 40, which are made of the same conductive film as the source line 14, are provided on the interlevel dielectric layer 20. The pixel TFT 10 has a bottom gate structure, while the circuit TFT 40 has a top gate structure.

The interlevel dielectric layer 20 includes a first dielectric layer 21 provided so as to cover the source electrode 5 and drain electrode 6 of the pixel TFT 10, and a second dielectric layer 22 provided on the first dielectric layer 21. Herein, the first dielectric layer 21 is made of an inorganic insulative material (i.e., it is an inorganic dielectric layer), whereas the second dielectric layer 22 is made of an organic insulative material (i.e., it is an organic dielectric layer).

The interlevel dielectric layer 20 has an aperture (groove) 20H which is made between the active region Ra and the plurality of terminal portions 30. The aperture 20H extends through the interlevel dielectric layer 20. That is, the aperture 20H extends through the first dielectric layer and the second dielectric layer 22. Providing the aperture 20H prevents moisture from intruding into the active region Ra.

Each terminal portion 30 includes an upper conductive portion 11 provided on the interlevel dielectric layer 20. The upper conductive portion 11 is made of the same conductive film as the source line 14. A line 24 extends from the upper conductive portion 11. The line 24 extends via the aperture 20H toward the active region Ra. The line 24 may be the source line 14, for example. Alternatively, the line 24 may be a line (source connection line) that is electrically connected to the gate line.

Now, with reference to FIG. 3 to FIG. 7, a method of producing the semiconductor device 100A will be described. FIGS. 3(a) through (c), FIGS. 4(a) through (c), FIGS. 5(a) and (b), FIGS. 6(a) and (b), and FIGS. 7(a) and (b) are step-by-step cross-sectional views showing a method of producing the semiconductor device 100A.

First, as shown in FIG. 3(a), the basecoat layer (underlying layer) 23 is formed on the surface of the substrate 1. The substrate 1 may be a glass substrate or a plastic substrate, for example. For example, the basecoat layer 23 may have a construction in which a silicon nitride (SiNx) layer and a silicon oxide (SiOx) layer are stacked in this order, although this is not a limitation.

Next, as shown in FIG. 3(b), the LIPS layer 15 is formed on the substrate 1 (i.e., on the basecoat layer 23). The thickness of the LIPS layer 15 may be e.g. not less than 30 nm and not more than 70 nm. The LTPS layer 15 is formed by depositing an amorphous silicon (a-Si) film and then crystallizing it, and patterning the resultant LTPS film, for example. Deposition of an a-Si film can be achieved by a known method, e.g., a plasma CVD (Chemical Vapor Deposition) technique or a sputtering technique, for example. Crystallization of the a-Si film can be achieved by annealing using an excimer laser, for example.

Then, as shown in FIG. 3(c), the second gate dielectric layer 16 covering the LTPS layer 15 is formed. The second gate dielectric layer 16 may be a silicon nitride (SiNx) layer, for example. The thickness of the second gate dielectric layer 16 may be e.g. not less than 50 nm and not more than 130 nm.

Next, as shown in FIG. 4(a), on the second gate dielectric layer 16, the gate electrode 17 of the circuit TFT 40 and the gate electrode 2 of the pixel TFT 10 are formed. The gate electrodes 17 and 2 are formed by depositing a conductive film for the gates, and thereafter patterning it. The conductive film for the gates may be a metal film such as aluminum (Al), tungsten (W), molybdenum (Mo), tantalum (Ta), chromium (Cr), titanium (Ti), or copper (Cu), or an alloy film thereof, for example. The conductive film for the gates may be a single layer, or have a multilayer structure. Herein, a multilayer film in which a Ti film, an Al film, and a Ti film are stacked in this order is used as the conductive film for the gates. The thickness of the conductive film for the gates may be e.g. not less than 100 nm and not more than 500 nm.

Then, as shown in FIG. 4(b), the first gate dielectric layer 3 covering the gate electrodes 17 and 2 is formed. As the first gate dielectric layer 3, for example, a silicon oxide (SiOx) layer, a silicon nitride (SiNx) layer, a silicon oxide nitride (SiOxNy; x>y) layer, a silicon nitride oxide (SiNxOy; x>y) layer, or the like can be used. The thickness of the first gate dielectric layer 3 may be e.g. not less than 50 nm and not more than 200 nm.

Next, as shown in FIG. 4(c), the oxide semiconductor layer 4 and the protection layer 7 are formed on the first gate dielectric layer 3. The oxide semiconductor layer 4 is formed so as to overlap the gate electrode 2 via the gate dielectric layer 3. The protection layer 7 is formed in a position that overlaps a region where the aperture 20H in the interlevel dielectric layer 20 is to be formed later. The oxide semiconductor layer 4 and the protection layer 7 can be formed by depositing an oxide semiconductor film by sputtering technique, and thereafter patterning the oxide semiconductor film, for example. The oxide semiconductor film may be an In—Ga—Zn—O based semiconductor film, for example. The thickness of the oxide semiconductor film may be e.g. not less than 30 nm and not more than 100 nm.

Then, as shown in FIG. 5(a), the source electrode 5 and drain electrode 6 of the pixel TFT 10 are formed. The source electrode 5 and the drain electrode 6 are formed so that at least portions thereof are in contact with the oxide semiconductor layer 4. For example, the source electrode 5 and the drain electrode 6 may be formed by depositing a conductive film for the sources to a predetermined thickness, and thereafter patterning it. The conductive film for the sources may be, for example, a metal film such as aluminum (Al), tungsten (W), molybdenum (Mo), tantalum (Ta), chromium (Cr), titanium (Ti), copper (Cu), or an alloy film thereof. Moreover, the conductive film for the sources may be a single layer, or have a multilayer structure. Herein, as the conductive film for the sources, a multilayer film in which a Ti film, an Al film, and a Ti film are stacked in this order is used. The thickness of the pixel conductive film for the sources may be e.g. not less than 100 nm and not more than 500 nm.

Next, the interlevel dielectric layer 20 covering the pixel TFT 10 is formed. Specifically, first, as shown in FIG. 5(b), the first dielectric layer 21 is formed so as to cover the source electrode 5 and drain electrode 6 of the pixel TFT 10. The thickness of the first dielectric layer 21 may be e.g. not less than 200 nm and not more than 500 nm. The first dielectric layer 21 may be a silicon oxide (SiOx) layer, a silicon nitride (SiNx) layer, or a multilayer film thereof. In the case of a multilayer film, the silicon oxide layer may be disposed as the lower layer that is in contact with the oxide semiconductor layer 4, whereby oxygen defects in the oxide semiconductor layer 4 can be prevented. After formation of the first dielectric layer 21, in order to stabilize the characteristics (e.g., threshold voltage Vth) of the pixel TFT 10, a heat treatment step at a temperature of e.g. 200° C. to 400° C. may be performed for 1 hour to 2 hours in dry air or in the atmospheric air.

Next, as shown in FIG. 6(a), the second dielectric layer 22 is formed on the first dielectric layer 21. The second dielectric layer 22 may be formed by introducing a photosensitive resin material of positive type on the first dielectric layer 21, and thereafter subjecting it to exposure and development, for example. At this point, apertures 22h, 22h3, 22h4 and 22h5 are formed in predetermined regions of the second dielectric layer 22. Specifically, in an aperture forming region, an aperture 22h overlapping the protection layer 7 is formed. In a pixel forming region, an aperture 22h3 overlapping a portion of the source electrode 5 is formed. Furthermore, in a region where driving circuitry is formed (circuit forming region), apertures 22h4 and 22h5 overlapping portions of the LIPS layer 15 are formed. The thickness of the second dielectric layer 22 may be e.g. not less than 1 μm and not more than 2 μm.

Then, as shown in FIG. 6(b), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, the first dielectric layer 21 is removed so as to expose the protection layer 7, thereby forming an aperture 20H overlapping the protection layer 7. Since the protection layer 7 functions as an etch-stop, the portion of the first gate dielectric layer 3 that is located under the protection layer 7 is not removed. In the circuit forming region, the first dielectric layer 21, the first gate dielectric layer 3, and the second gate dielectric layer 16 are removed so as to partly expose the LIPS layer 15, thereby forming contact holes CH4 and CH5 for circuitry.

Next, as shown in FIG. 7(a), the protection layer 7 within the aperture 20H is removed. Removal of the protection layer 7 may be performed by using hydrofluoric acid (HF), for example.

Then, as shown in FIG. 7(b), on the interlevel dielectric layer 20 (i.e., on the second dielectric layer 22), the source line 14, the upper conductive portion 11, the line 24, and the source electrode 18 and drain electrode 19 of the circuit TFT 40 are formed. The source line 14 and the like may be formed by depositing a conductive film for the source lines to a predetermined thickness, and thereafter patterning it, for example. The conductive film for the source lines may be a metal film such as aluminum (Al), tungsten (W), molybdenum (Mo), tantalum (Ta), chromium (Cr), titanium (Ti), or copper (Cu), or an alloy film thereof, for example. Moreover, the conductive film for the source lines may be a single layer, or have a multilayer structure. The thickness of the conductive film for the source lines may be e.g. not less than 100 nm and not more than 500 nm.

Thereafter, a pixel electrode is formed on the interlevel dielectric layer 20 (i.e., on the second dielectric layer 22). The pixel electrode is formed by depositing a transparent conductive film (e.g., an ITO film) to a predetermined thickness, and thereafter patterning it.

Thus, the semiconductor device 100A according to the present embodiment is obtained. In the step of forming the oxide semiconductor layer 4 of the pixel TFT 10, forming the protection layer 7 so as to overlap the aperture 20H to be later formed in the interlevel dielectric layer 20 prevents the first gate dielectric layer 3 under the protection layer 7 from being removed in the step of etching the first dielectric layer 21, the first gate dielectric layer 3, and the second gate dielectric layer 16. Therefore, the level difference ascribable to the aperture 20H is reduced (i.e., the depth of the aperture 20H is made smaller), whereby the conductive film residues cr become less likely to occur. This can reduce short-circuiting between lines 24.

<Regarding the Oxide Semiconductor Layer>

Now, the oxide semiconductor layer for use in embodiments of the present invention will be described.

As used in the present specification, an "oxide semiconductor layer" is a layer that includes a semiconductor region functioning as an active layer of an oxide semiconductor TFT. The oxide semiconductor layer may include a region which is locally lowered in resistance (a low resistance region or a conductor region). For example, in the case where the oxide semiconductor layer is in contact with a conductor layer such as a metal layer or a dielectric layer of reducing nature, the portion of the surface of the oxide semiconductor layer that is in contact with the conductor layer becomes a low resistance region that is lower in electrical resistance than the semiconductor region. In some cases, only the surface of the oxide semiconductor layer may be lowered in resistance; in other cases, the oxide semiconductor layer may be lowered in resistance across its thickness.

The oxide semiconductor that is contained in the semiconductor region of the oxide semiconductor layer may be an amorphous oxide semiconductor, or a crystalline oxide semiconductor having a crystalline portion. Examples of crystalline oxide semiconductor include polycrystalline oxide semiconductors, microcrystalline oxide semiconductors, crystalline oxide semiconductors whose c axis is oriented essentially perpendicular to the layer plane, and so on.

The oxide semiconductor layer may have a multilayer structure of two or more layers. When the oxide semiconductor layer has a multilayer structure, the oxide semiconductor layer may include an amorphous oxide semiconductor layer and a crystalline oxide semiconductor layer. Alternatively, it may include a plurality of crystalline oxide semiconductor layers of different crystal structures. Moreover, it may include a plurality of amorphous oxide semiconductor layers. In the case where the oxide semiconductor layer has a two-layer structure including an upper layer and a lower layer, the energy gap of the oxide semiconductor that is contained in the upper layer is preferably greater than the energy gap of the oxide semiconductor that is contained in the lower layer. However, when the difference between the energy gaps of these layers is relatively small, the energy gap of the oxide semiconductor of the lower layer may be greater than the energy gap of the oxide semiconductor of the upper layer.

The material, structure, and method of film formation of an amorphous oxide semiconductor and each above crystalline oxide semiconductor, the construction of an oxide semiconductor layer having multilayer structure, etc., are described in Japanese Laid-Open Patent Publication No. 2014-007399, for example. The entire disclosure of Japanese Laid-Open Patent Publication No. 2014-007399 is incorporated herein by reference.

The oxide semiconductor layer may contain at least one metallic element among In, Ga, and Zn, for example. In the present embodiment, the oxide semiconductor layer contains an In—Ga—Zn—O based semiconductor (e.g. indium gallium zinc oxide), for example. Herein, the In—Ga—Zn—O based semiconductor is a ternary oxide of In (indium), Ga (gallium), Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer 11 may be made from an oxide semiconductor film containing an In—Ga—Zn—O based semiconductor.

The In—Ga—Zn—O based semiconductor may be amorphous or crystalline. As the crystalline In—Ga—Zn—O based semiconductor, a crystalline In—Ga—Zn—O based semiconductor whose c axis is oriented essentially perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosures of Japanese Laid-Open Patent Publication No. 2012-134475 and Japanese Laid-Open Patent Publication No. 2014-209727 are incorporated herein by reference. A TFT including an In—Ga—Zn—O based semiconductor layer has a high mobility (20 times that of an a-Si TFT or greater) and a low leakage current (less than $1/100$ times that of an a-Si TFT), and therefore is suitably used as a driving TFT (e.g., a TFT that is included in a driving circuit which is provided on the same substrate as the display region, near a display region including a plurality of pixels) or as a pixel TFT (a TFT that is provided in a pixel).

Instead of an In—Ga—Zn—O based semiconductor, the oxide semiconductor layer may contain any other oxide semiconductor. For example, it may contain an In—Sn—Zn—O based semiconductor (e.g. $In_2O_3$—$SnO_2$—ZnO;InSnZnO). An In—Sn—Zn—O based semiconductor is a ternary oxide of In (indium), Sn (tin), and Zn (zinc). Alternatively, the oxide semiconductor layer 11 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, a Ga—Zn—O based semiconductor, or the like.

Figure 3:
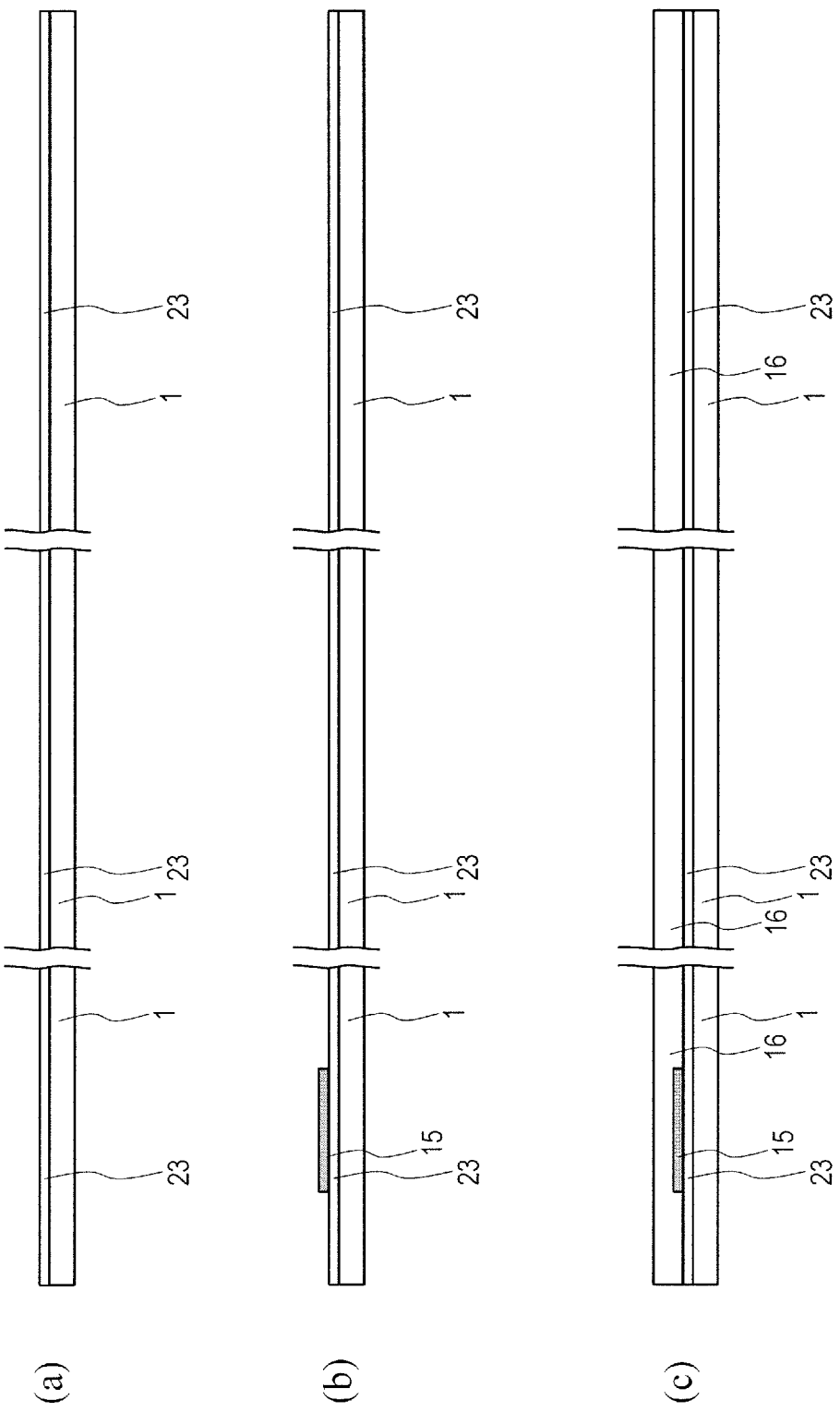
FIG. 3 (a) through (c) are step-by-step cross-sectional views showing a method of producing the semiconductor device 100A.
Figure 4:
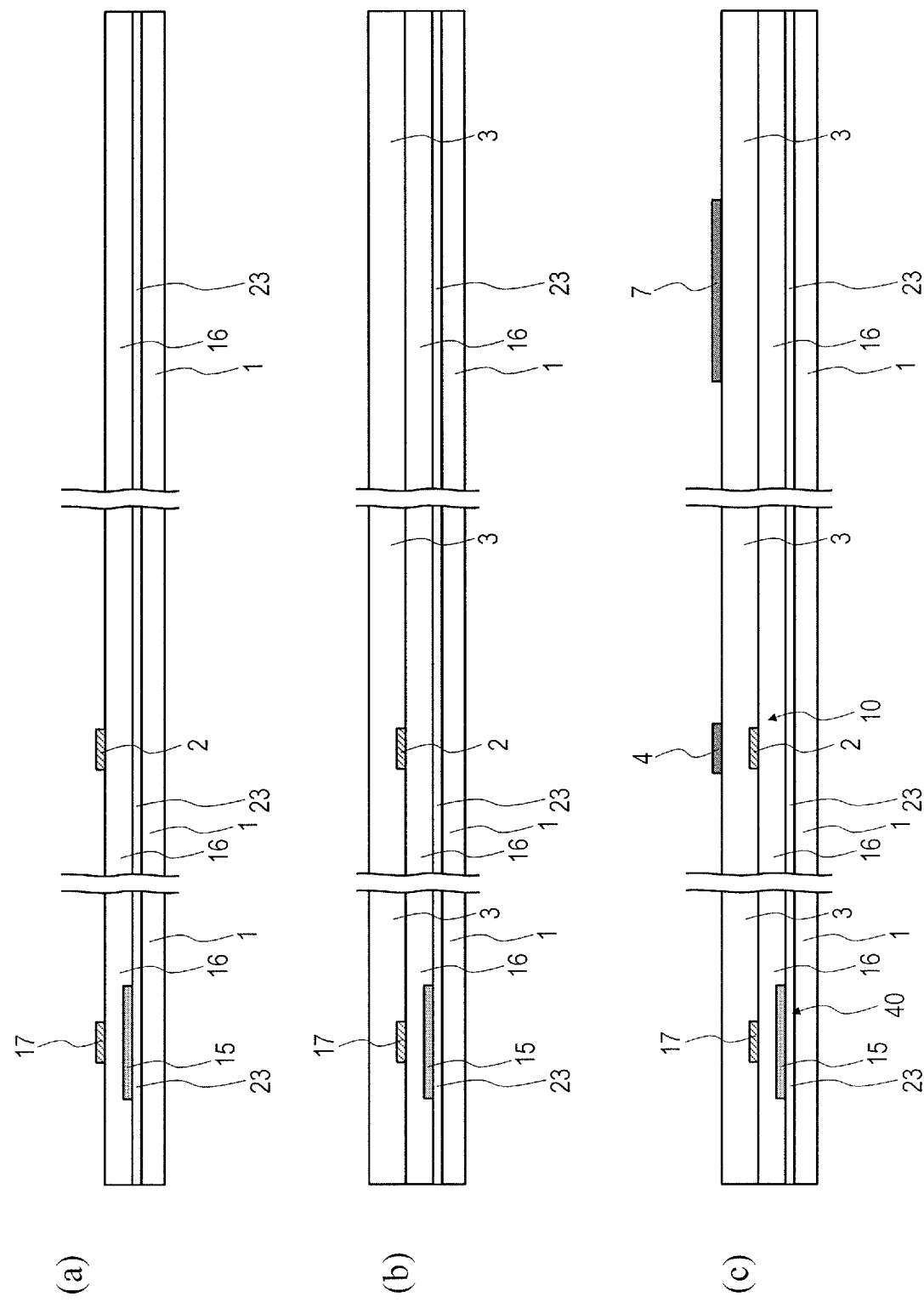
FIG. 4 (a) through (c) are step-by-step cross-sectional views showing a method of producing the semiconductor device 100A.
Figure 7:
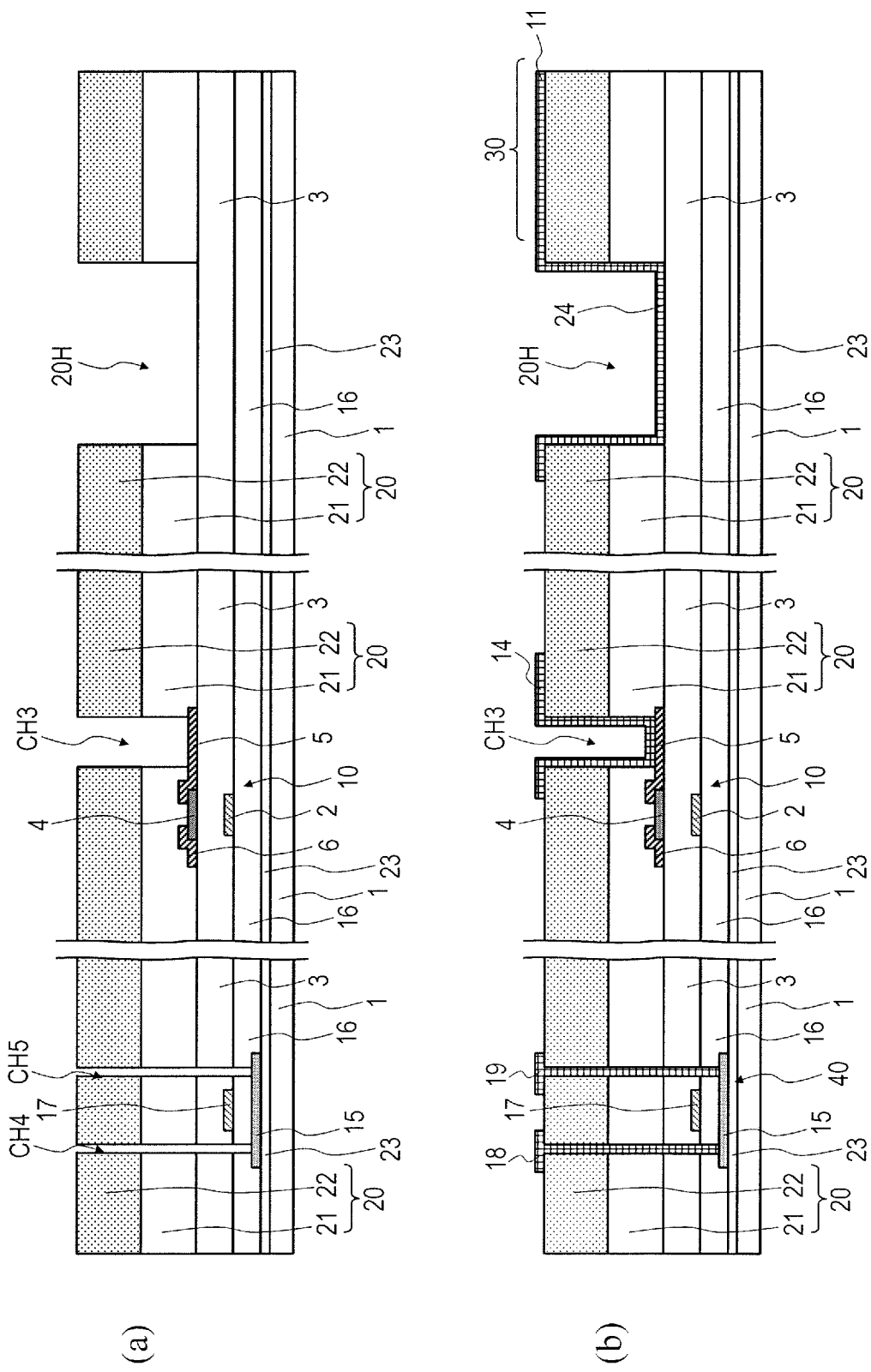
FIGS. 7 (a) and (b) are step-by-step cross-sectional views showing a method of producing the semiconductor device 100A.

The oxide semiconductor TFT included in a semiconductor device according to an embodiment of the present invention may be a TFT of channel-etch type, or a TFT of etch-stop type. In a channel-etch type TFT, as shown in FIG. 3, no etch stop layer is formed above the channel region, and thus the lower faces of the ends of the source and drain electrodes that are closer to the channel are disposed in contact with the upper face of the oxide semiconductor layer. A channel-etch type TFT is formed by, for example, forming a conductive film for the source/drain electrodes on the oxide semiconductor layer, and effecting source-drain separation. In the source-drain separation step, a surface portion of the channel region may become etched in some cases.

On the other hand, in a TFT having an etch stop layer formed above the channel region (etch-stop type TFT), the lower faces of the ends of the source and drain electrodes that are closer to the channel may be located above the etch stop layer, for example. An etch-stop type TFT is formed by, for example, after forming an etch stop layer that covers a portion of the oxide semiconductor layer to become a channel region, forming a conductive film for the source/ drain electrodes upon the oxide semiconductor layer and the etch stop layer, and effecting source-drain separation.

Furthermore, the oxide semiconductor TFT included in a semiconductor device according to an embodiment of the present invention may have a top-contact structure as shown in FIG. 1, in which the source and drain electrodes are in contact with the upper face of the oxide semiconductor layer 23, but may alternatively have a bottom-contact structure in which the source and drain electrodes are in contact with the lower face of the oxide semiconductor layer 23.

Note that a channel-etch type TFT having an active layer including an oxide semiconductor, e.g., an In—Ga—Zn—O based semiconductor, may be referred to as a "CE-OS-TFT".

Embodiment 2

Figure 8:
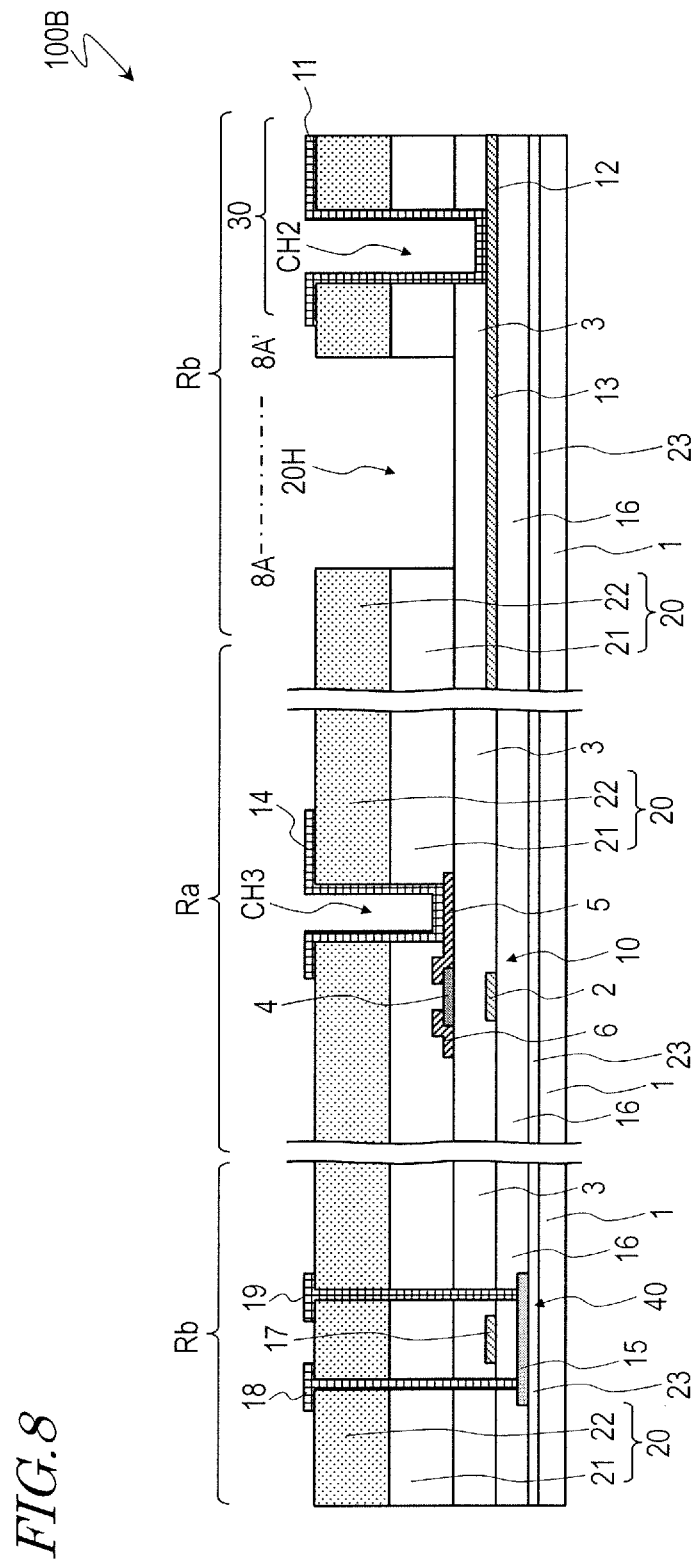
FIG. 8 A cross-sectional view schematically a semiconductor device 100B according to an embodiment of the present invention, including a cross section taken along line 8A-8A' shown in FIG. 9.
Figure 9:
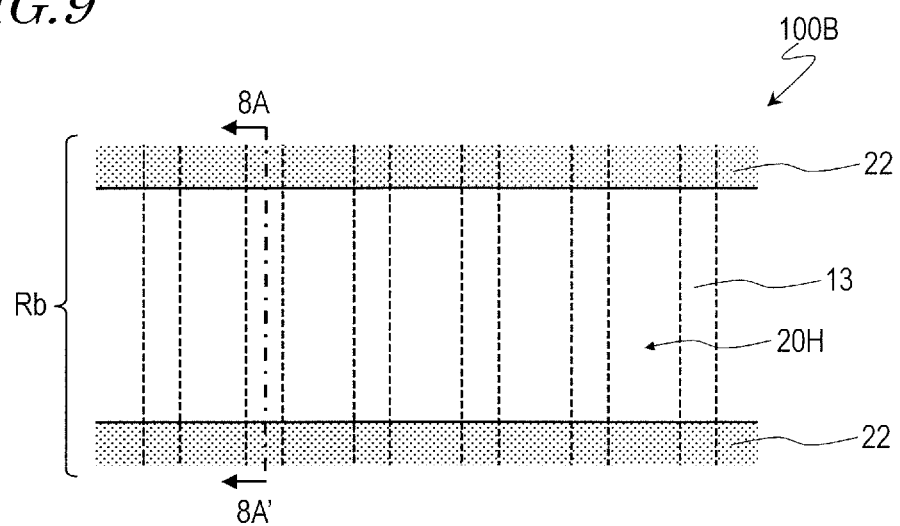
FIG. 9 A plan view schematically showing a portion (near an aperture 20H in an interlevel dielectric layer 20) of the semiconductor device 100B.
Figure 10:
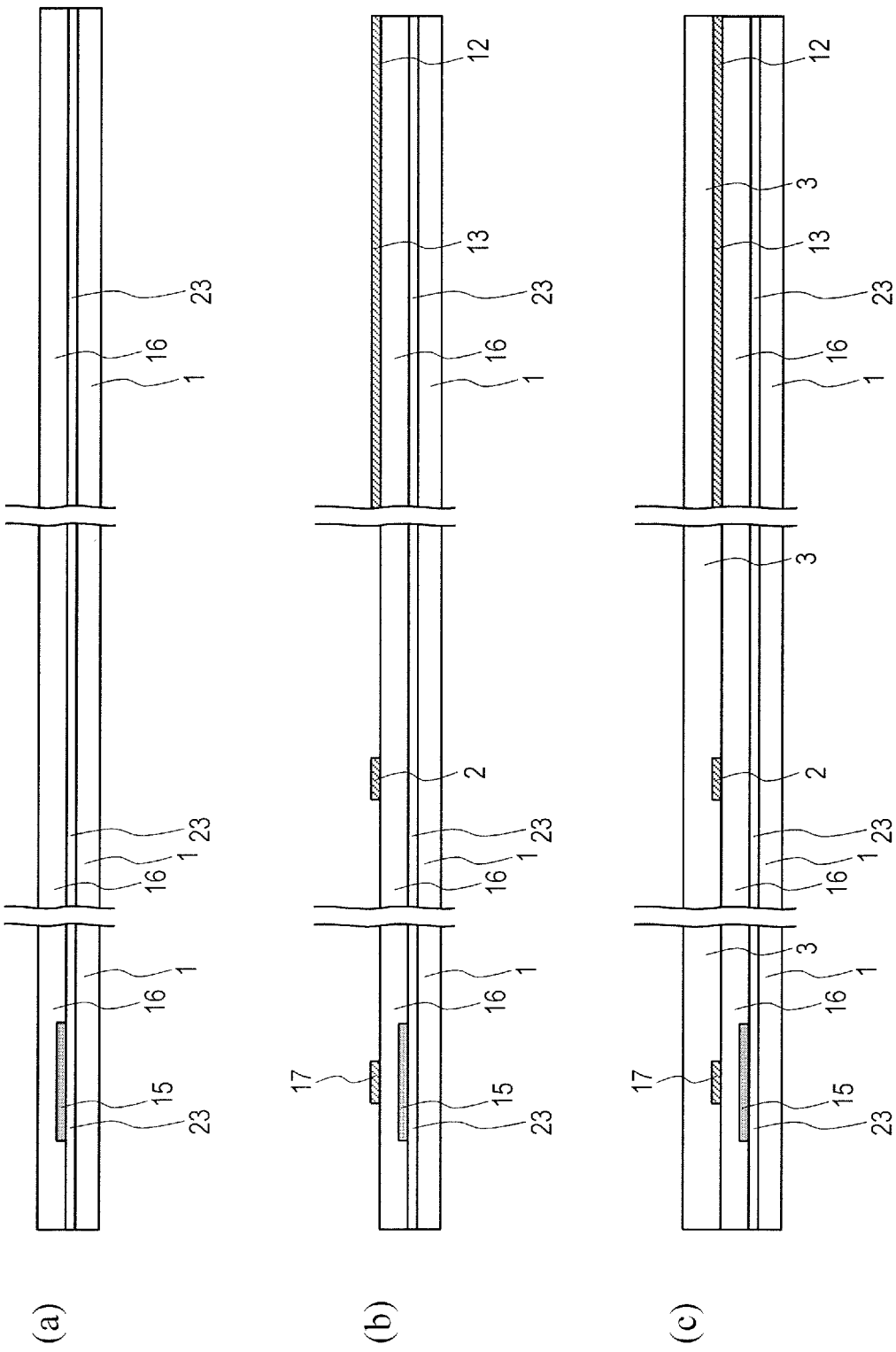
FIG. 10 (a) through (c) are step-by-step cross-sectional views showing a method of producing the semiconductor device 100B.
Figure 11:
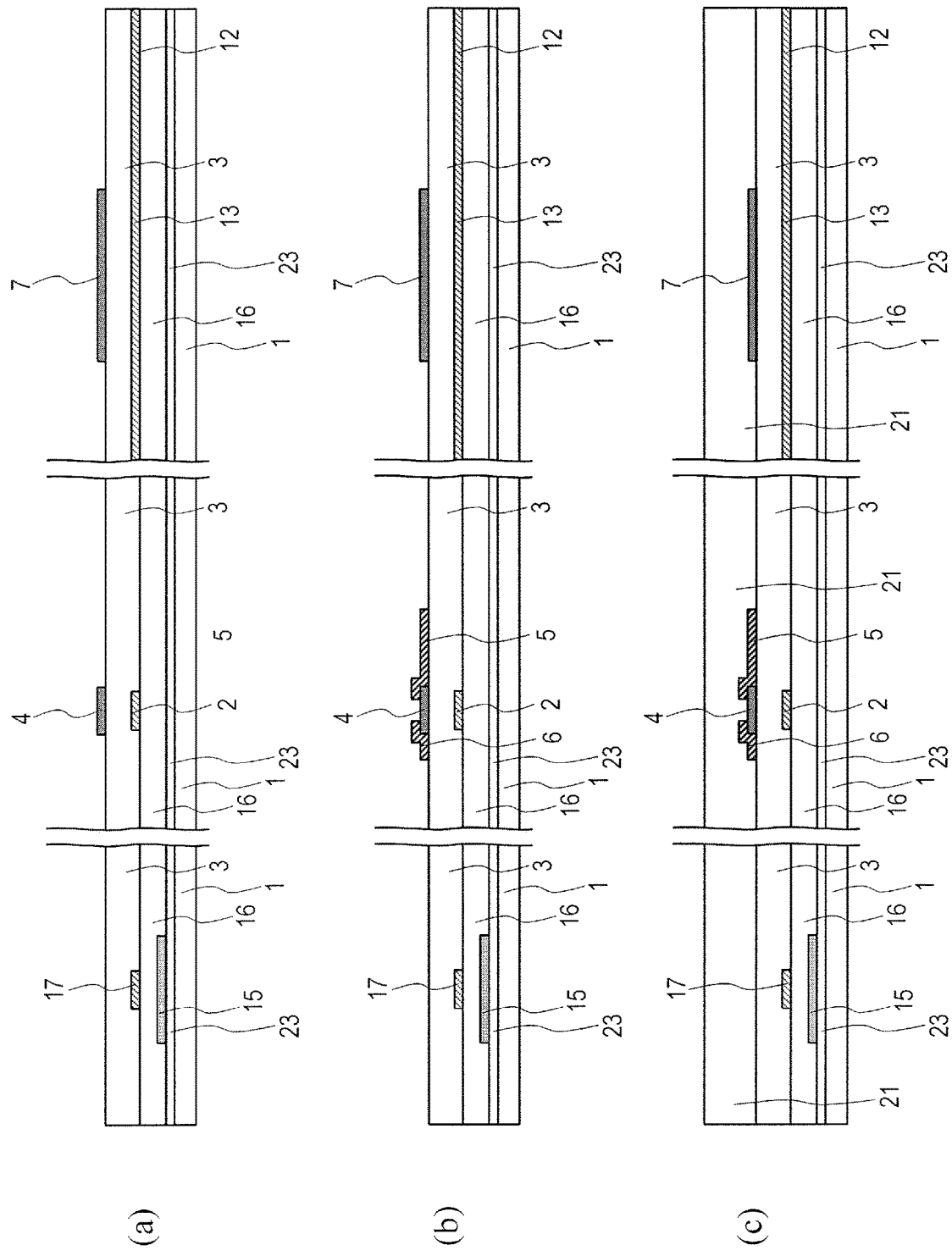
FIG. 11 (a) through (c) are step-by-step cross-sectional views showing a method of producing the semiconductor device 100B.
Figure 12:
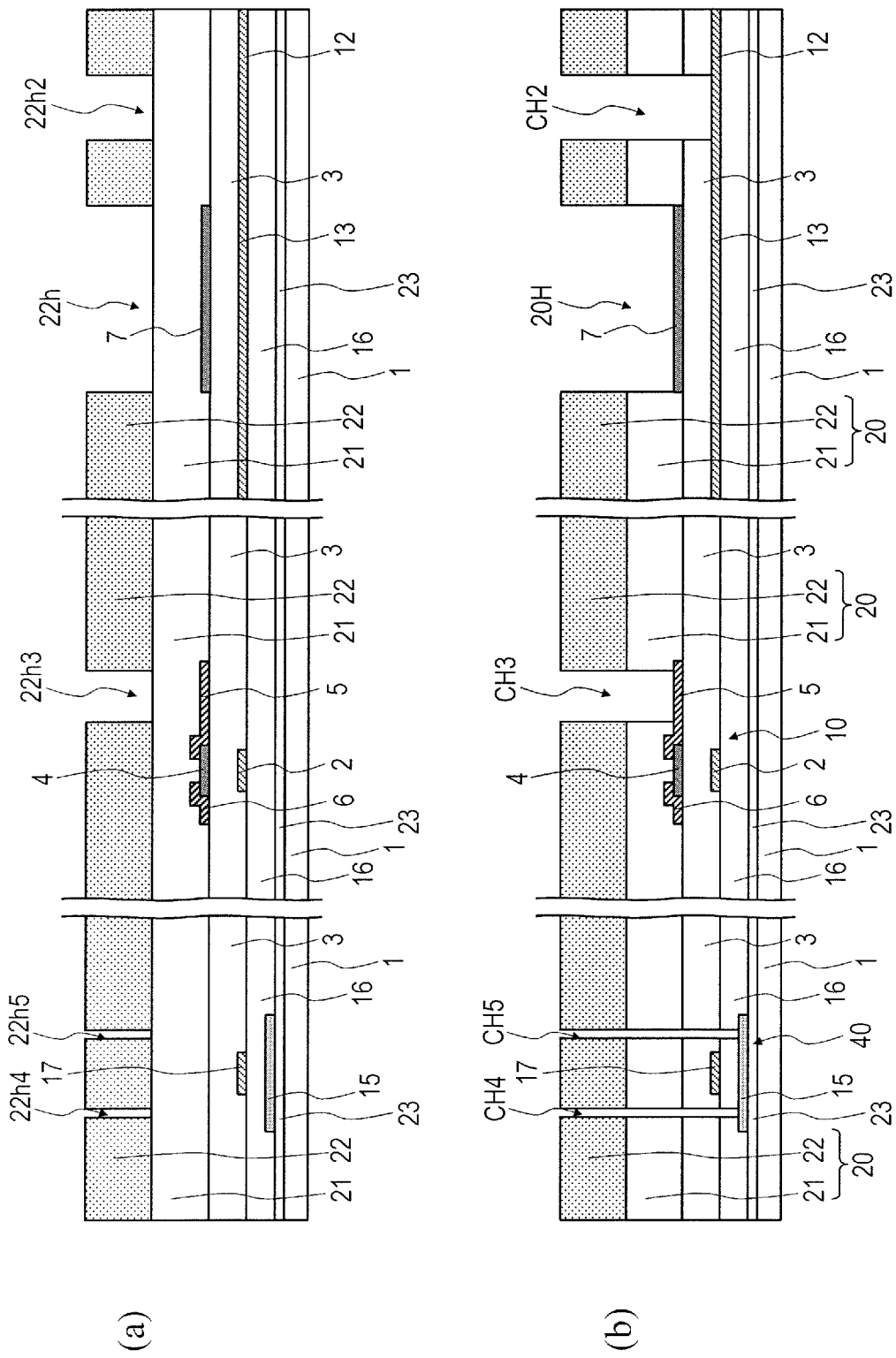
FIGS. 12 (a) and (b) are step-by-step cross-sectional views showing a method of producing the semiconductor device 100B.
Figure 13:
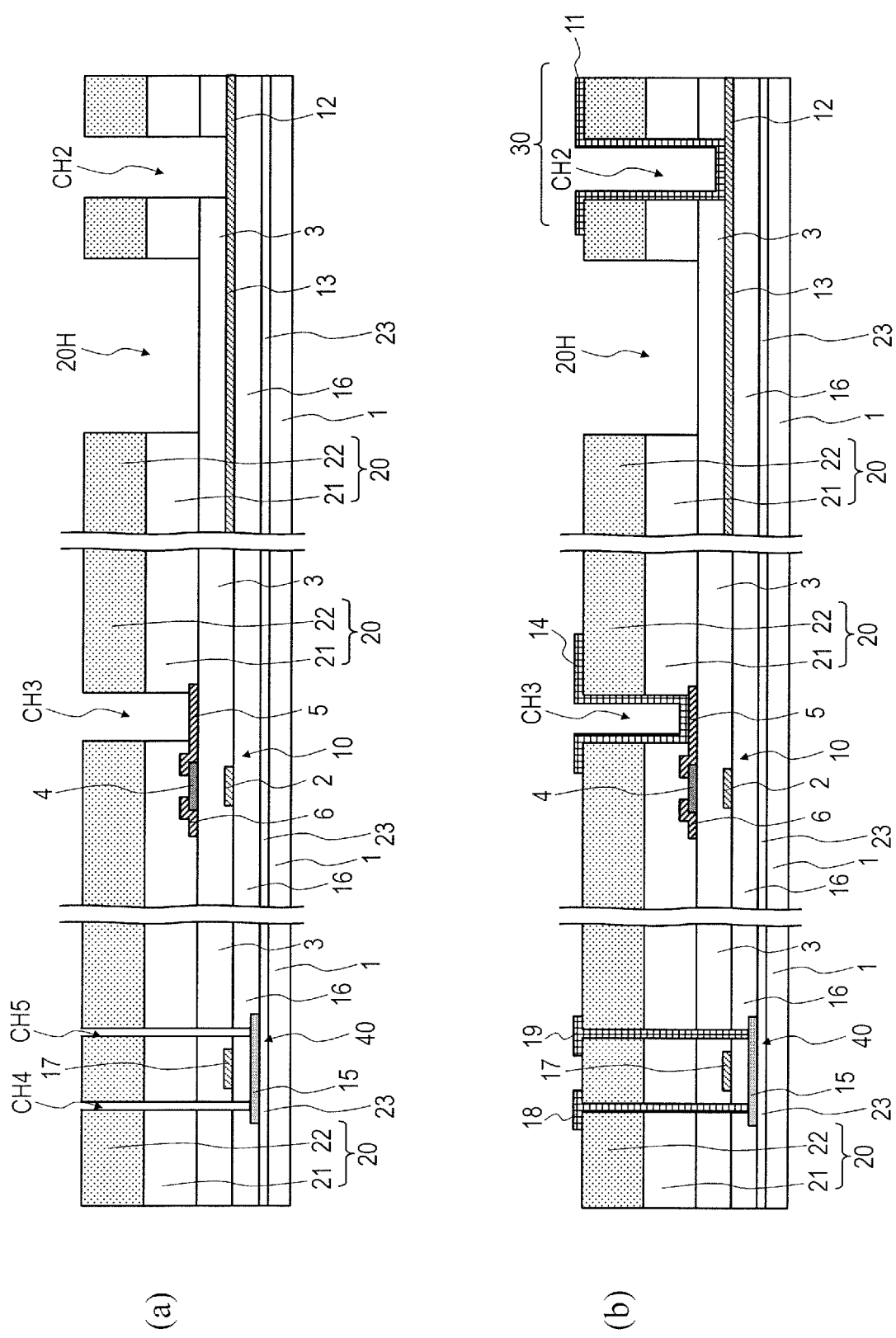
FIGS. 13 (a) and (b) are step-by-step cross-sectional views showing a method of producing the semiconductor device 100B.

With reference to FIG. 8 and FIG. 9, a semiconductor device (TFT substrate) 100B according to the present embodiment will be described. FIG. 8 is a cross-sectional view schematically showing the semiconductor device 100B. FIG. 9 is a plan view schematically showing a portion (near the aperture 20H in the interlevel dielectric layer 20) of the semiconductor device 100B. Hereinafter, differences of the semiconductor device 100B from the semiconductor device 100A of Embodiment 1 will mainly be described.

In addition to the upper conductive portion 11, the terminal portion 30 of the semiconductor device 100B shown in FIG. 8 and FIG. 9 includes a lower conductive portion 12 provided under the first gate dielectric layer 3. The lower conductive portion 12 is made of the same conductive film as the gate electrodes 2 and 17 of the pixel TFT 10 and the circuit TFT 40. In a terminal-portion contact hole CH2 made in the first gate dielectric layer 3 and the interlevel dielectric layer 20, the lower conductive portion 12 is electrically connected to the upper conductive portion 11.

A line 13 extends from the lower conductive portion 12. The line 13 extends under the aperture 20H toward the active region Ra. The line 13 may be a gate line, for example. Alternatively, the line 13 may be a gate connection line electrically connected to the source line.

Now, with reference to FIG. 10 to FIG. 13, a method of producing the semiconductor device 100B will be described. FIGS. 10(a) through (c), FIGS. 11(a) through (c), FIGS. 12(a) and (b) and FIGS. 13(a) and (b) are step-by-step cross-sectional views showing a method of producing the semiconductor device 100B.

First, as shown in FIG. 10(a), the basecoat layer 23, the LIPS layer 15, and the second gate dielectric layer 16 are sequentially formed on the substrate 1. Formation of these can be achieved in manners similar to those described with respect to the semiconductor device 100A of Embodiment 1 by referring to FIGS. 3(a) through (c).

Next, as shown in FIG. 10(b), the gate electrode 17 of the circuit TFT 40, the gate electrode 2 of the pixel TFT 10, the lower conductive portion 12, and the line 13 are formed on the second gate dielectric layer 16. The gate electrode 17 of the circuit TFT 40, the gate electrode 2 of the pixel TFT 10, the lower conductive portion 12, and the line 13 are formed by depositing a conductive film for the gates, and thereafter patterning it.

Then, as shown in FIG. 10(c), a first gate dielectric layer 3 covering the gate electrode 17 of the circuit TFT 40, the gate electrode 2 of the pixel TFT 10, the lower conductive portion 12, and the line 13 is formed. The first gate dielectric layer 3 is formed by depositing an inorganic insulative material.

Next, as shown in FIG. 11(a), the oxide semiconductor layer 4 and the protection layer 7 are formed on the first gate dielectric layer 3. The oxide semiconductor layer 4 is formed so as to overlap the gate electrode 2 via the gate dielectric layer 3. The protection layer 7 is formed in a position that overlaps a region where the aperture 20H in the interlevel dielectric layer 20 is to be formed later. The oxide semiconductor layer 4 and the protection layer 7 can be formed by depositing an oxide semiconductor film by sputtering technique, and thereafter patterning the oxide semiconductor film, for example.

Then, as shown in FIG. 11(b), the source electrode 5 and drain electrode 6 of the pixel TFT 10 are formed. The source electrode 5 and the drain electrode 6 are formed so that at least portions thereof are in contact with the oxide semiconductor layer 4. For example, the source electrode 5 and the drain electrode 6 may be formed by depositing a conductive film for the sources to a predetermined thickness, and thereafter patterning it.

Next, the interlevel dielectric layer 20 covering the pixel TFT 10 is formed. Specifically, first, as shown in FIG. 11(c), the first dielectric layer 21 is formed so as to cover the source electrode 5 and drain electrode 6 of the pixel TFT 10. The first dielectric layer 21 may be formed by depositing an inorganic dielectric film to a predetermined thickness, for example.

Next, as shown in FIG. 12(a), the second dielectric layer 22 is formed on the first dielectric layer 21. The second dielectric layer 22 may be formed by introducing a photosensitive resin material of positive type on the first dielectric layer 21, and thereafter subjecting it to exposure and development, for example. At this point, apertures 22h, 22h2, 22h3, 22h4 and 22h5 are formed in predetermined regions of the second dielectric layer 22. Specifically, in an aperture forming region, an aperture 22h overlapping the protection layer 7 is formed. Moreover, in a terminal portion forming region, an aperture 22h2 overlapping a portion of the lower conductive portion 12 is formed; and in a pixel forming region, an aperture 22h3 overlapping a portion of the source electrode 5 is formed. Furthermore, in a circuit forming region, apertures 22h4 and 22h5 overlapping portions of the LIPS layer 15 are formed.

Then, as shown in FIG. 12(b), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, the first dielectric layer 21 is removed so as to expose the protection layer 7, thereby forming an aperture 20H overlapping the protection layer 7. Since the protection layer 7 functions as an etch-stop, the portion of the first gate dielectric layer 3 that is located under the protection layer 7 is not removed. In the terminal portion forming region, the first dielectric layer 21 and the first gate dielectric layer 3 are removed so as to partly expose the lower conductive portion 12, thereby forming a terminal-portion contact hole CH2. In the circuit forming region, the first dielectric layer 21, the first gate dielectric layer 3, and the second gate dielectric layer 16 are removed so as to partly expose the LIPS layer 15, thereby forming contact holes CH4 and CH5 for circuitry.

Next, as shown in FIG. 13(a), the protection layer within the aperture 20H is removed. Removal of the protection layer 7 may be performed by using hydrofluoric acid (HF), for example.

Then, as shown in FIG. 13(b), on the interlevel dielectric layer 20 (i.e., on the second dielectric layer 22), the source line 14, the upper conductive portion 11, and the source electrode 18 and drain electrode 19 of the circuit TFT 40 are formed. The source line 14 and the like may be formed by depositing a conductive film for the source lines to a predetermined thickness, and thereafter patterning it, for example.

Thereafter, a pixel electrode is formed on the interlevel dielectric layer 20 (i.e., on the second dielectric layer 22). The pixel electrode is formed by depositing a transparent conductive film to a predetermined thickness, and thereafter patterning it.

Thus, the semiconductor device 100B according to the present embodiment is obtained. In the step of forming the oxide semiconductor layer 4 of the pixel TFT 10, forming the protection layer 7 so as to overlap the aperture 20H to be later formed in the interlevel dielectric layer 20 prevents the first gate dielectric layer 3 under the protection layer 7 from being removed in the step of etching the first dielectric layer 21, the first gate dielectric layer 3, and the second gate dielectric layer 16. Therefore, even if conductive film residues cr occur within the aperture 20H in the step of forming the upper conductive portion 11 and the like, short-circuiting between lines 13 can be prevented.

Figure 14:
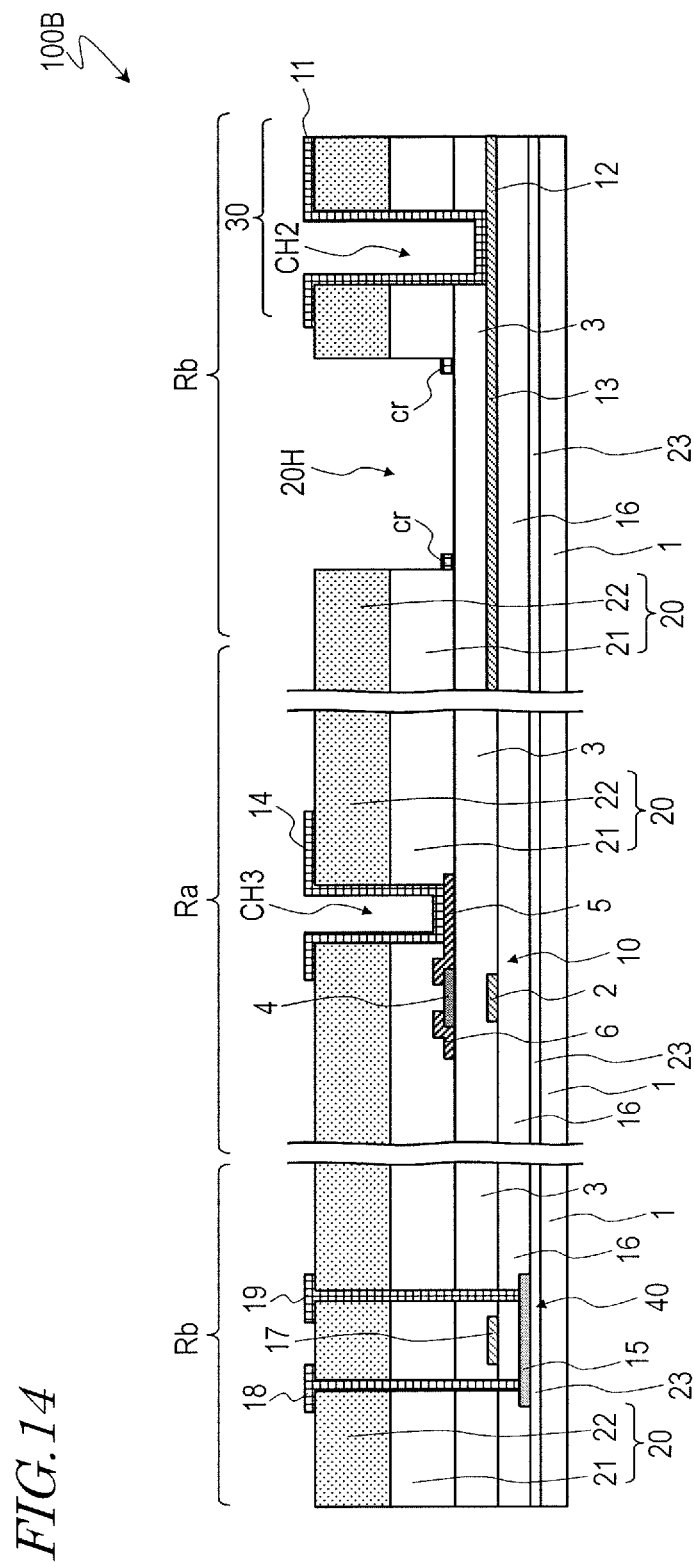
FIG. 14 A cross-sectional view showing how conductive film residues cr may occur in the aperture 20H of the interlevel dielectric layer 20 of the semiconductor device 100B.

FIG. 14 shows how conductive film residues cr may occur in the aperture 20H of the interlevel dielectric layer 20. As shown in FIG. 14, the conductive film residues cr are distanced from the line 13 by the first gate dielectric layer 3, and thus will not be in contact with the line 13. Therefore, lines 13 will not be electrically connected to each other by the conductive film residues cr, and hence short-circuiting will not occur.

Moreover, according to the present embodiment, the line 13 being made of the same conductive film as the gate electrodes 2 and 17 can be used as a line extending from the terminal portion 30 toward the active region Ra.

Embodiment 3

Figure 15:
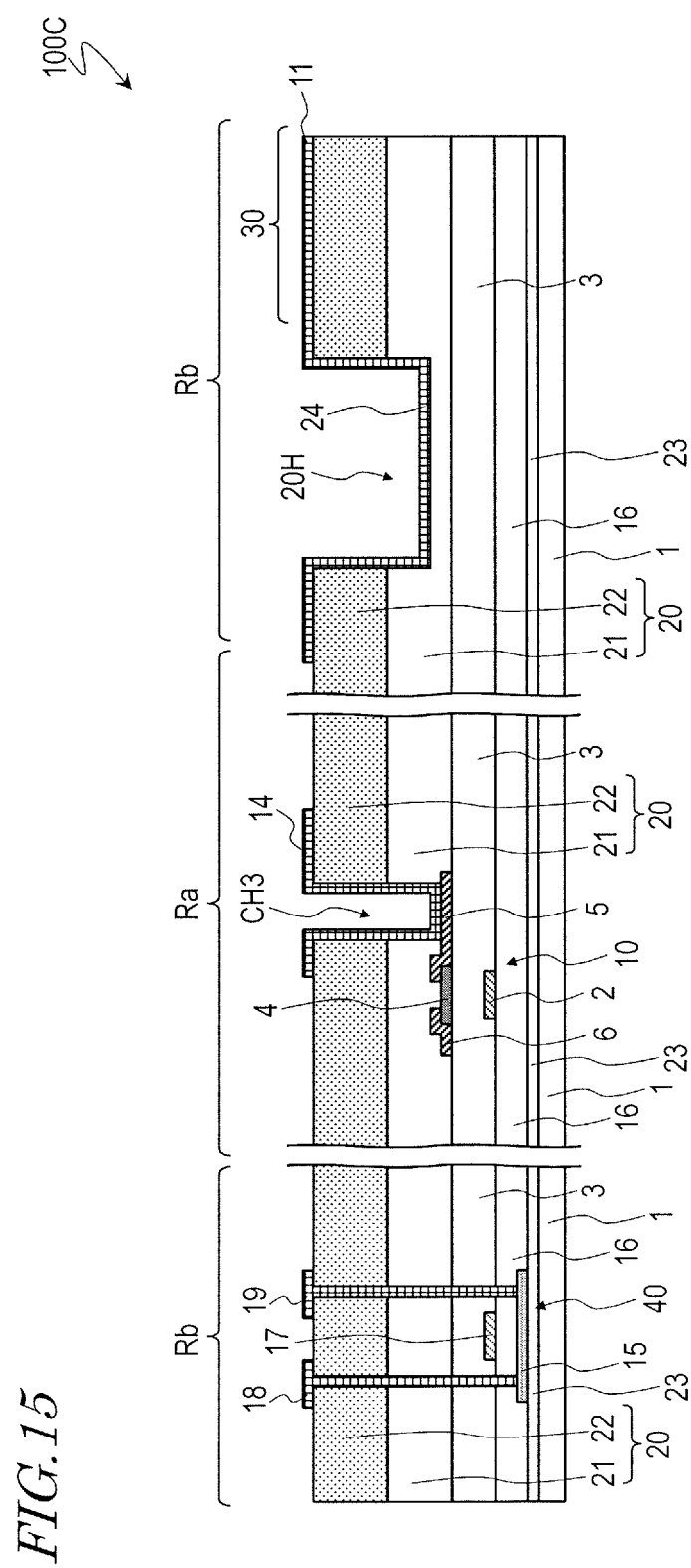
FIG. 15 A cross-sectional view schematically showing a semiconductor device 100C according to an embodiment of the present invention.

With reference to FIG. 15, a semiconductor device (TFT substrate) 100C according to the present embodiment will be described. FIG. 15 is a cross-sectional view schematically showing the semiconductor device 100C. Hereinafter, differences of the semiconductor device 100C from the semiconductor device 100A of Embodiment 1 will mainly be described.

In the semiconductor device 100C shown in FIG. 15, the aperture 20H in the interlevel dielectric layer 20 extends part of the way through the thickness of the interlevel dielectric layer 20. Specifically, the aperture 20H is formed so as to extend through the second dielectric layer 22 but extend part of the way through the thickness of the first dielectric layer 21. In other words, in a region overlapping the aperture 20H, the first dielectric layer 21 includes a portion having a smaller thickness (thinned portion) than in any other portion.

Figure 16:
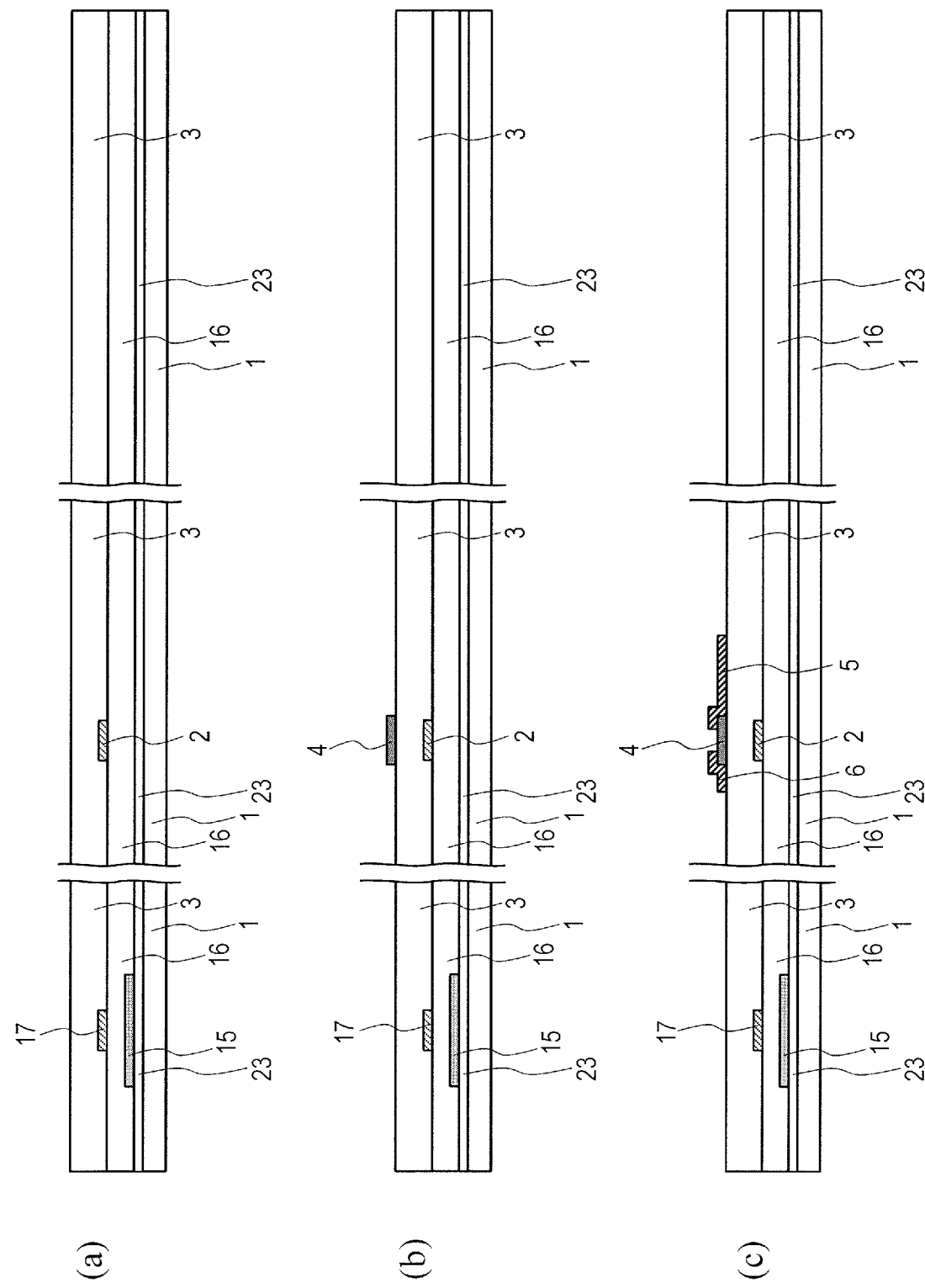
FIG. 16 (a) through (c) are step-by-step cross-sectional views showing a method of producing the semiconductor device 100C.
Figure 18:
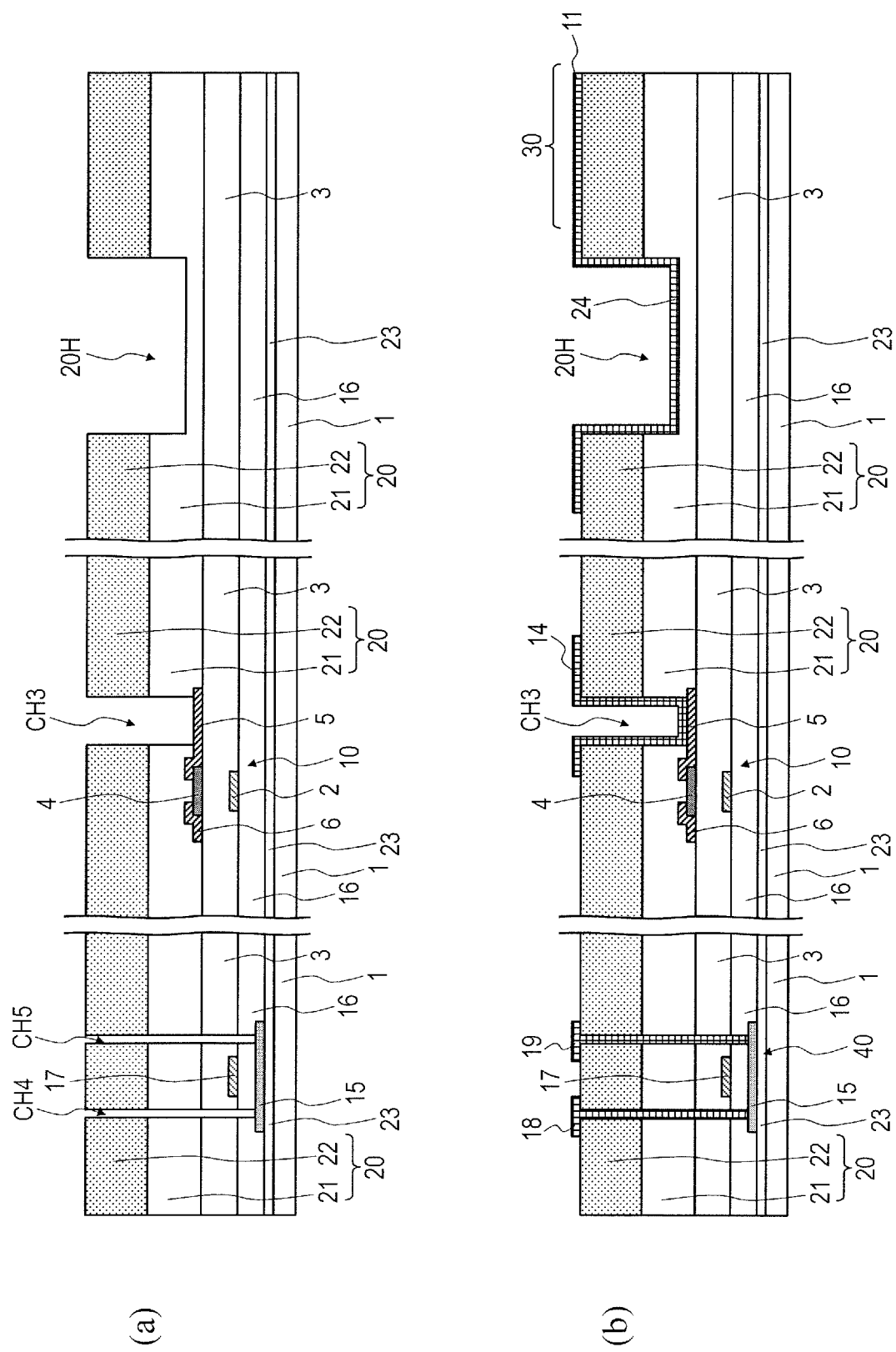
FIGS. 18 (a) and (b) are step-by-step cross-sectional views showing a method of producing the semiconductor device 100C.

Now, with reference to FIG. 16 to FIG. 18, a method of producing the semiconductor device 100C will be described. FIGS. 16(a) through (c), FIGS. 17(a) and (b) and FIGS. 18(a) and (b) are step-by-step cross-sectional views showing a method of producing the semiconductor device 100C.

First, as shown in FIG. 16(a), the basecoat layer 23, the LIPS layer 15, the second gate dielectric layer 16, the gate electrode 2 of the pixel TFT 10, the gate electrode 17 of the circuit TFT 40, and the first gate dielectric layer 3 are sequentially formed on the substrate 1. Formation of these can be achieved in manners similar to those described with respect to the semiconductor device 100A of Embodiment 1 by referring to FIGS. 3(a) through (c) and FIGS. 4(a) and (b).

Next, as shown in FIG. 16(b), the oxide semiconductor layer 4 is formed on the first gate dielectric layer 3. The oxide semiconductor layer 4 is formed so as to overlap the gate electrode 2 via the gate dielectric layer 3. The oxide semiconductor layer 4 can be formed by depositing an oxide semiconductor film by sputtering technique, and thereafter patterning the oxide semiconductor film, for example.

Then, as shown in FIG. 16(c), the source electrode 5 and drain electrode 6 of the pixel TFT 10 are formed. The source electrode 5 and the drain electrode 6 are formed so that at least portions thereof are in contact with the oxide semiconductor layer 4. For example, the source electrode 5 and the drain electrode 6 may be formed by depositing a conductive film for the sources to a predetermined thickness, and thereafter patterning it.

Next, the interlevel dielectric layer 20 covering the pixel TFT 10 is formed. Specifically, first, as shown in FIG. 17(a), the first dielectric layer 21 is formed so as to cover the source electrode 5 and drain electrode 6 of the pixel TFT 10. The first dielectric layer 21 may be formed by depositing an inorganic dielectric film to a predetermined thickness, for example.

Then, as shown in FIG. 17(b), the second dielectric layer 22 is formed on the first dielectric layer 21. The second dielectric layer 22 may be formed by introducing a photosensitive resin material on the first dielectric layer 21, and thereafter subjecting it to exposure and development, for example. At this point, apertures 22h, 22h3, 22h4 and 22h5 are formed in predetermined regions of the second dielectric layer 22. Whereas the apertures 22h3, 22h4 and 22h5 in the pixel forming region and the circuit forming region are formed so as to extend through the second dielectric layer 22, the aperture 22h in the aperture forming region is formed so as to extend part of the way through the thickness of the second dielectric layer 22. Such an aperture 22h can be formed by subjecting a portion of the photosensitive resin material to half exposure by using a multi-gray level mask (a gray-tone mask or a half-tone mask).

Next, as shown in FIG. 18(a), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, since a thinned portion is formed in the second dielectric layer 22, the first dielectric layer 21 is lightly etched (half-etched). Therefore, the first dielectric layer 21 is removed part of the way along its thickness, whereby the aperture 20H is formed. The portion of the gate dielectric layer 3 that overlaps the aperture 20H is not removed. In the circuit forming region, the first dielectric layer 21, the first gate dielectric layer 3, and the second gate dielectric layer 16 are removed so as to partly expose the LTPS layer 15, thereby forming contact holes CH4 and CH5 for circuitry.

Then, as shown in FIG. 18(b), on the interlevel dielectric layer 20 (i.e., on the second dielectric layer 22), the source line 14, the upper conductive portion 11, the line 24, and the source electrode 18 and drain electrode 19 of the circuit TFT 40 are formed. The source line 14 and the like may be formed by depositing a conductive film for the source lines to a predetermined thickness, and thereafter patterning it, for example.

Thereafter, a pixel electrode is formed on the interlevel dielectric layer 20 (i.e., on the second dielectric layer 22). The pixel electrode is formed by depositing a transparent conductive film to a predetermined thickness, and thereafter patterning it.

Thus, the semiconductor device 100C according to the present embodiment is obtained. In the step of forming the aperture 20H in the interlevel dielectric layer 20, the aperture 20H is formed so as to extend part of the way through the thickness of the interlevel dielectric layer 20, whereby the level difference ascribable to the aperture 20H is reduced (i.e., the depth of the aperture 20H is made smaller), whereby the conductive film residues cr become less likely to occur. This can reduce short-circuiting between lines 24.

Embodiment 4

Figure 19:
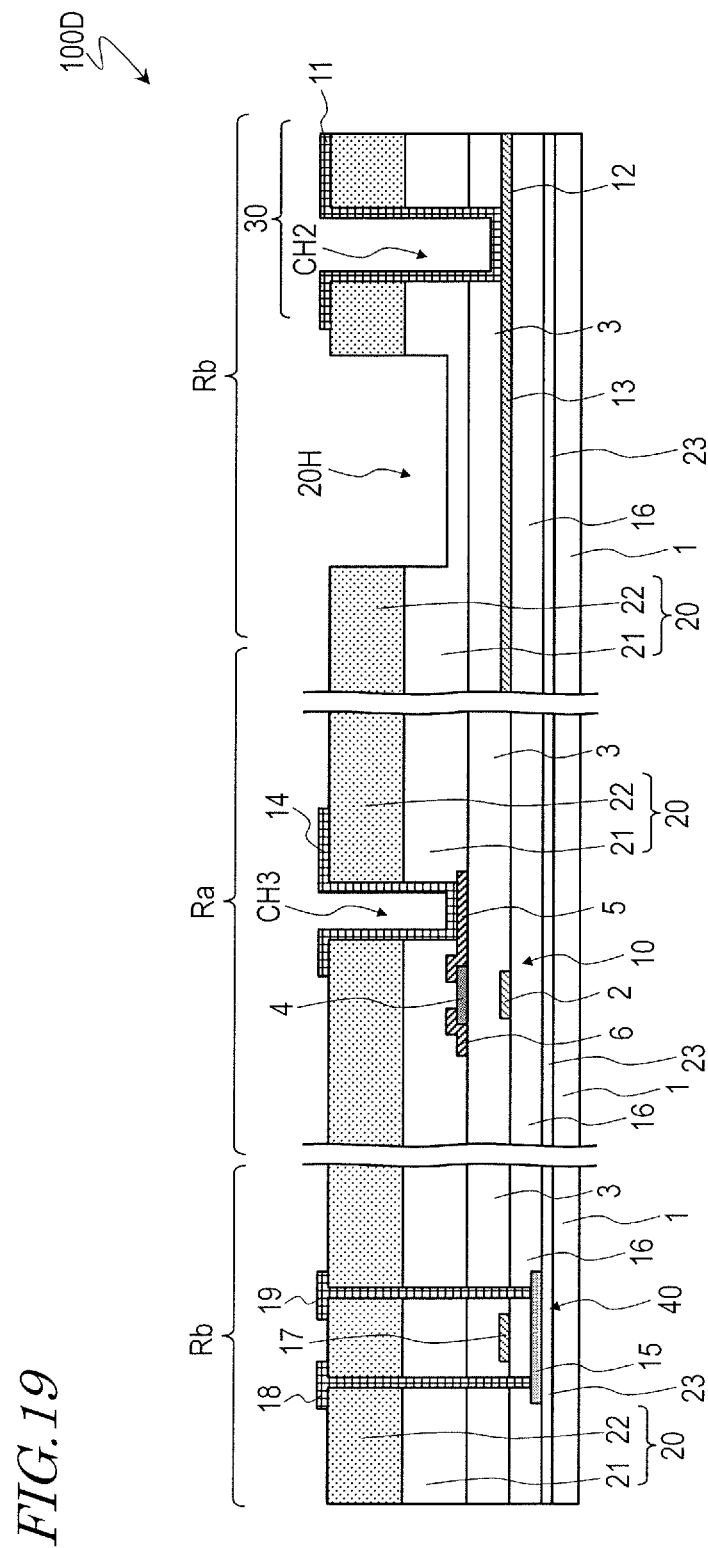
FIG. 19 A cross-sectional view schematically showing a semiconductor device 100D according to an embodiment of the present invention.

With reference to FIG. 19, a semiconductor device (TFT substrate) 100D according to the present embodiment will be described. FIG. 19 is a cross-sectional view schematically showing the semiconductor device 100D. Hereinafter, differences of the semiconductor device 100D from the semiconductor device 100C of Embodiment 3 will mainly be described.

In addition to the upper conductive portion 11, the terminal portion 30 of the semiconductor device 100D shown in FIG. 19 includes a lower conductive portion 12 provided under the first gate dielectric layer 3. The lower conductive portion 12 is made of the same conductive film as the gate electrodes 2 and 17 of the pixel TFT 10 and the circuit TFT 40. In a terminal-portion contact hole CH2 made in the first gate dielectric layer 3 and the interlevel dielectric layer 20, the lower conductive portion 12 is electrically connected to the upper conductive portion 11.

A line 13 extends from the lower conductive portion 12. The line 13 extends under the aperture 20H toward the active region Ra. The line 13 may be a gate line, for example. Alternatively, the line 13 may be a gate connection line electrically connected to the source line.

Figure 20:
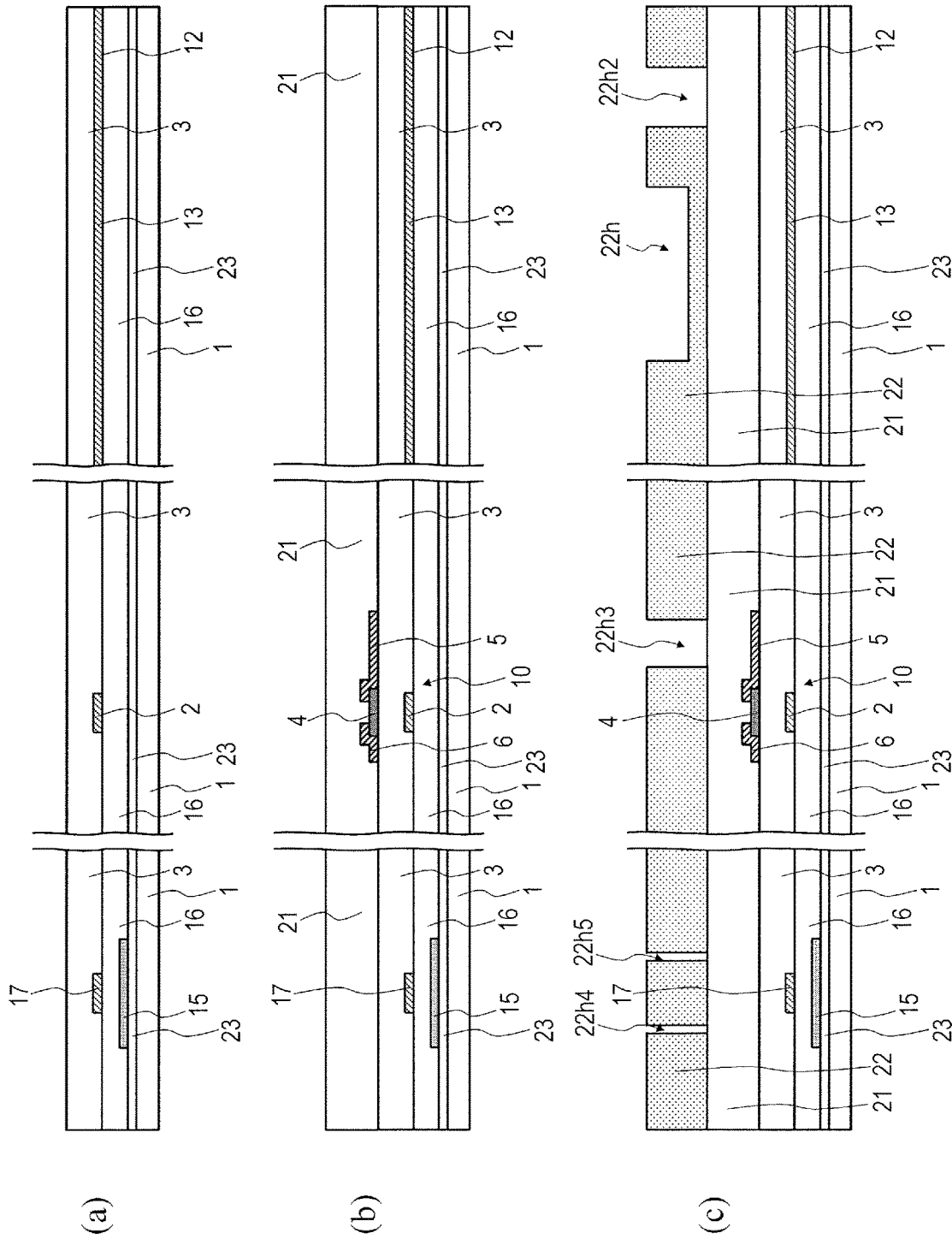
FIG. 20 (a) through (c) are step-by-step cross-sectional views showing a method of producing the semiconductor device 100D.
Figure 21:
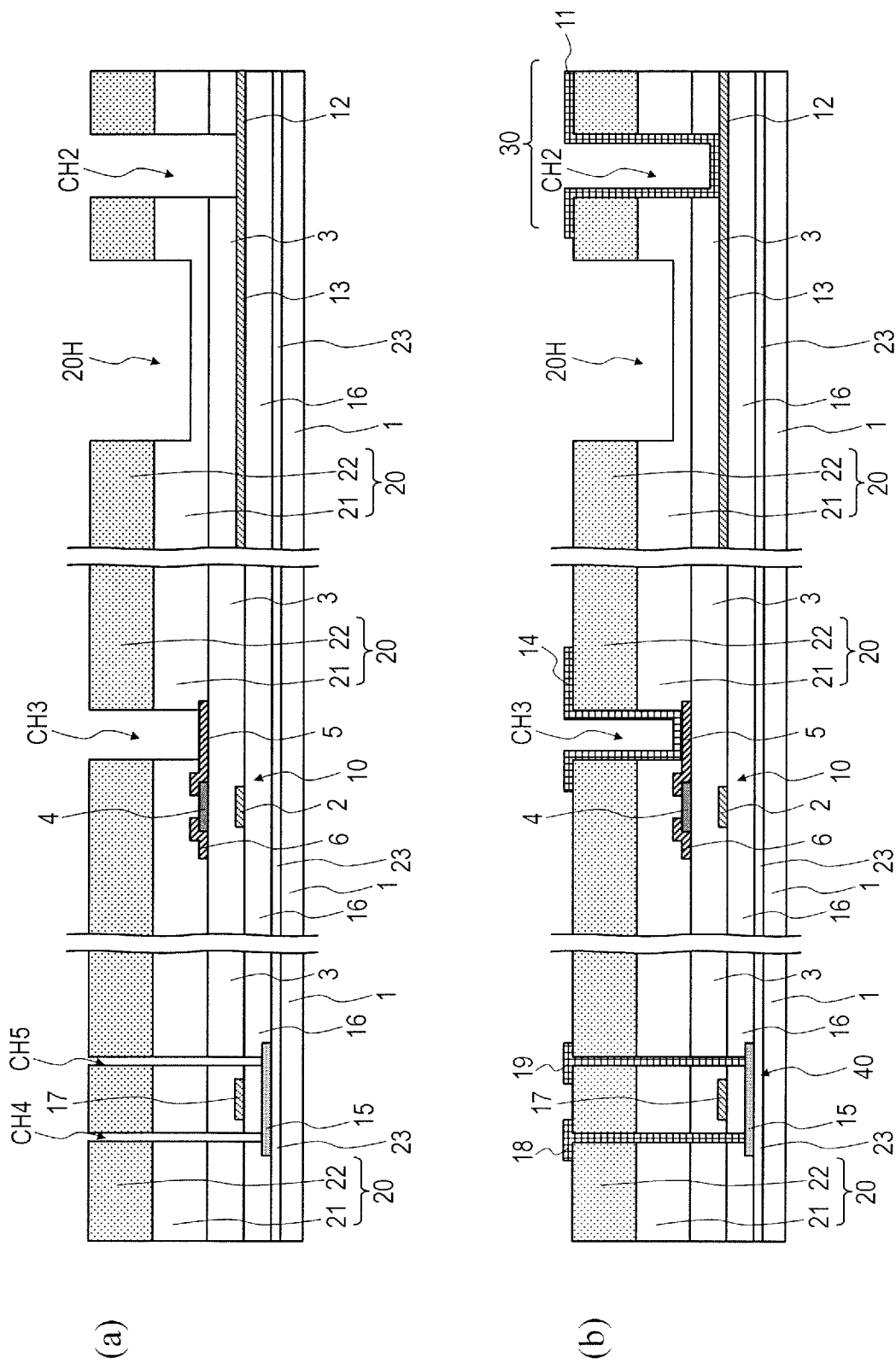
FIGS. 21 (a) and (b) are step-by-step cross-sectional views showing a method of producing the semiconductor device 100D.

Now, with reference to FIG. 20 and FIG. 21, a method of producing the semiconductor device 100D will be described. FIGS. 20(a) through (c) and FIGS. 21(a) and (b) are step-by-step cross-sectional views showing a method of producing the semiconductor device 100D.

First, as shown in FIG. 20(a), the basecoat layer 23, the LIPS layer 15, the second gate dielectric layer 16, the gate electrode 2 of the pixel TFT 10, the gate electrode 17 of the circuit TFT 40, the lower conductive portion 12, the line 13, and the first gate dielectric layer 3 are sequentially formed on the substrate 1. Formation of these can be achieved in manners similar to those described with respect to the semiconductor device 100B of Embodiment 2 by referring to FIGS. 10(a) through (c).

Next, as shown in FIG. 20(b), the oxide semiconductor layer 4, the source electrode 5 and drain electrode 6 of the pixel TFT 10, and the first dielectric layer 21 are sequentially formed on first gate dielectric layer 3. Formation of these can be achieved in manners similar to those described with respect to the semiconductor device 100C of Embodiment 3 by referring to FIGS. 16(b) and (c) and FIG. 17(a).

Then, as shown in FIG. 20(c), the second dielectric layer 22 is formed on the first dielectric layer 21. The second dielectric layer 22 may be formed by introducing a photosensitive resin material on the first dielectric layer 21, and thereafter subjecting it to exposure and development, for example. At this point, apertures 22h, 22h2, 22h3, 22h4 and 22h5 are formed in predetermined regions of the second dielectric layer 22. Whereas the apertures 22h2, 22h3, 22h4 and 22h5 in the terminal portion forming region, the pixel forming region, and the circuit forming region are formed so as to extend through the second dielectric layer 22, the aperture 22h in the aperture forming region is formed so as to extend part of the way through the thickness of the second dielectric layer 22. Such an aperture 22h can be formed by subjecting a portion of the photosensitive resin material to half exposure by using a multi-gray level mask (a gray-tone mask or a half-tone mask).

Then, as shown in FIG. 21(a), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, since a thinned portion is formed in the second dielectric layer 22, the first dielectric layer 21 is lightly etched (half-etched). Therefore, the first dielectric layer 21 is removed part of the way along its thickness, whereby the aperture 20H is formed. The portion of the gate dielectric layer 3 that overlaps the aperture 20H is not removed. In the terminal portion forming region, the first dielectric layer 21 and the first gate dielectric layer 3 are removed so as to partly expose the lower conductive portion 12, thereby forming a terminal-portion contact hole CH2. In the circuit forming region, the first dielectric layer 21, the first gate dielectric layer 3, and the second gate dielectric layer 16 are removed so as to partly expose the LIPS layer 15, thereby forming contact holes CH4 and CH5 for circuitry.

Then, as shown in FIG. 21(b), on the interlevel dielectric layer 20 (i.e., on the second dielectric layer 22), the source line 14, the upper conductive portion 11, and the source electrode 18 and drain electrode 19 of the circuit TFT 40 are formed. The source line 14 and the like may be formed by depositing a conductive film for the source lines to a predetermined thickness, and thereafter patterning it, for example.

Thereafter, a pixel electrode is formed on the interlevel dielectric layer 20 (i.e., on the second dielectric layer 22). The pixel electrode is formed by depositing a transparent conductive film to a predetermined thickness, and thereafter patterning it.

Thus, the semiconductor device 100D according to the present embodiment is obtained. In the present embodiment, in the step of forming the aperture 20H in the interlevel dielectric layer 20, the aperture 20H is formed so as to extend part of the way through the thickness of the interlevel dielectric layer 20. In other words, in the step of etching the first dielectric layer 21, the first gate dielectric layer 3, and the second gate dielectric layer 16, the portion of the first gate dielectric layer 3 that overlaps the aperture 20H is not removed. Therefore, even if conductive film residues cr occur within the aperture 20H in the step of forming the upper conductive portion 11 and the like, short-circuiting between lines 13 can be prevented.

Figure 22:
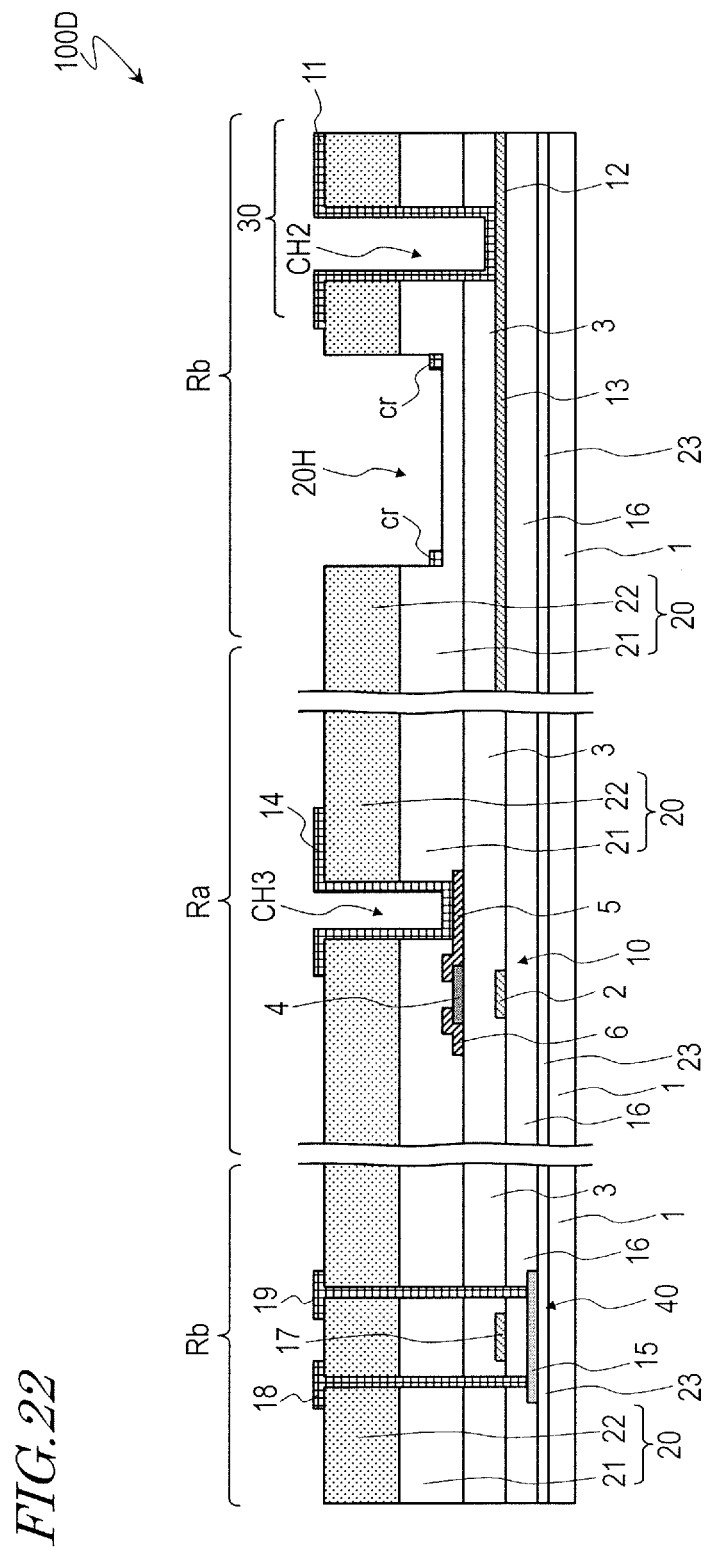
FIG. 22 A cross-sectional view showing how conductive film residues cr may occur in the aperture 20H of the interlevel dielectric layer 20 of the semiconductor device 100D.

FIG. 22 shows how conductive film residues cr may occur in the aperture 20H of the interlevel dielectric layer 20. As shown in FIG. 22, the conductive film residues cr are distanced from the line 13 by the first dielectric layer 21 (or more specifically, the thinned portion of the first dielectric layer 21) and the first gate dielectric layer 3, and thus will not be in contact with the line 13. Therefore, lines 13 will not be electrically connected to each other by the conductive film residues cr, and hence short-circuiting will not occur.

Moreover, according to the present embodiment, the line 13 being made of the same conductive film as the gate electrodes 2 and 17 can be used as a line extending from the terminal portion 30 toward the active region Ra.

Embodiment 5

Figure 23:
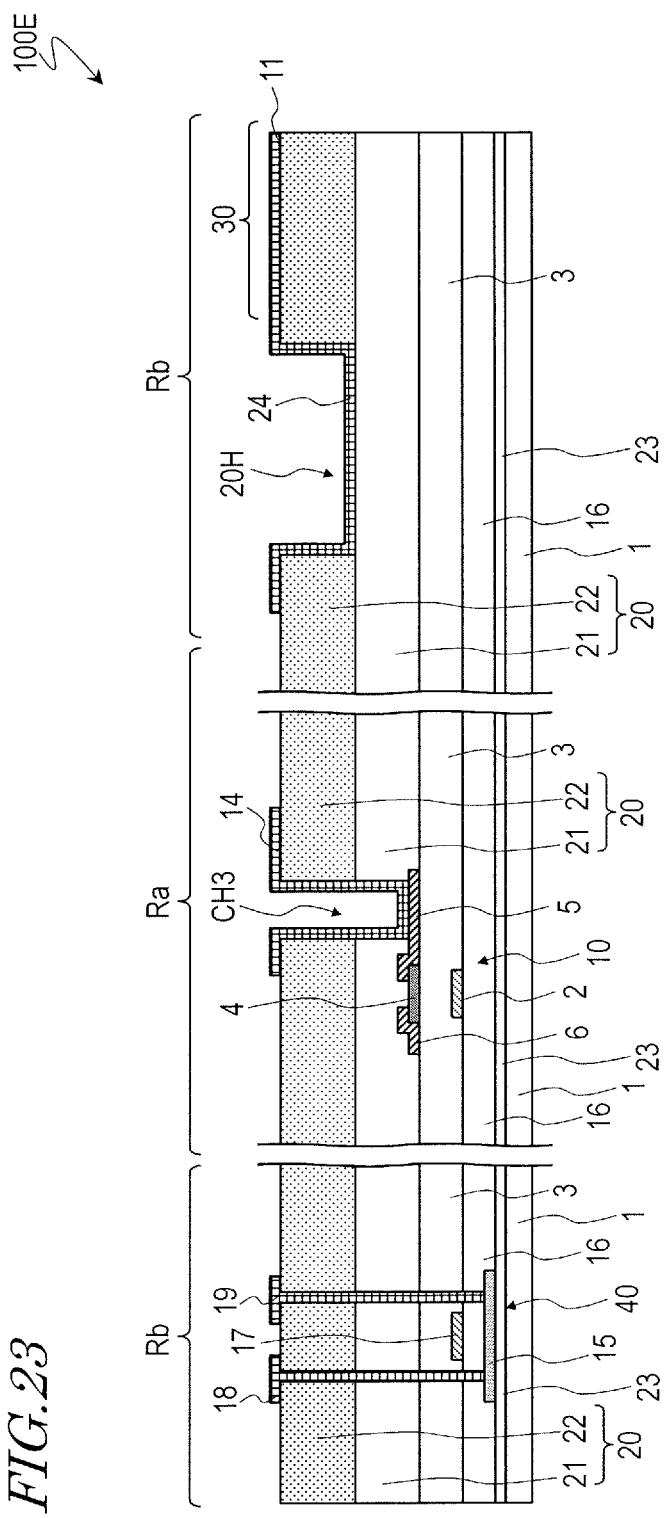
FIG. 23 A cross-sectional view schematically showing a semiconductor device 100E according to an embodiment of the present invention.

With reference to FIG. 23, a semiconductor device (TFT substrate) 100E according to the present embodiment will be described. FIG. 23 is a cross-sectional view schematically showing the semiconductor device 100E. Hereinafter, differences of the semiconductor device 100E from the semiconductor device 100A of Embodiment 1 will mainly be described.

In the semiconductor device 100E shown in FIG. 23, the aperture 20H in the interlevel dielectric layer 20 extends part of the way through the thickness of the interlevel dielectric layer 20. Specifically, the aperture 20H is formed so as to extend through the second dielectric layer 22 and not extend into the first dielectric layer 21.

Figure 26:
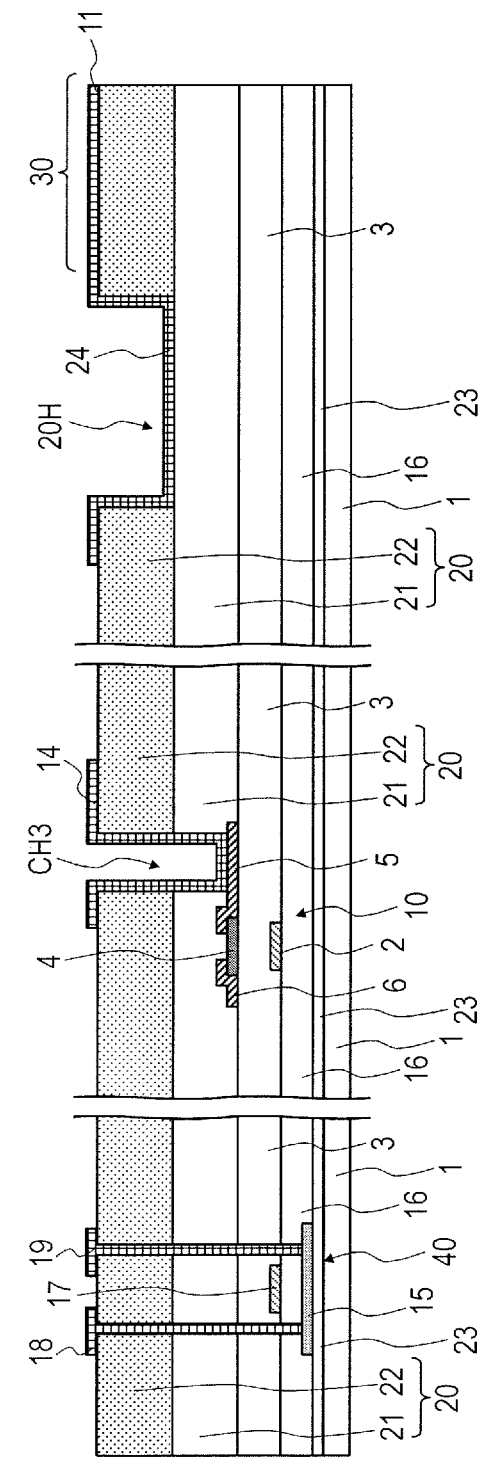
FIG. 26 A step-by-step cross-sectional view showing a method of producing the semiconductor device 100E.

Now, with reference to FIG. 24 to FIG. 26, a method of producing the semiconductor device 100E will be described. FIGS. 24(a) and (b), FIGS. 25(a) and (b) and FIG. 26 are step-by-step cross-sectional views showing a method of producing the semiconductor device 100H.

First, as shown in FIG. 24(a), the basecoat layer 23, the LIPS layer 15, the second gate dielectric layer 16, the gate electrode 2 of the pixel TFT 10, the gate electrode 17 of the circuit TFT 40, the first gate dielectric layer 3, the oxide semiconductor layer 4, the source electrode 5 and drain electrode 6 of the pixel TFT 10, and the first dielectric layer 21 are sequentially formed on the substrate 1. Formation of these can be achieved in manners similar to those described with respect to the semiconductor device 100C of Embodiment 3 by referring to FIGS. 16(a) through (c) and FIG. 17(a).

Next, as shown in FIG. 24(b), the second dielectric layer 22 is formed on the first dielectric layer 21. The second dielectric layer 22 may be formed by introducing a photosensitive resin material on the first dielectric layer 21, and thereafter subjecting it to exposure and development, for example. At this point, apertures 22h, 22h3, 22h4 and 22h5 are formed in predetermined regions of the second dielectric layer 22. Whereas the apertures 22h3, 22h4 and 22h5 in the pixel forming region and the circuit forming region are formed so as to extend through the second dielectric layer 22, the aperture 22h in the aperture forming region is formed so as to extend part of the way through the thickness of the second dielectric layer 22 (i.e., so that a thinned portion is formed in the second dielectric layer 22). Such an aperture 22h can be formed by subjecting a portion of the photosensitive resin material to half exposure by using a multi-gray level mask (a gray-tone mask or a half-tone mask).

Then, as shown in FIG. 25(a), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, a thinned portion is formed in the second dielectric layer 22, so that the first dielectric layer 21, the first gate dielectric layer 3, and the second gate dielectric layer 16 are not etched (i.e., the aperture 22h in the second dielectric layer 22 becomes the aperture 20H in the interlevel dielectric layer 20). In the circuit forming region, the first dielectric layer 21, the first gate dielectric layer 3, and the second gate dielectric layer 16 are removed so as to partly expose the LIPS layer 15, thereby forming contact holes CH4 and CH5 for circuitry.

Next, as shown in FIG. 25(b), asking is performed. This reduces the thickness of the entire second dielectric layer 22, and also removes the thinned portion from the second dielectric layer 22. That is, any remaining second dielectric layer 22 under the aperture 20H is removed.

Then, as shown in FIG. 26, on the interlevel dielectric layer 20 (i.e., on the second dielectric layer 22), the source line 14, the upper conductive portion 11, the line 24, and the source electrode 18 and drain electrode 19 of the circuit TFT 40 are formed. The source line 14 and the like may be formed by depositing a conductive film for the source lines to a predetermined thickness, and thereafter patterning it, for example.

Thereafter, a pixel electrode is formed on the interlevel dielectric layer 20 (i.e., on the second dielectric layer 22). The pixel electrode is formed by depositing a transparent conductive film to a predetermined thickness, and thereafter patterning it.

Thus, the semiconductor device 100E according to the present embodiment is obtained. In the step of forming the aperture 20H in the interlevel dielectric layer 20, the aperture 20H is formed so as to extend part of the way through the thickness of the interlevel dielectric layer 20, whereby the level difference ascribable to the aperture 20H is reduced (i.e., the depth of the aperture 20H is made smaller), whereby the conductive film residues cr become less likely to occur. This can reduce short-circuiting between lines 24.

Note that, as has been exemplified in the present embodiment, it is preferable that: in the aperture forming region, the aperture 22h is once formed so as to extend part of the way through the thickness of the second dielectric layer 22 (i.e., so that a thinned portion is formed in the second dielectric layer 22); and thereafter the thinned portion of the second dielectric layer 22 is removed (i.e., any remaining second dielectric layer 22 under the aperture 20H is removed). The reason is that the second dielectric layer 22, which is an organic dielectric layer, is liable to serve as an intrusion path for moisture into the active region Ra.

Embodiment 6

Figure 27:
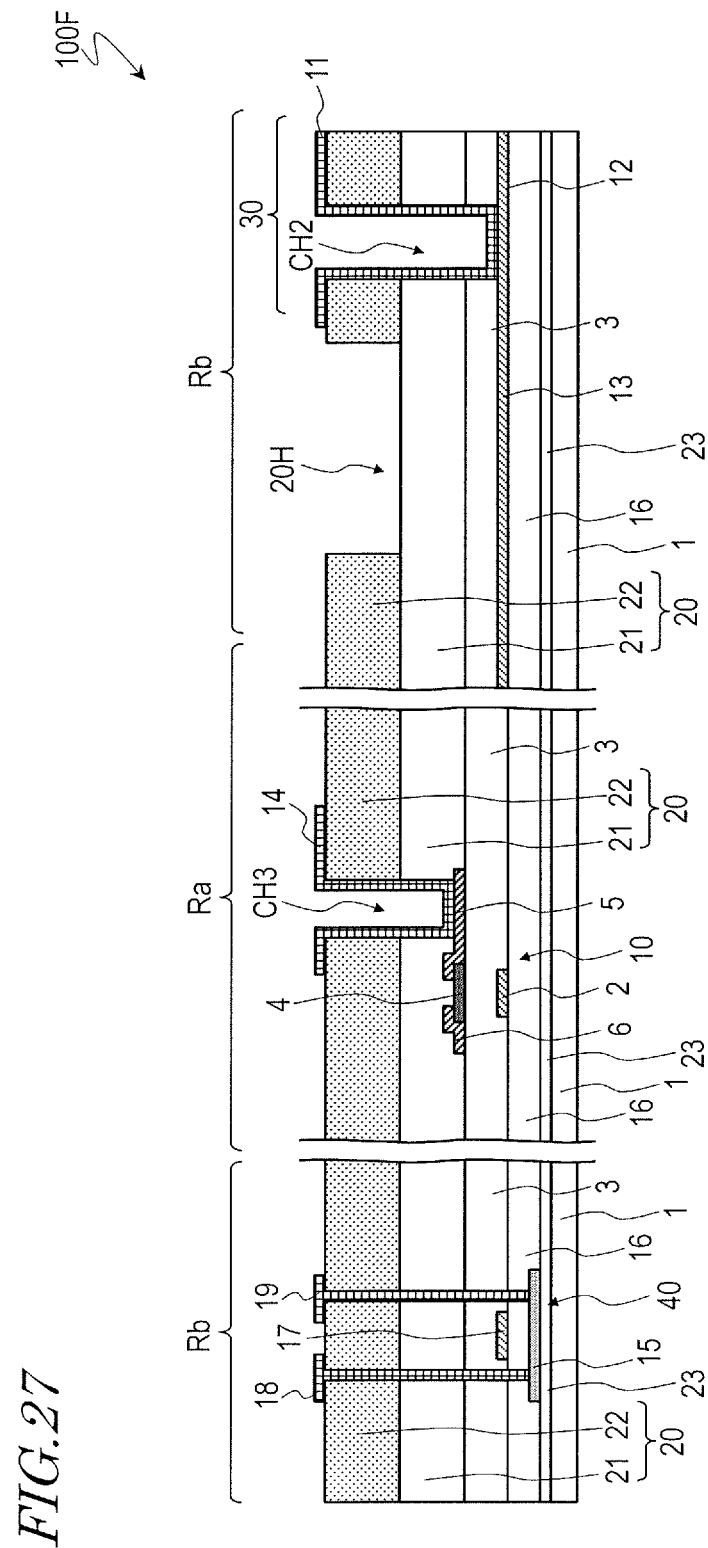
FIG. 27 A cross-sectional view schematically showing a semiconductor device 100F according to an embodiment of the present invention.

With reference to FIG. 27, a semiconductor device (TFT substrate) 100F according to the present embodiment will be described. FIG. 27 is a cross-sectional view schematically showing the semiconductor device 100F. Hereinafter, differences of the semiconductor device 100F from the semiconductor device 100E of Embodiment 5 will mainly be described.

In addition to the upper conductive portion 11, the terminal portion 30 of the semiconductor device 100F shown in FIG. 27 includes a lower conductive portion 12 provided under the first gate dielectric layer 3. The lower conductive portion 12 is made of the same conductive film as the gate electrodes 2 and 17 of the pixel TFT 10 and the circuit TFT 40. In a terminal-portion contact hole CH2 made in the first gate dielectric layer 3 and the interlevel dielectric layer 20, the lower conductive portion 12 is electrically connected to the upper conductive portion 11.

A line 13 extends from the lower conductive portion 12. The line 13 extends under the aperture 20H toward the active region Ra. The line 13 may be a gate line, for example. Alternatively, the line 13 may be a gate connection line electrically connected to the source line.

Figure 30:
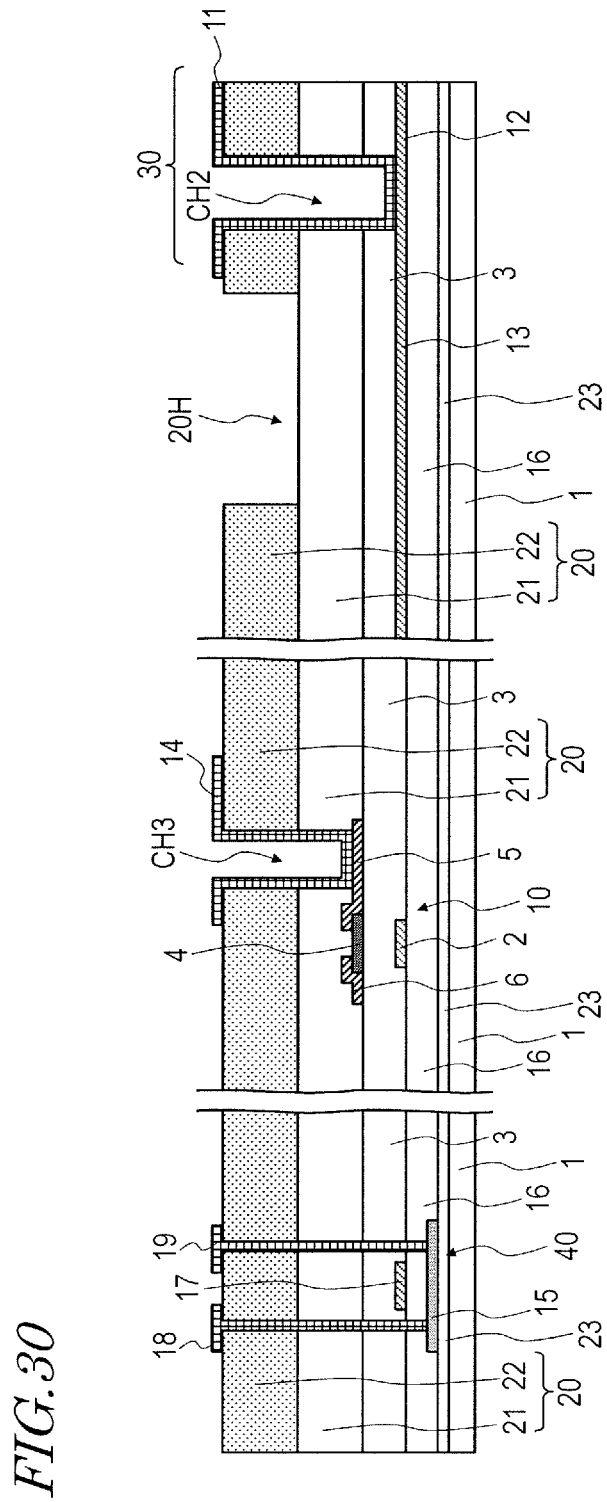
FIG. 30 A step-by-step cross-sectional view showing a method of producing the semiconductor device 100F.

Now, with reference to FIG. 28 to FIG. 30, a method of producing the semiconductor device 100F will be described. FIGS. 28(a) and (b), FIGS. 29(a) and (b) and FIG. 30 are step-by-step cross-sectional views showing a method of producing the semiconductor device 100F.

First, as shown in FIG. 28(a), the basecoat layer 23, the LIPS layer 15, the second gate dielectric layer 16, the gate electrode 2 of the pixel TFT 10, the gate electrode 17 of the circuit TFT 40, the lower conductive portion 12, line 13, the first gate dielectric layer 3, the oxide semiconductor layer 4, the source electrode 5 and drain electrode 6 of the pixel TFT 10, and the first dielectric layer 21 are sequentially formed on the substrate 1. Formation of these can be achieved in manners similar to those described with respect to the semiconductor device 100D of Embodiment 4 by referring to FIGS. 20(a) and (b).

Next, as shown in FIG. 28(b), the second dielectric layer 22 is formed on the first dielectric layer 21. The second dielectric layer 22 may be formed by introducing a photosensitive resin material on the first dielectric layer 21, and thereafter subjecting it to exposure and development, for example. At this point, apertures 22h, 22h2, 22h3, 22h4 and 22h5 are formed in predetermined regions of the second dielectric layer 22. Whereas the apertures 22h2, 22h3, 22h4 and 22h5 in the terminal portion forming region, the pixel forming region, and the circuit forming region are formed so as to extend through the second dielectric layer 22, the aperture 22h in the aperture forming region is formed so as to extend part of the way through the thickness of the second dielectric layer 22 (i.e., so that a thinned portion is formed in the second dielectric layer 22). Such an aperture 22h can be formed by subjecting a portion of the photosensitive resin material to half exposure by using a multi-gray level mask (a gray-tone mask or a half-tone mask).

Then, as shown in FIG. 29(a), by using the second dielectric layer 22 as an etching mask, the first dielectric layer 21, the first gate dielectric layer 3, and the second gate dielectric layer 16 are etched. Through this etching, in the pixel forming region, the first dielectric layer 21 is removed so as to partly expose the source electrode 5, thereby forming a source contact hole CH3. In the aperture forming region, a thinned portion is formed in the second dielectric layer 22, so that the first dielectric layer 21, the first gate dielectric layer 3, and the second gate dielectric layer 16 are not etched (i.e., the aperture 22h in the second dielectric layer 22 becomes the aperture 20H in the interlevel dielectric layer 20). In the terminal portion forming region, the first dielectric layer 21 and the first gate dielectric layer 3 are removed so as to partly expose the lower conductive portion 12, thereby forming a terminal-portion contact hole CH2. In the circuit forming region, the first dielectric layer 21, the first gate dielectric layer 3, and the second gate dielectric layer 16 are removed so as to partly expose the LIPS layer 15, thereby forming contact holes CH4 and CH5 for circuitry.

Next, as shown in FIG. 29(b), asking is performed. This reduces the thickness of the entire second dielectric layer 22, and also removes the thinned portion from the second dielectric layer 22.

Then, as shown in FIG. 30, on the interlevel dielectric layer 20 (i.e., on the second dielectric layer 22), the source line 14, the upper conductive portion 11, and the source electrode 18 and drain electrode 19 of the circuit TFT 40 are formed. The source line 14 and the like may be formed by depositing a conductive film for the source lines to a predetermined thickness, and thereafter patterning it, for example.

Thereafter, a pixel electrode is formed on the interlevel dielectric layer 20 (i.e., on the second dielectric layer 22). The pixel electrode is formed by depositing a transparent conductive film to a predetermined thickness, and thereafter patterning it.

Thus, the semiconductor device 100F according to the present embodiment is obtained. In the present embodiment, in the step of forming the aperture 20H in the interlevel dielectric layer 20, the aperture 20H is formed so as to extend part of the way through the thickness of the interlevel dielectric layer 20. In other words, in the step of etching the first dielectric layer 21, the first gate dielectric layer 3, and the second gate dielectric layer 16, the portion of the first gate dielectric layer 3 that overlaps the aperture 20H is not removed. Therefore, even if conductive film residues cr occur within the aperture 20H in the step of forming the upper conductive portion 11 and the like, short-circuiting between lines 13 can be prevented.

Figure 31:
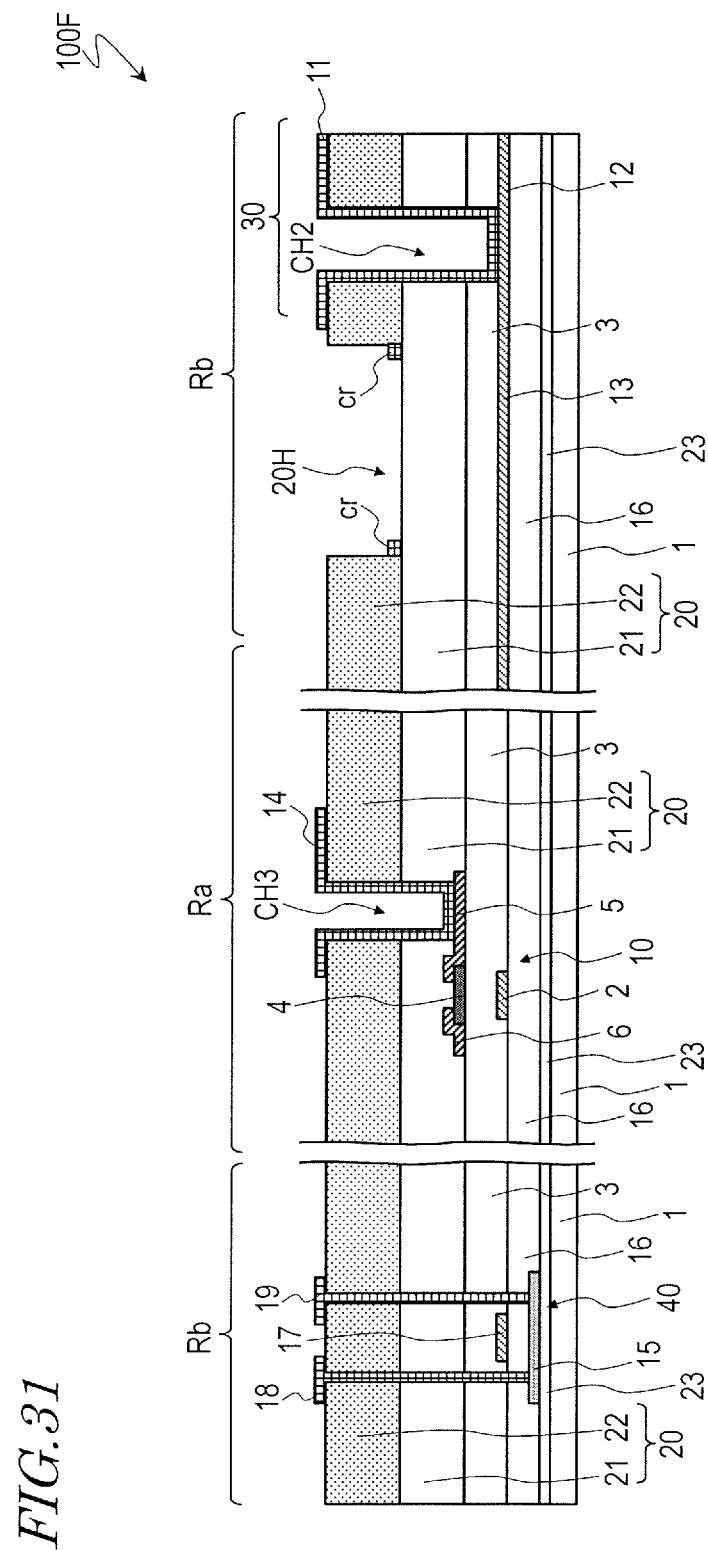
FIG. 31 A cross-sectional view showing how conductive film residues cr may occur in the aperture 20H of the interlevel dielectric layer 20 of the semiconductor device 100F.

FIG. 31 shows how conductive film residues cr may occur in the aperture 20H of the interlevel dielectric layer 20. As shown in FIG. 31, the conductive film residues cr are distanced from the line 13 by the first dielectric layer 21 and the first gate dielectric layer 3, and thus will not be in contact with the line 13. Therefore, lines 13 will not be electrically connected to each other by the conductive film residues cr, and hence short-circuiting will not occur.

Moreover, according to the present embodiment, the line 13 being made of the same conductive film as the gate electrodes 2 and 17 can be used as a line extending from the terminal portion 30 toward the active region Ra.

Other Embodiments

Figure 32:
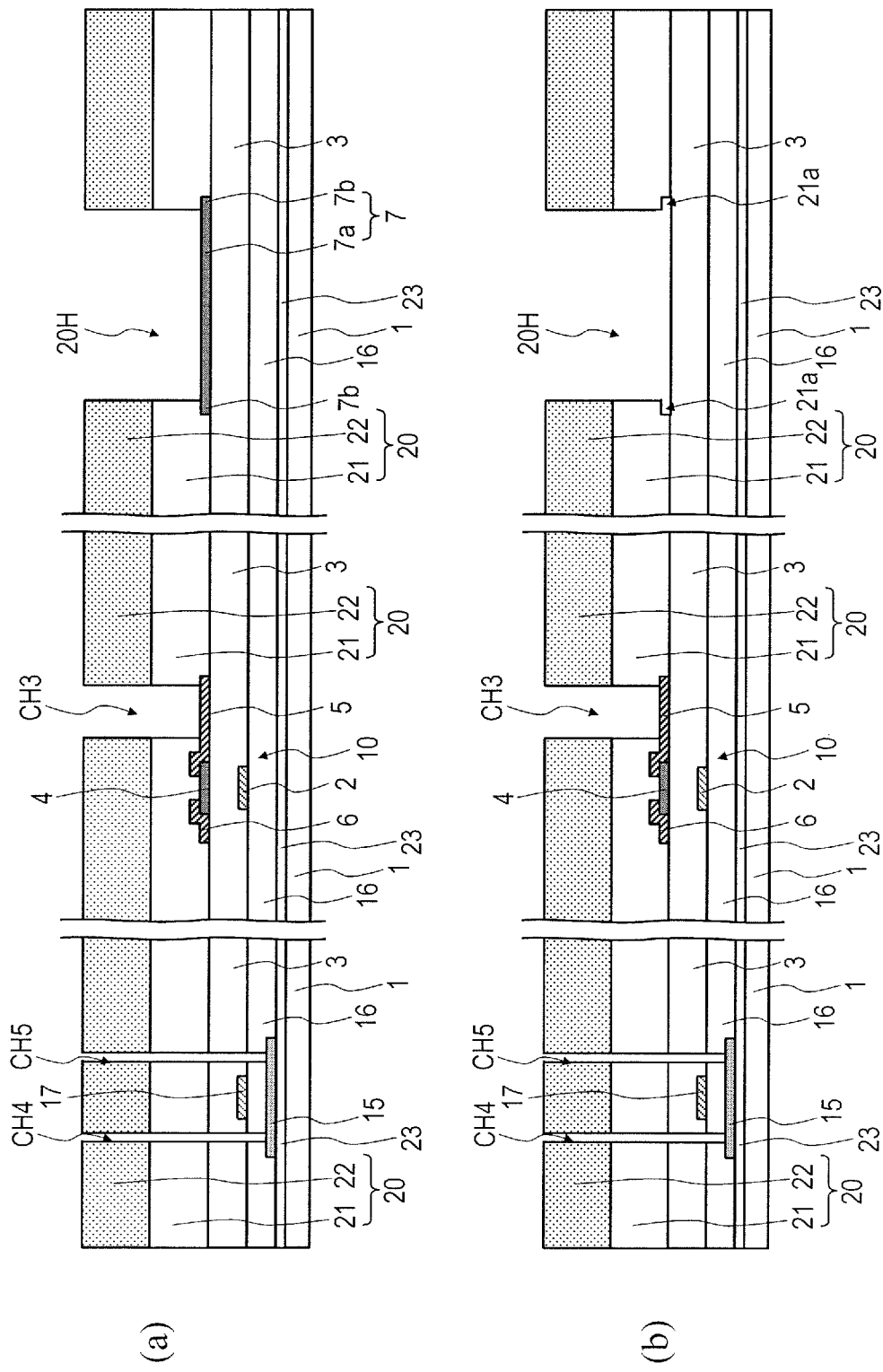
FIGS. 32 (a) and (b) are step-by-step cross-sectional views showing another exemplary method of producing the semiconductor device 100A.

As shown in FIG. 6(b), Embodiment 1 has illustrated an example where the entire protection layer 7 overlaps the aperture 20H in the interlevel dielectric layer 20H (i.e., the area of the protection layer 7 and the area of the aperture 20H are equal as viewed from the normal direction of the substrate 1). On the other hand, as shown in FIG. 32(a), the aperture 20H may be formed so as to have a region 7a where the protection layer 7 overlaps the aperture 20H and a region 7b where the protection layer 7 does not overlap the aperture 20H. In other words, the protection layer 7 may be formed so as to be larger than the aperture 20H.

When the protection layer 7 having been thus formed is subsequently removed (e.g., with hydrofluoric acid), as shown in FIG. 32(b), recesses 21a will be formed in the first dielectric layer 21 near the edge of the aperture 20H.

If the protection layer 7 is smaller than the aperture 20H, in the step of forming the aperture 20H (i.e., the step shown in FIG. 6(b)), the portions of the first gate dielectric layer 3 and the second gate dielectric layer 16 that are not covered by the protection layer 7 will become etched. On the other hand, by ensuring that the area of the protection layer 7 is equal to the area of the aperture 20H or greater than the area of the aperture 20H, the portions of the first gate dielectric layer 3 and the second gate dielectric layer 16 that are located within the aperture 20H can be prevented from being removed.

Figure 33:
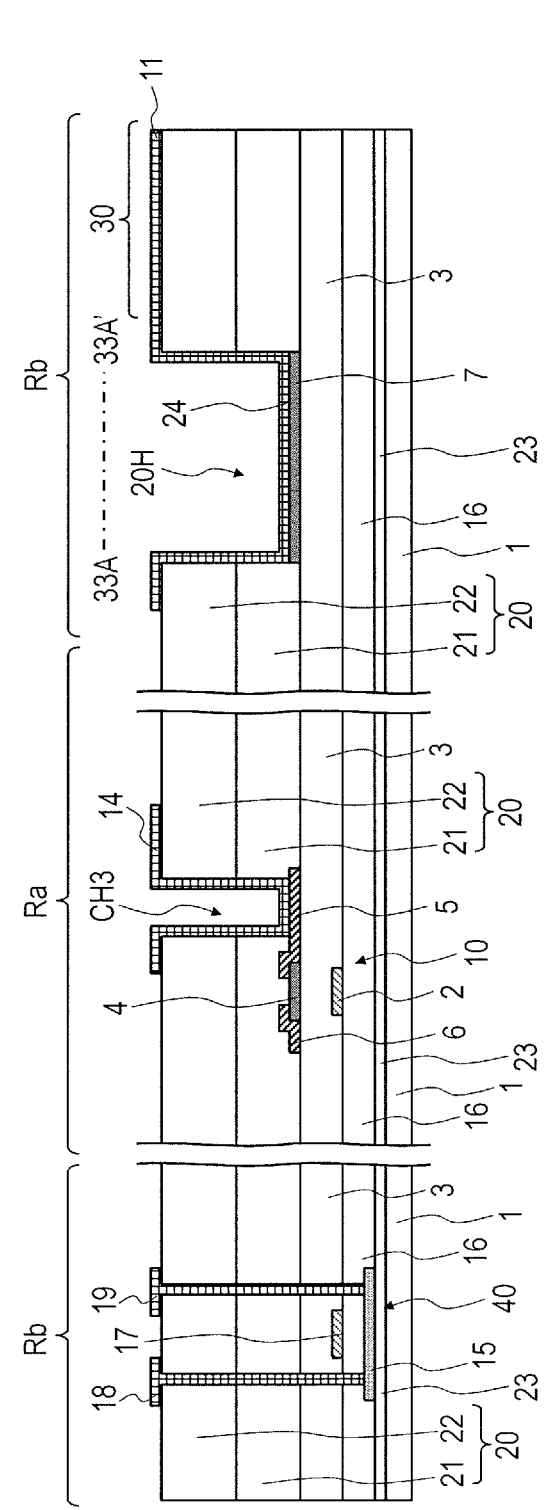
FIG. 33 A cross-sectional view schematically showing a semiconductor device 100G according to an embodiment of the present invention, including a cross section taken along line 33A-33A' shown in FIG. 34.
Figure 34:
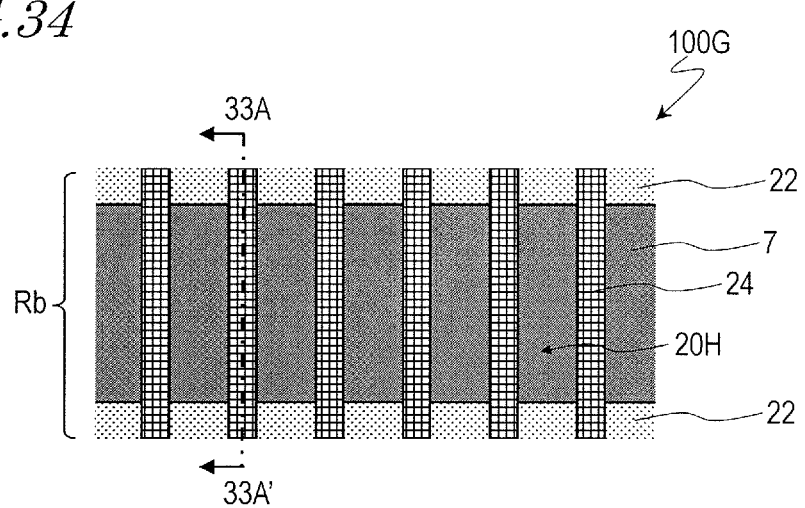
FIG. 34 A plan view schematically showing a portion (near an aperture 20H in an interlevel dielectric layer 20) of the semiconductor device 100G.

Moreover, although Embodiment 1 illustrates an example where a protection layer 4 that has once been formed is subsequently removed, it is not necessary to remove the protection layer 7, as exemplified by a semiconductor device 100G shown in FIG. 33 and FIG. 34. In other words, the completed semiconductor device 100G may have the protection layer 7.

Figure 35:
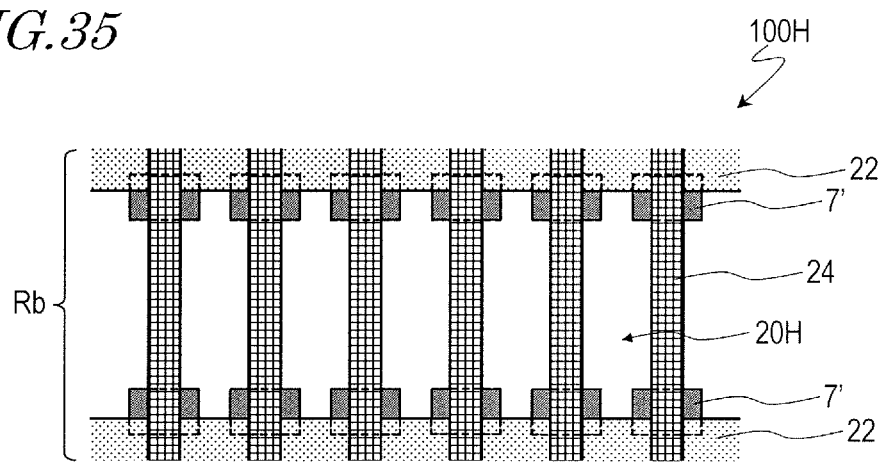
FIG. 35 A plan view schematically showing a portion (near an aperture 20H in an interlevel dielectric layer 20) of a semiconductor device 100H according to an embodiment of the present invention.

Moreover, as exemplified by a semiconductor device 100H shown in FIG. 35, after the step of forming the aperture 20H and before the step of forming the upper conductive portion 11, the protection layer 7 may be partly removed. In the semiconductor device 100H, a plurality of islets of oxide semiconductor 7' are formed by partly removing the protection layer 7. Each of the plurality of islets of oxide semiconductor 7' is disposed so as to be in contact with only one line 24, i.e., so as to not be in contact with two or more lines 24. By adopting this construction, the protection layer 7 can be prevented from serving as a short-circuiting path (leak path).

The semiconductor device 100A through 100H illustrated in the above embodiments are especially suitably applicable to the active matrix substrate of a display device of in-cell touch-screen panel type. In this case, driving lines for the touch-screen panel (driving electrode lines or detection electrode lines) could also be formed by using the same conductive film as the source line 14. In in-cell touch-screen panel type display devices, for the sake of sensing by the touch-screen panel and for pixel writes, there is a need to shorten the write time to the pixels. By providing the source line 14 on the interlevel dielectric layer 20 (i.e., on the second dielectric layer 22), the parasitic capacitance between the source line 14 and the gate line can be reduced, whereby the write time to the pixels can be shortened.

INDUSTRIAL APPLICABILITY

According to an embodiment of the present invention, there is provided a semiconductor device which prevents short-circuiting due to conductive film residues from occurring at an aperture in an interlevel dielectric layer, and a method of producing the same. Embodiments of the present invention are suitably applicable to active matrix substrates for various display devices, such as liquid crystal display devices.

REFERENCE SIGNS LIST 1 substrate
2 gate electrode
3 gate dielectric layer (first gate dielectric layer)
4 oxide semiconductor layer
5 source electrode
6 drain electrode
7 protection layer
7a region of protection layer overlapping aperture
7b region of protection layer not overlapping aperture
7' islets of oxide semiconductor
8 pixel electrode
10 thin film transistor (pixel TFT)
11 upper conductive portion
12 lower conductive portion
13 line
14 source line
15 crystalline silicon semiconductor layer (LIPS layer)
16 further gate dielectric layer (second gate dielectric layer)
17 gate electrode
18 source electrode
19 drain electrode
20 interlevel dielectric layer
20H aperture
21 first dielectric layer
21a recess
22 second dielectric layer
22h, 22h2, 22h3, 22h4, 22h5 aperture
23 basecoat layer
24 line
30 terminal portion
40 thin film transistor (circuit TFT)
100A, 100B, 100C, 100D semiconductor device (TFT substrate)
100E, 100F, 100G, 100H semiconductor device (TFT substrate)
Ra active region (display region)
Rb peripheral region (frame region)
CH2 terminal-portion contact hole
CH3 source contact hole
CH4, CH5 contact hole for circuitry
cr conductive film residues

The invention claimed is:

1. A method of producing a semiconductor device which includes a substrate, a plurality of first thin film transistors supported on the substrate, an interlevel dielectric layer covering the plurality of first thin film transistors, and a plurality of terminal portions electrically connecting the plurality of first thin film transistors to corresponding external wiring lines, each of the plurality of terminal portions including an upper conductive portion provided on the interlevel dielectric layer, the semiconductor device including an active region in which the plurality of first thin film transistors are provided, and a peripheral region being located around the active region and including the plurality of terminal portions provided therein, the method comprising:

step (A) of forming gate electrodes of the plurality of first thin film transistors on the substrate;

step (B) of forming a gate dielectric layer covering the gate electrodes;

step (C) of forming an oxide semiconductor layer of the plurality of thin film transistors on the gate dielectric layer;

step (D) of forming source electrodes and drain electrodes of the plurality of thin film transistors;

step (E) of forming the interlevel dielectric layer to cover the plurality of thin film transistors;

step (F) of forming an aperture in the interlevel dielectric layer, the aperture being located between the active region and the plurality of terminal portions and extending through the interlevel dielectric layer; and step (G) of, after the step (F), forming the upper conductive portion on the interlevel dielectric layer, wherein, in the step (C), above a region of the gate dielectric layer that is located between the active region and the plurality of terminal portions, a protection layer is formed from a same oxide semiconductor film as the oxide semiconductor layer, in the step (F), the aperture is formed so as to overlap the protection layer, the aperture does not extend through the gate dielectric layer, and in the step (C), the protection layer and the oxide semiconductor layer are formed simultaneously.

2. The method of producing a semiconductor device of claim 1, wherein, in the step (G), lines extending from the upper conductive portion are formed, the lines extending via the aperture toward the active region.

3. The method of producing a semiconductor device of claim 2, wherein, in the step (F), the aperture is formed so as to have a region in which the protection layer overlaps the aperture and a region in which the protection layer does not overlap the aperture.

4. The method of producing a semiconductor device of claim 1, wherein,
- each of the plurality of terminal portions includes a lower conductive portion made of a same conductive film as the gate electrodes, the lower conductive portion being electrically connected to the upper conductive portion in a contact hole made in the gate dielectric layer and in the interlevel dielectric layer; and
- in the step (A), together with the gate electrodes, the lower conductive portions and lines extending from the lower conductive portions are formed, the lines extending under the aperture toward the active region.

5. The method of producing a semiconductor device of claim 1, further comprising step (H) of removing the protection layer.

6. The method of producing a semiconductor device of claim 1, not comprising a step of removing the protection layer.

7. The method of producing a semiconductor device of claim 2, further comprising step (H) of partly removing the protection layer, wherein,
- in step (H), a plurality of islets of oxide semiconductor are formed by partly removing the protection layer; and
- each of the plurality of islets of oxide semiconductor is disposed so as not to be in contact with two or more said lines.

8. The method of producing a semiconductor device of claim 1, wherein the interlevel dielectric layer includes: a first dielectric layer provided so as to cover the source electrodes and drain electrodes; and a second dielectric layer provided on the first dielectric layer.

9. The method of producing a semiconductor device of claim 8, wherein,
- the first dielectric layer is made of an inorganic insulative material; and
- the second dielectric layer is made of an organic insulative material.

10. The method of producing a semiconductor device of claim 1, wherein the semiconductor device further includes a plurality of second thin film transistors supported on the substrate, each including a crystalline silicon semiconductor layer.

11. The method of producing a semiconductor device of claim 10, comprising, before the step (A):
- step (I) of forming the crystalline silicon semiconductor layer of the plurality of second thin film transistors on the substrate; and
- step (J) of forming a further gate dielectric layer covering the crystalline silicon semiconductor layer, wherein,
- in the step (A), on the further gate dielectric layer, the gate electrodes of the plurality of second thin film transistors are formed from a same conductive film as the gate electrodes of the plurality of first thin film transistors.

12. The method of producing a semiconductor device of claim 1, wherein each of the plurality of first thin film transistors includes a channel-etch structure.

13. The method of producing a semiconductor device of claim 1, wherein the oxide semiconductor layer comprises an In—Ga—Zn—O based semiconductor.

* * * * *